(12) United States Patent
Shimizu et al.

(10) Patent No.: US 7,268,411 B2
(45) Date of Patent: Sep. 11, 2007

(54) INSULATING FILM AND ELECTRONIC DEVICE

(75) Inventors: Tatsuo Shimizu, Tokyo (JP); Hideki Satake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/347,319

(22) Filed: Feb. 6, 2006

(65) Prior Publication Data

US 2006/0131674 A1  Jun. 22, 2006

Related U.S. Application Data

(62) Division of application No. 10/673,466, filed on Sep. 30, 2003, now Pat. No. 7,026,693.

(30) Foreign Application Priority Data

Sep. 30, 2002 (JP) ............................. 2002-285034
Jul. 16, 2003 (JP) ............................. 2003-197808

(51) Int. Cl.
  *H01L 29/00* (2006.01)
(52) U.S. Cl. ................................. 257/532; 257/535
(58) Field of Classification Search ............... 257/303, 257/306, 310, 532–535
  See application file for complete search history.

(56) References Cited

U.S. PATENT DOCUMENTS 6,407,435 B1  6/2002  Ma et al. .................... 257/411

FOREIGN PATENT DOCUMENTS

| JP | 2000-195856 | 7/2000 |
|---|---|---|
| JP | 2001-274393 | 10/2001 |
| JP | 2002-100767 | 4/2002 |
| JP | 2002-134739 | 5/2002 |
| JP | 2004-511909 | 4/2004 |
| WO | WO 02/31875 A2 | 4/2002 |

OTHER PUBLICATIONS

J. H. Haeni, et al., "Epitaxial Growth of the First Five Members of the $Sr_{n+1}Ti_nO_{3n+1}$ Ruddlesden-Popper Homologous Series" Applied Physics Letters, vol. 78, No. 21, May 21, 2001, pp. 3292-3294.
R.A. McKee, et al., "Physical Structure and Inversion Charge at a Semiconductor Interface With a Crystalline Oxide", Science, vol. 293, Jul. 20, 2001, pp. 468-471.

*Primary Examiner*—Thien F Tran
(74) *Attorney, Agent, or Firm*—Oblon, Spivak, McClelland, Maier & Neustadt, P.C.

(57) ABSTRACT

A capacitor includes a first electrode, an insulating film and a second electrode. The insulating film includes n layers of barrier layers each consisting of a material having a bandgap larger than a first bandgap and having a relative permittivity smaller than a first relative permittivity, and (n−1) layers of well layers each consisting of a material having a bandgap smaller than the first bandgap and having a relative permittivity larger than the first relative permittivity. The barrier layers and the well layers are stacked by turns. Discrete energy levels are formed in each of the well layers by a quantum effect. Thicknesses of the n layers of the barrier layers are not smaller than 2.5 angstroms. A thickness dm (angstrom) and a relative permittivity ∈m of an m-th barrier layer satisfying the condition: $2.5 > (d1/\epsilon 1 + d2/\epsilon 2 + \ldots + dn/\epsilon n)$.

10 Claims, 33 Drawing Sheets

INSULATING FILM AND ELECTRONIC DEVICE

CROSS-REFERENCE TO RELATED APPLICATIONS

This application is a division of and claims the benefit of priority from U.S. Ser. No. 10/673,466, filed Sep. 30, 2003, now U.S. Pat. No. 7,026,093 and is based upon and claims the benefit of priority from the prior Japanese Patent Application No. 2002-285034, filed on Sep. 30, 2002 and the prior Japanese Patent Application No. 2003-197808, filed on Jul. 16, 2003; the entire contents of which are incorporated herein by reference.

BACKGROUND OF THE INVENTION

The present invention relates to an insulating film and an electronic device, and more particularly, it relates to an insulating film suitably applied to an electric field effect type transistor and a metal-insulator-metal (MIM) capacitor, and to an electronic device having the insulating film. Furthermore, the present invention relates to electronic devices, such as a MOS field effect transistor which has the semiconductor substrate mainly constituted by Si (silicon) and a gate insulating film using the layered perovskite substance which is epitaxially grown directly on it.

In order to carry out a miniaturization of ULSI (ultra large scale integration) devices and to reduce power consumption, it has been desired to make the gate insulating film thin. Conventionally, in order to keep the amount of electric charges induced to the channel of FET (Field Effect Transistor), the technique of enlarging a capacitance has been taken by making the gate insulating film thin. As the result, making $SiO_2$ film which is the gate oxide thin is promoted, and it is going to reach even the thickness below 10 angstroms (1 nm) now.

However, as long as the $SiO_2$ film is used, a gate leak current becomes large and power consumption is no longer pressed down from loss of standby power requirement. For example, although MOSFET operates normally with $SiO_2$ film of 8 angstroms (0.8 nm) of thickness, gate leak current has reached even 1 $kA/cm^2$ and the problem in the field of power consumption is very big.

It is effective to increase the thickness, in order to reduce power consumption. For this reason, the trial to keep the amount of electric charges by using films thicker than $SiO_2$ film is actively examined by employing materials with high permittivity (high-K dielectric). However, generally as for the materials with high permittivity, the band gap tends to become smaller. Actually, in the gate insulating film using a substance with high permittivity like $SrTiO_3$, since the band offset by the side of a conduction band becomes very small, it is difficult to stop the leak current by making the thickness quite thick. Similar situations may take place in the case where other substances which have high permittivity such as (Ba, Sr, Ca) (Ti, Zr)$O_3$, Pb(Zr, Ti) $O_3$, $SrBi_2Ta_2O_9$, $Ta_2O_5$, $CeO_2$ and $TiO_2$ are used.

That is, band offset for silicon with these substances is very small compared with 0.5 eV (an ideal is 1.0 eV or more) of a target. There are materials where the amount of the band offset to silicon is only about 0.1 eV. The same problem exists in the case of MIM capacitors. For example, in a Pt/$SrTiO_3$/Pt capacitor, since the leak current is very large, it is unutilizable.

On the other hand, a laminated type insulating film using two or more layers which consist of an insulating material is proposed (for example, Japanese Patent Laid-Open Publication No. 2000-195856, Japanese Patent Laid-Open Publication No. 2001-274393, and Applied Physics Letters 78 p3292 (2001))

However, from a view point of the miniaturization for high integration and the request of low power consumption, these laminated-type insulating films and the Ruddlesden-Popper type (Srn+1TinO$_3$n+1) films were not sufficient to realize both higher permittivity and lower leak. On the other hand, an invention about a perovskite type substance which is formed on silicon substrate with an optimized condition is proposed (Japanese Patent Laid-Open Publication No. 2002-100767).

However, in the technology described in the above-mentioned Japanese Patent Laid-Open Publication No. 2002-100767, the optimum range of the perovskite type substance is sought for gate insulating films. Moreover, it is not taken into consideration about the barrier for electrons. Furthermore, it is not taken into consideration about the shift of the optimum range at the time of introducing "distortion" into Si substrate. For this reason, the optimization in a true meaning is not carried out. In invention indicated in the Japanese Patent Laid-Open Publication No. 2002-100767, the optimum range is not specified appropriately, as will be explained in full detail later.

SUMMARY OF THE INVENTION

According to an embodiment of the invention, there is provided an insulating film comprising: a first barrier layer consisting of a material having a first bandgap and a first relative permittivity; a well layer provided on the first barrier layer, consisting of a material having a second bandgap smaller than the first bandgap and having a second relative permittivity larger than first relative permittivity, discrete energy levels being formed in the well layer by a quantum effect; and a second barrier layer provided on the well layer, consisting of a material having a third bandgap larger than the second bandgap and having a third relative permittivity smaller than second relative permittivity.

According to other embodiment of the invention, there is provided an insulating film comprising: a first barrier layer consisting of a material having a conduction band whose energy level is higher than an energy level of a conduction band of silicon by 0.5 electron volts or more and having a valence band whose energy level is lower than an energy level of a valence band of silicon by 0.5 electron volts or more; a well layer provided on the first barrier layer, the well layer consisting of a material having a bandgap smaller than a bandgap of $SiO_2$ and having a relative permittivity larger than a relative permittivity of SiO2, and a thickness of the well layer being not larger than 10 angstroms; and a second barrier layer provided on the well layer, the second barrier layer consisting of a material having a conduction band whose energy level is higher than an energy level of a conduction band of silicon by 0.5 electron volts or more and having a valence band whose energy level is lower than an energy level of a valence band of silicon by 0.5 electron volts or more.

According to other embodiment of the invention, there is provided an insulating film comprising: n (n being an integer larger than 2) layers of barrier layer consisting of a material having a bandgap larger than a first bandgap and having a relative permittivity smaller than a first relative permittivity; and (n−1) layers of well layers consisting of a material having a bandgap smaller than the first bandgap and having a relative permittivity larger than the first relative permittivity, discrete energy levels being formed in the well layer by a quantum effect, each of the barrier layers and each of the well layers being stacked by turns, and discrete energy levels being formed in each of the well layers by a quantum effect.

According to other embodiment of the invention, there is provided an insulating film comprising: n (n being an integer larger than 2) layers of barrier layers consisting of a material having a conduction band whose energy level is higher than an energy level of a conduction band of silicon by 0.5 electron volts or more and having a valence band whose energy level is lower than an energy level of a valence band of silicon by 0.5 electron volts or more; and (n−1) layers of well layers consisting of a material having a bandgap smaller than a bandgap of SiO2 and having a relative permittivity larger than a relative permittivity of $SiO_2$, and thicknesses of the well layers being not larger than 10 angstroms, each of the barrier layers and each of the well layers being stacked by turns to form a multi-quantum well structure.

According to other embodiment of the invention, there is provided an electronic device capable to operate as a capacitor, comprising: a first electrode; an insulating film provided on the first electrode, including: n (n being an integer larger than 1) layers of barrier layer consisting of a material having a bandgap larger than a first bandgap and having a relative permittivity smaller than a first relative permittivity; and (n−1) layers of well layers consisting of a material having a bandgap smaller than the first bandgap and having a relative permittivity larger than the first relative permittivity, discrete energy levels being formed in the well layer by a quantum effect, each of the barrier layers and each of the well layers being stacked by turns, and discrete energy levels being formed in each of the well layers by a quantum effect; and a second electrode provided on the insulating film.

According to other embodiment of the invention, there is provided an electronic device comprising: a semiconductor layer; an insulating film provided on the semiconductor layer, including: n (n being an integer larger than 1) layers of barrier layer consisting of a material having a bandgap larger than a first bandgap and having a relative permittivity smaller than a first relative permittivity; and (n−1) layers of well layers consisting of a material having a bandgap smaller than the first bandgap and having a relative permittivity larger than the first relative permittivity, discrete energy levels being formed in the well layer by a quantum effect, each of the barrier layers and each of the well layers being stacked by turns, and discrete energy levels being formed in each of the well layers by a quantum effect; and a gate electrode provided on the insulating film, an electric field in the semiconductor layer under the insulating film being controllable by applying a voltage to the gate electrode.

According to other embodiment of the invention, there is provided an electronic device comprising: a semiconductor layer containing silicon as a major component; and a dielectric film epitaxially grown directly on a major surface of the semiconductor layer, the dielectric film having a perovskite structure, a difference between $2^{1/2}$ times lattice constant of the perovskite structure along the major plane and a lattice constant of the semiconductor layer along the major plane being not larger than 1.5%, the perovskite structure being expressed by a chemical formula $ABO_3$, the element A including at least one selected from a group consisting of Ba, Sr, Ca and Mg, a percentage of Mg content in the element A being not larger than 10%, the element B including at least one selected from a group consisting of Ti, Zr and Hf, and a percentage of Ti content in the element B being not larger than 50%.

According to other embodiment of the invention, there is provided an electronic device comprising: a semiconductor layer containing silicon as a major component; and a dielectric film epitaxially grown directly on a major surface of the semiconductor layer, the dielectric film having a Ruddlesden-Popper type structure, a difference between $2^{1/2}$ times lattice constant of the Ruddlesden-Popper type structure along the major plane and a lattice constant of the semiconductor layer along the major plane being not larger than 1.5%, the Ruddlesden-Popper type structure being expressed by a chemical formula $A_{n+1}B_nO_{3n+1}$, the element A including at least one selected from a group consisting of Ba, Sr, Ca and Mg, a percentage of Mg content in the element A being not larger than 10%, the element B including at least one selected from a group consisting of Ti, Zr and Hf, a percentage of Ti content in the element B being not larger than 80% in a case where n=1, a percentage of Ti content in the element B being not larger than 70% in a case where n=2, a percentage of Ti content in the element B being not larger than 60% in a case where n=3, and a percentage of Ti content in the element B being not larger than 50% in a case where n≧4.

According to other embodiment of the invention, there is provided an electronic device comprising: a semiconductor layer containing silicon as a major component; and a dielectric film epitaxially grown directly on a major surface of the semiconductor layer, the dielectric film having a Ruddlesden-Popper type structure, a difference between $2^{1/2}$ times lattice constant of the Ruddlesden-Popper type structure along the major plane and a lattice constant of the semiconductor layer along the major plane being not larger than 1.5%, the Ruddlesden-Popper type structure having a structure where a layer expressed by a chemical formula A2BO4 and a layer expressed by a chemical formula $A_3B_2O_7$ are stacked by turns, the element A including at least one selected from a group consisting of Ba, Sr, Ca and Mg, a percentage of Mg content in the element A being not larger than 10%, and the element B including at least one selected from a group consisting of Ti, Zr and Hf.

According to other embodiment of the invention, there is provided an electronic device comprising: a semiconductor layer containing silicon as a major component; and a dielectric film epitaxially grown directly on a major surface of the semiconductor layer, the dielectric film having an in-phase type structure, a difference between $2^{1/2}$ times lattice constant of the in-phase type structure along the major plane and a lattice constant of the semiconductor layer along the major plane being not larger than 1.5%, the in-phase type structure being expressed by a chemical formula $A_{n+2}B_nO_{3n+2}$, the element A including at least one selected from a group consisting of Ba, Sr, Ca and Mg, a percentage of Mg content in the element A being not larger than 10%, and the element B including at least one selected from a group consisting of Ti, Zr and Hf.

According to other embodiment of the invention, there is provided an electronic device comprising: a semiconductor layer containing silicon as a major component; and a dielectric film epitaxially grown directly on a major surface of the semiconductor layer, the dielectric film having an in-phase type structure, a difference between $2^{1/2}$ times lattice constant of the in-phase type structure along the major plane and a lattice constant of the semiconductor layer along the major plane being not larger than 1.5%, the in-phase type structure having a structure where a layer expressed by a chemical formula $A_3BO_5$ and a layer expressed by a chemical formula $A_4B_2O_8$ are stacked by turns, the element A including at least one selected from a group consisting of Ba, Sr, Ca and Mg, a percentage of Mg content in the element A being not larger than 10%, and the element B including at least one selected from a group consisting of Ti, Zr and Hf.

According to other embodiment of the invention, there is provided an electronic device comprising: a semiconductor layer containing silicon as a major component; and a dielectric film epitaxially grown directly on a major surface of the semiconductor layer, the dielectric film having a well layer, a difference between $2^{1/2}$ times lattice constant of the dielectric film the major plane and a lattice constant of the semiconductor layer along the major plane being not larger than 1.5%, the well layer being expressed by a chemical formula $mAO+nABO_3$ (m being integer larger than 2, and n being integer larger than zero) where a layer of a sodium chloride structure expressed by a chemical formula AO and a layer of a perovskite structure expressed by a chemical formula $ABO_3$ are stacked, the element A including at least one selected from a group consisting of Ba, Sr, Ca and Mg, a percentage of Mg content in the element A being not larger than 10%, and the element B including at least one selected from a group consisting of Ti, Zr and Hf.

According to other embodiment of the invention, there is provided an electronic device comprising: a semiconductor layer containing silicon as a major component; and a dielectric film epitaxially grown directly on a major surface of the semiconductor layer, the dielectric film having a well layer, a difference between $2^{1/2}$ times lattice constant of the dielectric film the major plane and a lattice constant of the semiconductor layer along the major plane being not larger than 1.5%, the well layer having a structure where a layer expressed by a chemical formula $mAO+ABO_3$ (m being integer larger than zero) and a layer expressed by a chemical formula $nAO+2ABO_3$ (n being integer larger than zero) are stacked by turns, including a layer of a sodium chloride structure expressed by a chemical formula AO and a layer of a perovskite structure expressed by a chemical formula $ABO_3$, the element A including at least one selected from a group consisting of Ba, Sr, Ca and Mg, a percentage of Mg content in the element A being not larger than 10%, and the element B including at least one selected from a group consisting of Ti, Zr and Hf.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
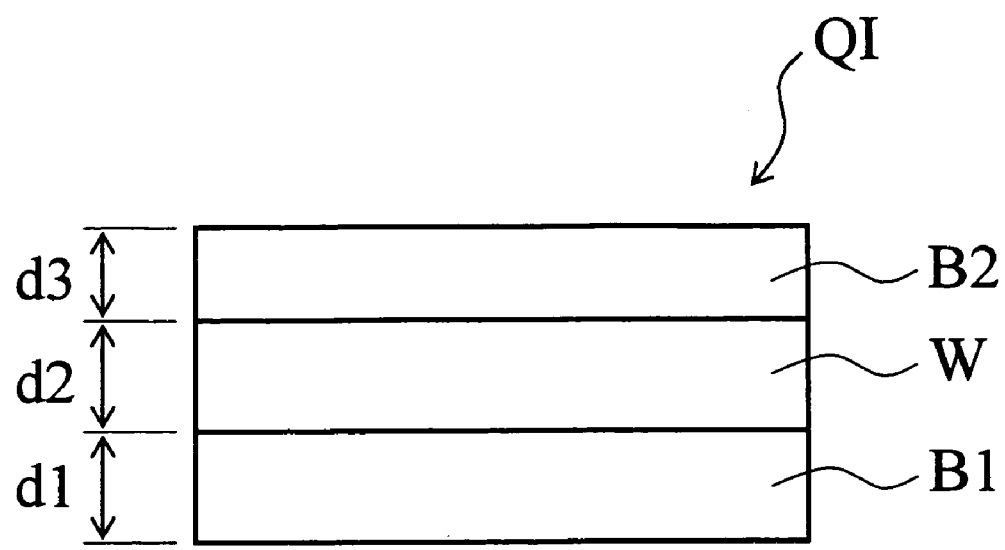
FIG. 1 is a schematic diagram showing the cross-sectional structure of the insulating film according to the embodiment of the present invention.

Hereafter, some embodiment of the invention will be explained, referring to the drawings.

FIG. 1 is a schematic diagram showing the cross-sectional structure of the insulating film according to the embodiment of the present invention. That is, the insulating film QI of this embodiment has the quantum well structure where the well layer W is sandwiched by the barrier layers B1 and B2 from both sides.

The well layer W consists of a material which has relatively smaller band gap and relatively larger relative dielectric constant. On the other hand, the barrier layers B1 and B2 consist of materials which have relatively larger band gap and relatively smaller relative dielectric constant.

Figure 2:
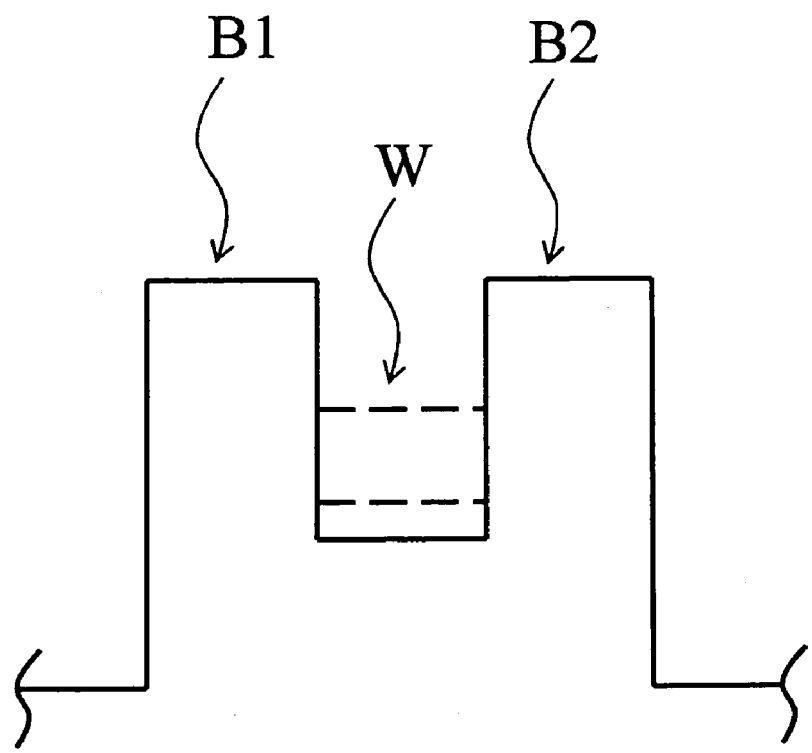
FIG. 2 is a schematic diagram showing the energy band diagram in the insulating film QI of FIG. 1.

FIG. 2 is a schematic diagram showing the energy band diagram in the insulating film QI of FIG. 1.

Namely, the quantum levels (the quantization levels) by the size effect are formed in the well layer W as expressed with the broken lines in this figure, and thus, only discrete energy states are allowed.

Hereafter, each layer which constitutes this insulating film QI will be explained in detail.

First, the well layer W consists of a material which has smaller band gap and larger permittivity compared with SiO$_2$. As the typical material, (Ba,Sr,Ca)TiO$_3$, (Ba,Sr,Ca)(Ti,Zr)O$_3$, Pb(Zr,Ti)O$_3$, Ta$_2$O$_5$, CeO$_2$, HfO$_2$, HfON, ZrO$_2$, ZrON, TiO$_2$, Hf-silicate, HfSiON, Zr-silicate, ZrSiON, Ti-silicate, other silicates or these nitrides, Y$_2$O$_3$, LaAlO$_3$, Ga$_2$O$_3$, La$_2$O$_3$ and Al$_2$O$_3$ can be mentioned, for example.

Next, the barrier layers B1 and B2 consist of materials which have larger band gaps than Si (silicon).

Furthermore, these layers are desirably consist of materials whose band offset to silicon is 0.5 eV or more on both n-side and p-side. That is, these layers are desirably consist of a material whose band offset is higher than silicon by 0.5 eV at a conduction band, and lower than silicon by 0.5 eV at a valence band. Moreover, these layers are desirably consist of a material whose band offset is higher than silicon by 1.0 eV at a conduction band, and lower than silicon by 1.0 eV at a valence band.

As the typical material, (Ba,Sr,Ca)O, SiO$_2$, Si$_3$N$_4$, SiON, Al$_2$O$_3$, Hf-silicate, nitride of Hf-silicate, Zr-silicate, nitride of Zr-silicate, Ti-silicate, nitride of Ti-silicate, other silicates or these nitrides, MgAl$_2$O$_4$, (Ba,Sr,Ca)F, etc. can be mentioned.

The silicate is a candidate material for both barrier layers B1 and B2, and for the well layer W. This is because the silicate may be suitable for both the well layer and the barrier layers by adjusting the quantity of the metal contained. Moreover, Al$_2$O$_3$ may be used for both the well layer and the barrier layers by appropriately selecting another material layer to be a combined. That is, a material considered to be the type of the barrier layers may be adapted for the well layer, and conversely a material considered to be a type of the well layer may be adapted for the barrier layers.

For example, SrO may be used for the well layer and SiO$_2$ may be used for the barrier layers.

The present invention has been made in order to control effective band offset of a high dielectric insulating film by the quantization formed by a single well potential or a multi-well potential. Although the method of constituting the well layer W using epitaxial growth technology is also leading in the present invention, since it is also possible to constitute the well layer by using an oriented film, a polycrystalline film or an amorphous film, the whole well layer has not necessarily to be an epitaxial film.

In the insulating-film structure using a single quantum well, effective band offset can be increased to the minimum energy level (quantized zero-point-vibration level) formed in the well layer W.

When the electric fields applied to the insulating film are 5 MV/cm and the $SiO_2$ conversion thickness i.e., equivalent oxide thickness (EOT), of the insulating film, is 10 angstroms, in order to operate a computer arithmetic unit by the low power consumption not more than 10 W, it is effective to make leak current less than $10^{-5}$ $A/cm^2$. 0.9 eV or more of height of the barrier over the leak current by tunneling is required to satisfy this requirement.

In the present invention, more efficient quantization is attained under the following conditions and it becomes possible to raise the height of the tunnel barrier to 0.9 eV or more. First, the condition is to make the width d2 of the well layer W into 5 angstroms or less.

Moreover, the condition is that a material whose band offset for Si is 1 eV or more at both n-side and p-side is used as a material of the barrier layers B1 and B2, and that the widths d1 and d3 fulfill the following conditions:

d1>2.5 angstroms; and d3>2.5 angstroms.

Furthermore, it is more desirable to fulfill the following conditions:

d1>3.5 angstroms;

d3>3.5 angstroms;

$2.5 > (d1/\epsilon1 + d3/\epsilon2)$; and where $\epsilon1$ and $\epsilon2$ are the relative dielectric constants of the barrier layer B1 and B2, respectively.

The condition about the width d2 of the well layer W is needed so that the minimum level (zero-point-vibration level) of the quantized level amounts to 0.9 eV or more. That is, the quantization level of 0.9 eV or more is made to form by making width d2 of the well layer W into 5 angstroms or less in the present invention. Thus, the voltage at which the leak current which penetrates the quantum well structure by so-called "tunneling resonance" increases can be made higher than the operation voltage of the usual electronic device. As the result, it becomes possible to intercept the leak when applying the usual bias in devices, such as MOSFET and MIM.

Figure 3:
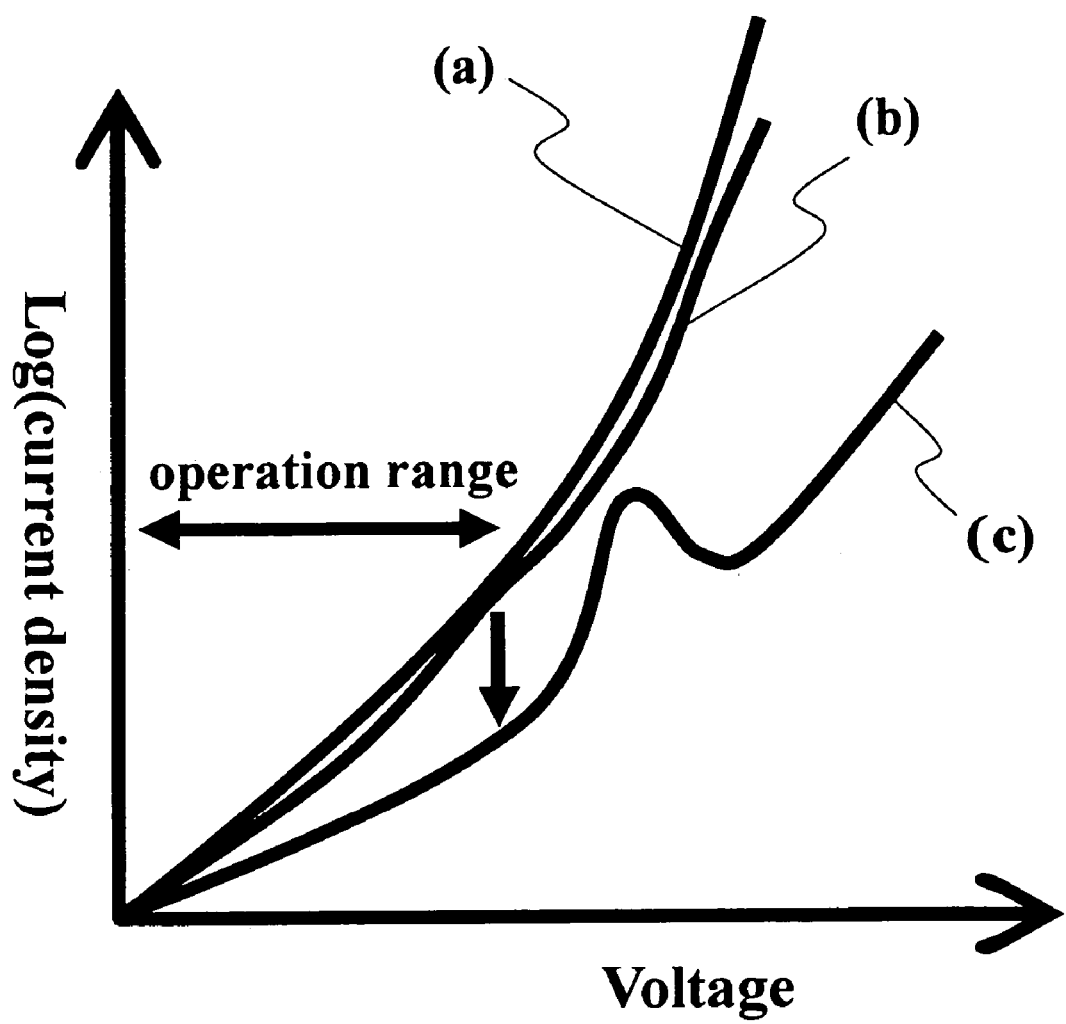
FIG. 3 is a graphical representation showing the leak current density when the voltage is applied to the insulating film.

FIG. 3 is a graphical representation showing the leak current density when the voltage is applied to the insulating film.

The conventional insulating film ($SiO_2$ insulating film) which consists only of $SiO_2$ has the characteristic that the leak current goes up exponentially to the applied voltage, as expressed by curb (a) in this figure.

On the other hand, in the case of the laminated type insulating film disclosed by the Japanese Patent Disclosures JP2000-195856A and JP2001-274393A which were mentioned above, the thickness of the insulating layer (it corresponds to the well layer of the present invention) with small band gap, is 30 angstroms or more. In this case, in the operation temperatures (in a range between −50 degrees centigrade and +100 degrees centigrade), the level in the well becomes continuously and the quantum effects are not seen at all. For this reason, as expressed by the curb (b) in FIG. 3, also in the case of the conventional laminated type insulating film, the characteristic of the leak current has a tendency just like $SiO_2$ usual insulating film (thickness is the same as the equivalent oxide thickness (EOT) of the lamination insulating film), and the reduction of the leak current by the quantum effects is not seen at all.

On the other hand, in the case of the quantum well type insulating film of this embodiment, the quantum effects arise by making width d2 of the well layer W into 5 angstroms or less, and the quantization level of 0.9 eV or more is formed in the well layer W. As a result, since the career does not penetrate the insulating film until it results in this quantization level even if it tunnels the barrier layer B1 and B2, the leak current can be decreased sharply. And if applied voltage is further enlarged to a quantum well type insulating film, as expressed by the curb (c) in FIG. 3, the leak current will raise in peak. This expresses the state where the career penetrates the whole insulating film through the quantization level formed in the well layer W by tunneling Resonance.

The quantization level obtained by making width d2 of the well layer W into 5 angstroms or less is higher than the voltage range of operation of the usual MOSFET or MIM. For this reason, as expressed in FIG. 3, the leak current can be reduced in the whole voltage range of operation.

Next, if the widths d1, d3 of the barrier layers B1, B2 are too thin, the effective barrier height decreases. And the quantum levels spread out from the well by a quantum tunneling. By making the width of the barrier layers B1 and B2 3.5 angstrom or more, these problems will be avoided nearly completely, but even if it is 2.5 angstroms, the effects of about a half can be acquired. Therefore, 3.5 angstroms or more is desirable, but if 2.5 angstroms, the minimum quantum effects will be attained. That is, the barrier layer B1 and B2 need the barrier widths of 2.5 angstroms or more. And the barrier widths of 3.5 angstroms or more is more desirable.

If the barrier layer B1 and B2 are too thick, the equivalent oxide thickness (EOT) will exceed 10 angstroms. In order to prevent this problem, the width d1 and d3 of the barrier layer B1 and the barrier layer B2 and the relative dielectric constants $\epsilon1$ and $\epsilon2$ must at least satisfy the following condition:

$2.5 > (d1/\epsilon1 + d3/\epsilon2)$

When the electric field applied to the insulating film is 5 MV/cm and the equivalent oxide thickness (EOT) of the insulating film is 10 angstroms, a computer arithmetic unit may be operated at a power consumption of 100 watts. In this case, it is effective to suppress the leak current less than $10^{-2}$ $A/cm^2$. This may be realized if there is 0.25 eV or more of barrier height to the leak current by tunnel. And in order to realize this situation by employing a quantum well structure, the barrier height is to be made higher than 0.5 eV and the well width is to be made 10 angstroms or less. These conditions are quite easy to satisfy, and thus, the range of choice of materials can be spread greatly.

Next, the insulating film using double quantum well structure will be explained.

Figure 4:
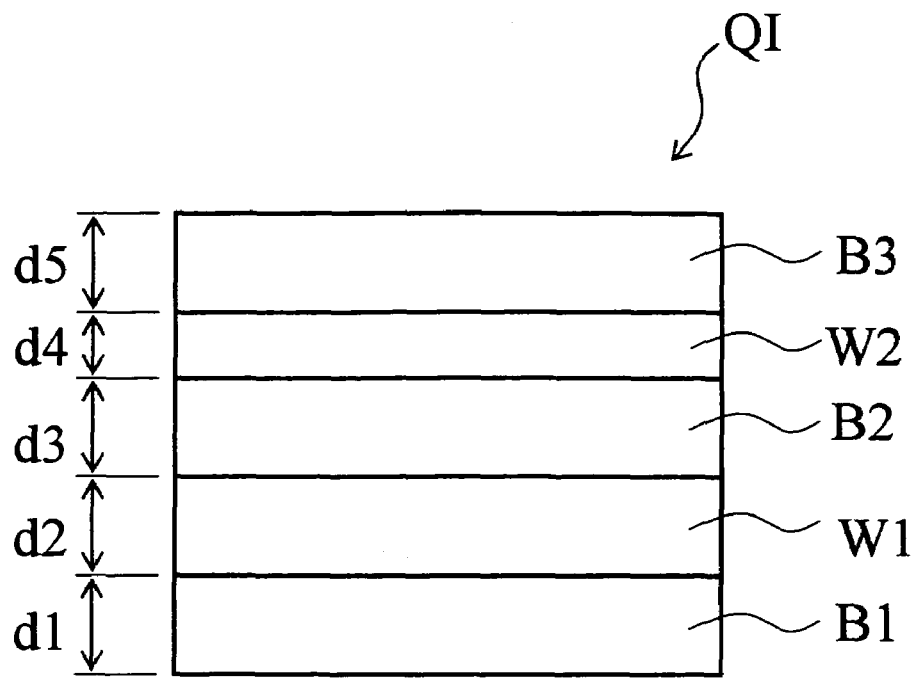
FIG. 4 is a schematic diagram illustrating the cross-sectional structure of the insulating film which uses the double quantum well.

FIG. 4 is a schematic diagram illustrating the insulating film which uses the double quantum well. That is, this insulating film is the structure where the well layers W1 and W2 are inserted into barrier layers B1 through B3. The well layers W1 and W2 consist of materials which have relatively small band gaps and relatively large dielectric constants. On the other hand, the barrier layers B1 through B3 consist of materials which have relatively large band gaps and whose relatively small dielectric constants.

Figure 5:
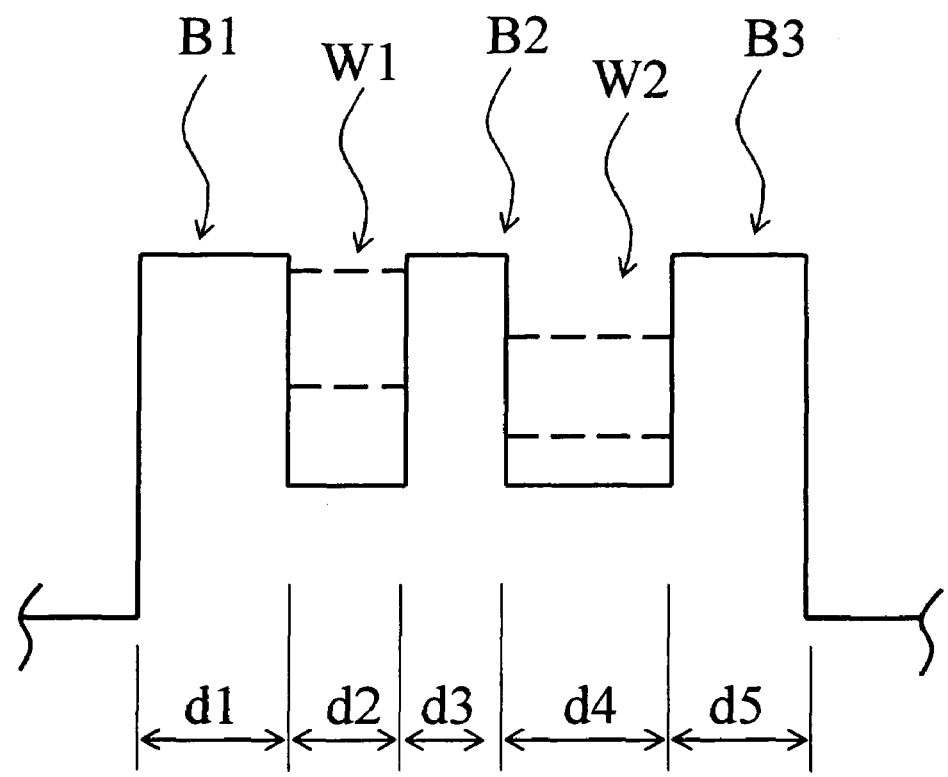
FIG. 5 is a schematic diagram illustrating the energy diagram of the double quantum well structure.

FIG. 5 is a schematic diagram illustrating the energy diagram of the double quantum well structure.

In the insulating-film structure using the double quantum well, by changing the width of the first well layer W1 and the width of the second well layer W2, it becomes possible to shift greatly the energy level (illustrated with the broken line of the quantum level formed in each well layer as illustrated in FIG. 5. In this case, it becomes possible to make effective band offset into the height of the barrier layer directly by shifting the energy level made in the inside of both of the well layers W1 and W2.

Consequently, it becomes possible to make a very high energy barrier.

Figure 6:
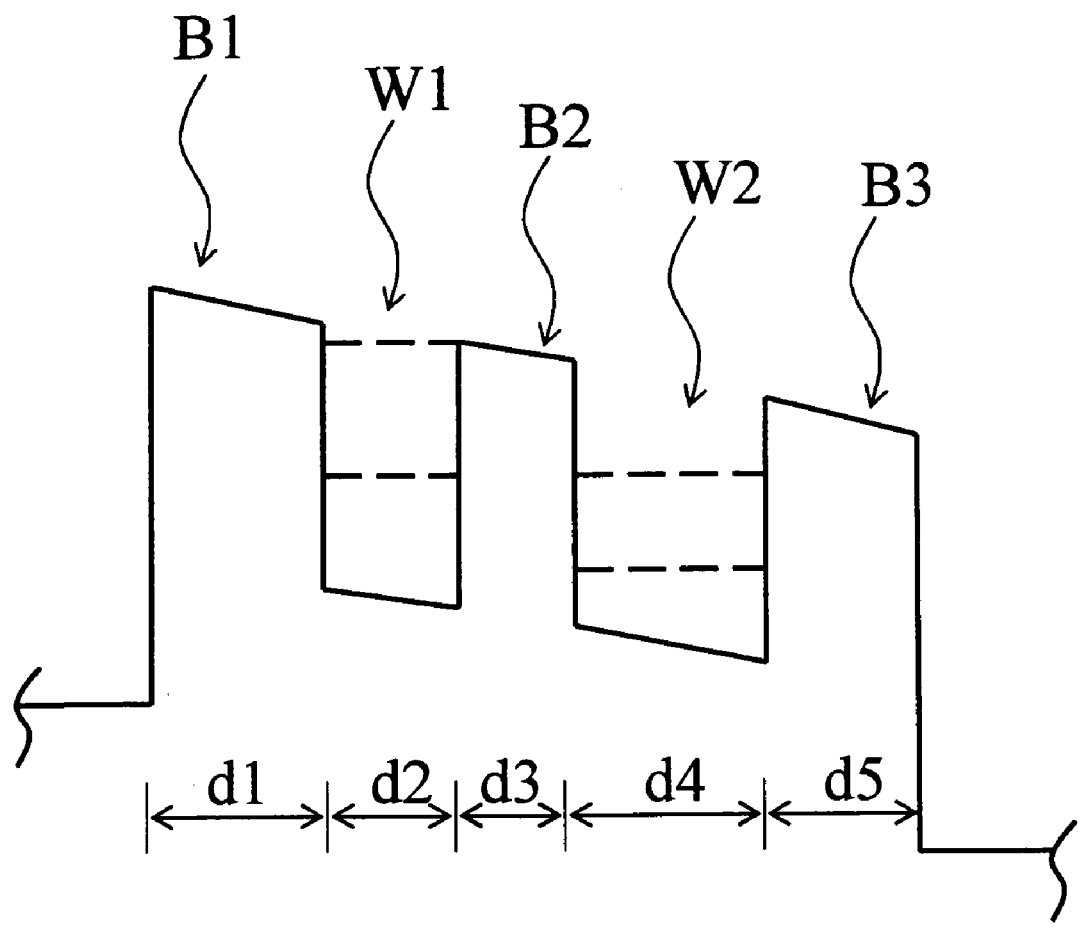
FIG. 6 is a schematic diagram showing the energy diagram in the state where the voltage is applied to this double quantum well structure.

FIG. 6 is a schematic diagram showing the energy diagram in the state where the voltage is applied to this, double quantum well structure.

Thus, since the potential of each well layer will change if the voltage is applied, the energy level may approach or may be agreement with adjacent well layers.

For example, in the case of the example of FIG. 6, the minimum level (it corresponds to the broken line of the bottom in W1) of the well layer W1 and the 2nd level (it corresponds to the broken line of the top in W2) of the well layer W2 have almost same level.

Since the band offset falls rapidly in such a condition, it is desirable that the difference of the energy level of both of well layers is large.

However, if it laminates so that the well layer of the one where well width is thinner may be located in the high potential side when width d2 of the well layer (it is the well layer W1 in FIGS. 5 and 6) of the one where well width is thinner is made into 5 angstroms or less and voltage is applied even if the energy level between adjoining well layers is in agreement, it will become possible to make an about 1 eV barrier.

According to this embodiment, it becomes possible to raise the height effective band offset) of the tunnel barrier from 1.5 eV to 3 eV or more (value corresponding to band offset of the barrier layer). It is ideal that the energy difference of the energy level made in two well layers is large enough and it becomes larger than the maximum (which is assumed to be about 0.4 eV) of the "deviation" caused by the voltage application at the time of the operation of the semiconductor device using this insulating film by ten percent or more (which is assumed to be about 0.04 eV). Since "deviation" of the energy caused by a voltage application is greatly dependent on the width d3 of barrier layer B2. And the required applied voltage depends on the permittivity of the whole film. Therefore, it is quite possible to prevent the inter-coupling of the levels of neighboring well layers below the operating voltage by controlling the thicknesses of the wells and barriers.

Figure 7:
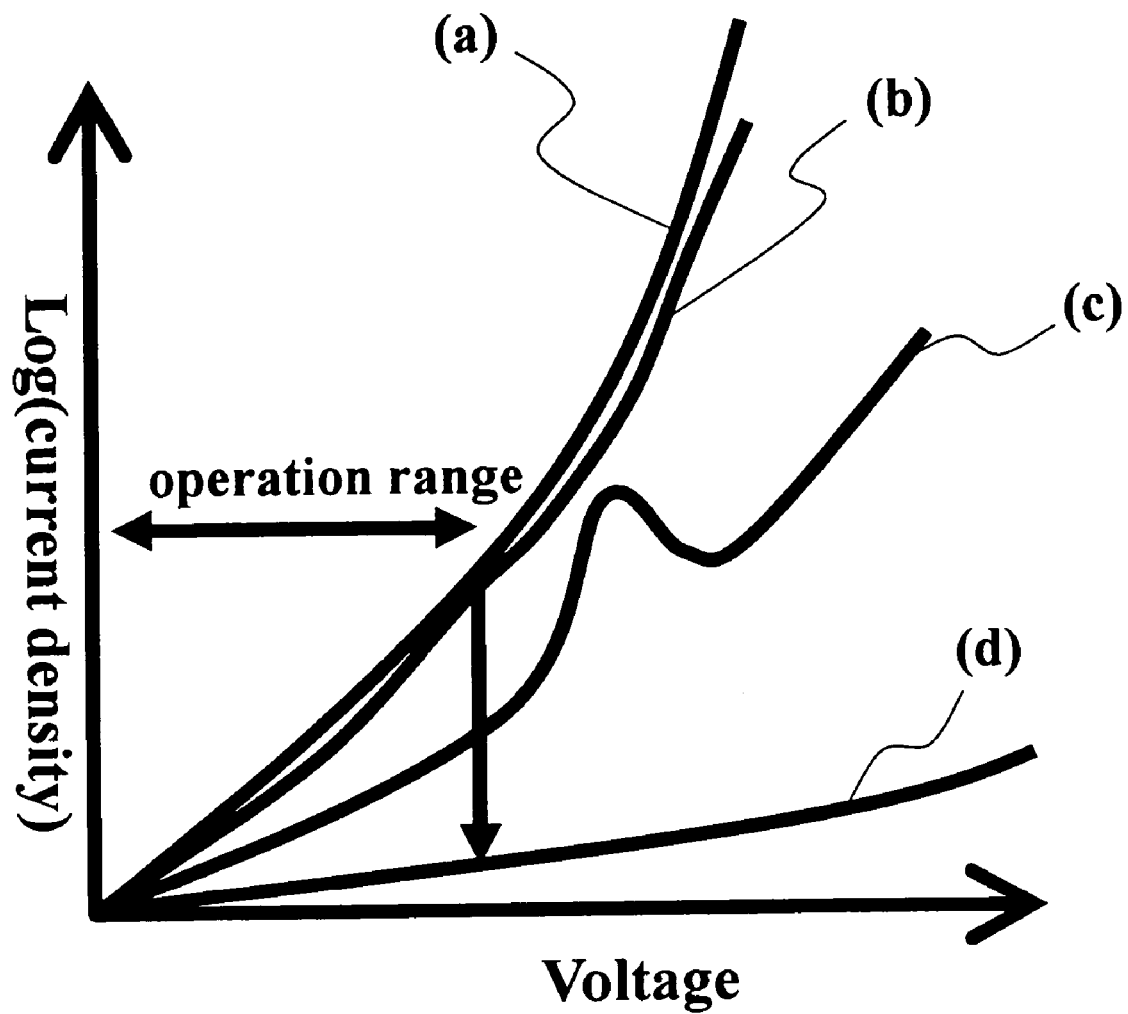
FIG. 7 is a graphical representation showing the leak current density when the voltage is applied to the insulating film.

FIG. 7 is a graphical representation showing the leak current density when the voltage is applied to the insulating film.

Detailed explanation will be omitted about the same elements as what was mentioned above with reference to FIG. 3. It becomes possible to decrease the leak current further by making it double quantum well structure.

The peak-rise of the leak current can also be suppressed certainly by preventing the coincidence of the quantization level between the quantum well W1 and W2, as expressed by the curb (d) in FIG. 7.

On the other hand, about the width d1, d3, and d5 of the barrier layers B1 through B3 used here, it is desirable to fulfill the following conditions.

d1>2.5 angstroms;
d3>2.5 angstroms; and
d5>2.5 angstroms.

Furthermore, it is more desirable to fulfill the following conditions.

d1>3.5 angstroms;
d3>3.5 angstroms;
d5>3.5 angstroms; and
$2.5 > (d1/\epsilon1 + d3/\epsilon2 + d5/\epsilon3)$.

Here, $\epsilon1$, $\epsilon2$, and $\epsilon3$ are the relative dielectric constant of the barrier layer B1, B2, and B3, respectively.

The conditions about the width of these barrier layers are given from the same view as the conditions about the single type quantum well structure which was illustrated in FIGS. 1 and 2.

On the other hand, it is also possible to shift the energy level inside of the well layers by changing the material of the well layer W1 and the material of W2 in double quantum well structure. Moreover, the materials used for the barrier layers B1-B3 does not need be identical. That is, each of the barrier layers B1-B3 may be made of different material. The materials for the barrier layers may be appropriately selected considering the structure of the device, condition of the formation process, etc.

In the insulating-film structure using double quantum well structure, it is also possible to change the way of thinking, and to design structure. That is, when voltage is not applied, the energy levels of the two well layers W1 and W2 need not to deviate largely. These energy levels can be made to deviate when the voltage is applied. In this case, when the voltage is not applied, the energy levels of two well layers may approach, or may become the same.

For example, when the widths of two well layers are the same, the energy levels of two well layers become the same. In the case that the well layer is constituted like the single quantum well structure (it is desirable that the width d2 and d4 of each well layer W1 and W2 is 5 A or less), when the voltage is not applied, the barrier is only 1 eV or less, but when the voltage is applied, an effective barrier becomes high. In this case, if there are plurality of energy levels in the well layer, it is possible to design so that the differences between energy levels in a well become larger than 1.5 eV.

Then when the insulating film of the invention is applied to semiconductor devices, such as MIM, even if the bias voltage is applied, coincidence of the energy level between well layers is not generated.

And since the thickness required to constitute a well layer can be made small, it is especially effective to enlarge the capacitance. However, the barrier layer B2 with a width of 3.5 angstroms or more is required between the well layers W1 and W2 so that an interaction may not work between them, in this case.

When width d3 of the barrier layer B2 is made small, a spread appears in an energy level. Consequently, even when the voltage is applied, since the height of the effective barrier falls to about 0.7 eV the energy due to the coupling of energy levels of the neighboring well layers, high performance can not be expected.

Also in the multi quantum well structure provided the three or more-layer quantum well layer, the same thing can be said as mentioned later. In the case of a three or more-layer quantum well layer, if the width of the barrier layer is smaller than 2.5 angstroms, it is necessary to design the quantum well structure taking consideration that the more the well layer is piled up, the more a spread of a level becomes large.

In the case of the insulating film of the present invention, to make the thickness between quantum wells of the barrier layer into 3.5 angstroms or more in multi quantum well structure is important.

If the thickness of the barrier layer becomes small, the width of the quantum level of the well layer spreads as mentioned above, a confinement of electrons will become weak and it will be advantageous from a viewpoint of a kinetic energy. However, in the invention, even if there is an energy loss of the kinetic energy, it is necessary to design so that there may be no interaction between the energy levels as much as possible.

On the other hand, in the report (Applied Physics Letters 78 p3292 (2001)) mentioned above, a discussion about the method of the epitaxial growth on the $SrTiO_3$ substrate of $Srn+1TinO3n+1$ is disclosed. $Srn+1TinO_3n+1$ is a Ruddlesden-Popper (RP) type material.

"$Srn+1TinO_3n+1$ can be used as a gate insulating film of MOSFET" is indicated in the text. However, $Srn+1TinO_3n+1$ which is one of RP type material does not form the quantum well structure needed by the invention.

$Srn+1TinO_3n+1$ does not function as an insulating film adapting multi quantum well structure from which the height of an effective barrier turns into height of the barrier of a barrier substance. This is because the thickness of the region corresponding to the barrier is very thin, and the quantum level is not formed since the band (it corresponds to the continued energy) which spread in the direction of the thickness.

Therefore, the insulating film with a big barrier using well structure cannot be formed, but "the insulating film whose effective barrier height corresponds with the barrier height of a barrier substance obtained by the invention" is a completely different insulating film.

In the invention, quantization of the energy levels (discrete level formation by quantum effect) in accordance with a design policy which is explained in full detail below is indispensable conditions. Unless the quantization takes place, it is impossible to realize "the insulating film whose effective barrier height corresponds with the barrier height of a barrier substance."

In order to make the quantum well structure as explained in the specification, one of the following design methods may be performed. Both of the design methods intercept completely the interaction in the direction of the thickness of the substances (well partial structure material) which occupy internal Ti site. The 1st design method is "designing the super-lattice structure modulation having been added to the thickness of the well layer so that a discrete resonance quantum level's may occur (for example, 3.9 angstroms and 7.8 angstroms being provided by turns as thickness of the well layer.)." The 2nd design method is "designing the barrier layer thickly enough so that a discrete resonance quantum level's may occur (there being only about 2.5 angstroms at RP type, although it is at least 3.5 angstroms).".

RP type substance disclosed in the report (Applied Physics Letters 78 p3292 (2001)) is applied to this neither, and cannot raise greatly the barrier for electrons and the electron hole barrier in operation temperature.

In the invention, the reason it is important that a discrete resonance quantum level occurs is that it means that the electron (or hole) is confined in the inside of a well. That is, it is because that when it sees from the outside it is visible as if effective mass is large infinitely.

That is, since the effective mass of the direction of the thickness of the electron which enters inside of the well resonating becomes very large, it is visible as if the mobility of the direction of the thickness became substantially zero. In the insulating film adapting the quantum well according to the design of the invention, effective barrier height is in agreement with the barrier height of a barrier substance. Therefore, it becomes possible not only to have a very big barrier for electrons and a hole barrier, but also to reduce the penetration probability of the insulating film more nearly extraordinarily than the penetration probability of the electron (or hole) included in the usual band.

In the conduction band in which the band is formed, this effect is not applied at all. Therefore, by RP type substance which is indicated by the report (Applied Physics Letters 78 p3292 (2001)), since penetration probability will still be large even if the barriers for electrons become large for about 0.8 eV, the leak current cannot fully be decreased like the case of the insulating film adapting a quantum well.

As the result, when compared by the EOT (equivalent oxide thickness) the thickness converted into $SiO_2$ thickness), in RP type of the report (Applied Physics Letters 78 p3292 (2001)), the reduction of the leak current is smaller than the insulating film of the invention. By the insulating film of the invention, the decrease of about $10^{-8}$ times of the leak current is expectable compared with the same SiON film of EOT to explain in full detail as an example later.

On the other hand, in the RP type substance indicated by the report (Applied Physics Letters 78 p3292 (2001)), it turned out in an experiment that the leak current falls only about 0.1 times compared with a SiON film.

In the integrated circuit for today's computer arithmetic units, it is called for that the power consumption of an operation chip is less than at least 100 W. It is a realistic target by considering the operation performance as important, to keep the power consumption 100 W or less, when the power consumption is in a middle range, and to keep it 10 W or less, when the power consumption is kept as small as possible.

Of course, getting worse is not realistic although it is good for power consumption to decrease further rather than this. What is necessary is just to consider a realistic maximum value in the meaning.

Respectively, in the case of holding down power consumption to 100 W and 10 W, when the electric fields are 5 MV/cm and the equivalent oxide thickness (EOT) of an insulating film is 10 angstroms, it is effective to hold down leak current to less than $10^{-2}$ A/cm$^2$ and $10^{-5}$ A/cm$^2$, respectively. And since the amount of leak current is greatly dependent on the barrier over an electron and a hole, it can be estimated the barrier needed over electron and hole.

About a hole, a barrier which exceeds 1 eV is reported in many substances, and since all the substances included by the invention are over 1 eV, they do not become a problem.

In a well type, 0.25 eV and 0.9 eV are required respectively for the barrier over an electron.

When an electron goes into a band like the RP type structure or the perovskite structure, 0.85 eV and 1.0 eV are minimum requirement for the barrier height to an electron.

In order that an electron may go into a band, an improvement is not enough, electric fields are 5 MV/cm, and although a barrier for electrons is about 0.8 eV in RP1 type $Sr_2TiO_4$, when the equivalent oxide thickness (EOT) of an insulating film is 10 angstroms, leak current is actually less $10^{-1}$ A/cm². If compared with $SiO_2$, it will be the improvement of triple figures, but it becomes a value also with the power consumption near [it is inadequate and] 200 W. The state of saying that operation performance is also high (mobility is very large) is the optimum at power consumption 10 W or less. Therefore, it is desirable for a barrier for electrons to be 1.0 eV or more in the perovskite structure and RP type by which an electron goes into a band. Moreover, when Si substrate is used, it is desirable for mobility to be more than 400 cm²/Vsec.

In MOS structure, the mobility has relation in the interface electric charge trap density Dit (cm⁻²/eV) directly, and Dit depends to the lattice constant difference between a substrate and an insulating film strongly in epitaxial growth. And although Dit is very small and mobility is very large at 1.5% or less, Dit increases rapidly in the stage exceeding 1.5%, and mobility decreases rapidly.

At 1.5% or less, mobility is more than 400 cm²/Vsec to Si substrate, and Dit is less than $8\times10^{11}$ cm²/eV.

Moreover, also in a strained Si substrate, although the value of the optimum mobility and Dit change depending on the amount of distortion, it is the same as that in a Si substrate. That is, if it is 1.5% or less of lattice constant difference, Dit is very small, and mobility is also very large, but if it exceeds 1.5%, Dit will increase rapidly and mobility will decrease rapidly.

When the perovskite structure and the RP type substance with which an electron goes into a band are used so that the above explanation may show, in order to reduce power consumption, securing the working speed of MOSFET, it is required for a barrier for electrons to be 1.0 eV or more, and for a lattice constant difference between a substrate and an insulating film to be less than 1.5%. Moreover, since change of the mobility in well type insulating film by the difference of a lattice constant is completely the same the difference of less than 1.5% of lattice constant serves as a boundary line of the optimum range.

Next, the insulating-film structure of having triple quantum well structure will be explained.

Figure 8:
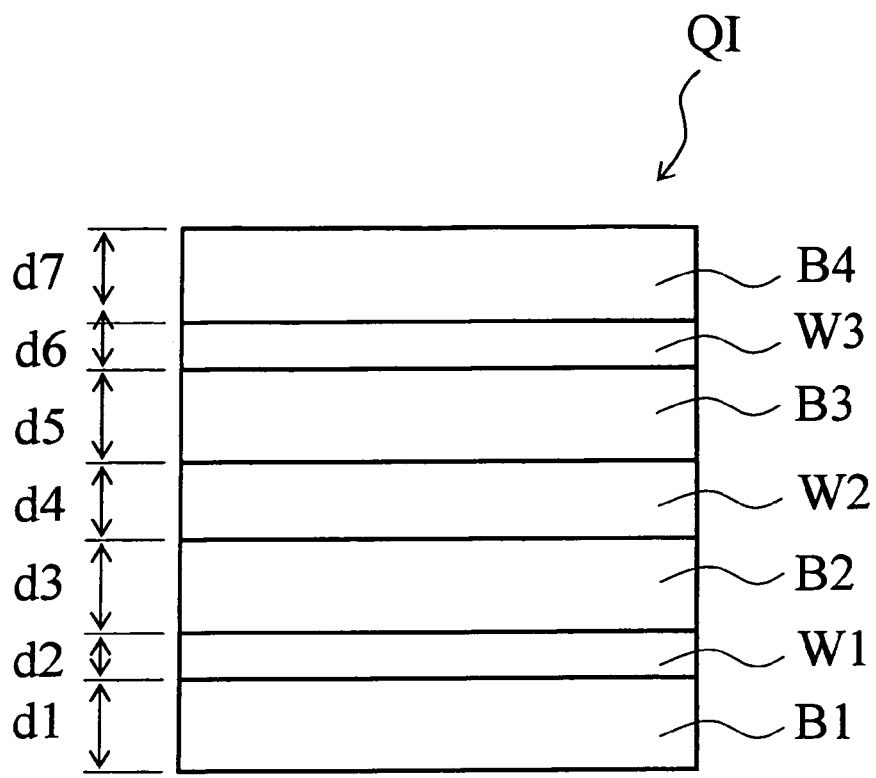
FIG. 8 is a schematic diagram illustrating the cross-sectional structure of the insulating film which has the triple quantum well structure.

FIG. 8 is a schematic diagram illustrating the cross-sectional structure of the insulating film which has the triple quantum well structure. That is, the first through third well layers W1, W2 and W3 have the structure inserted into the first through the fourth barrier layer B1 through B4. The well layers W1 through W3 consist of materials which have relatively small band gaps and relatively large relative dielectric. On the other hand, barrier layers B1 through B4 consist of materials which have relatively large band gaps and relatively small relative dielectric.

Figure 9:
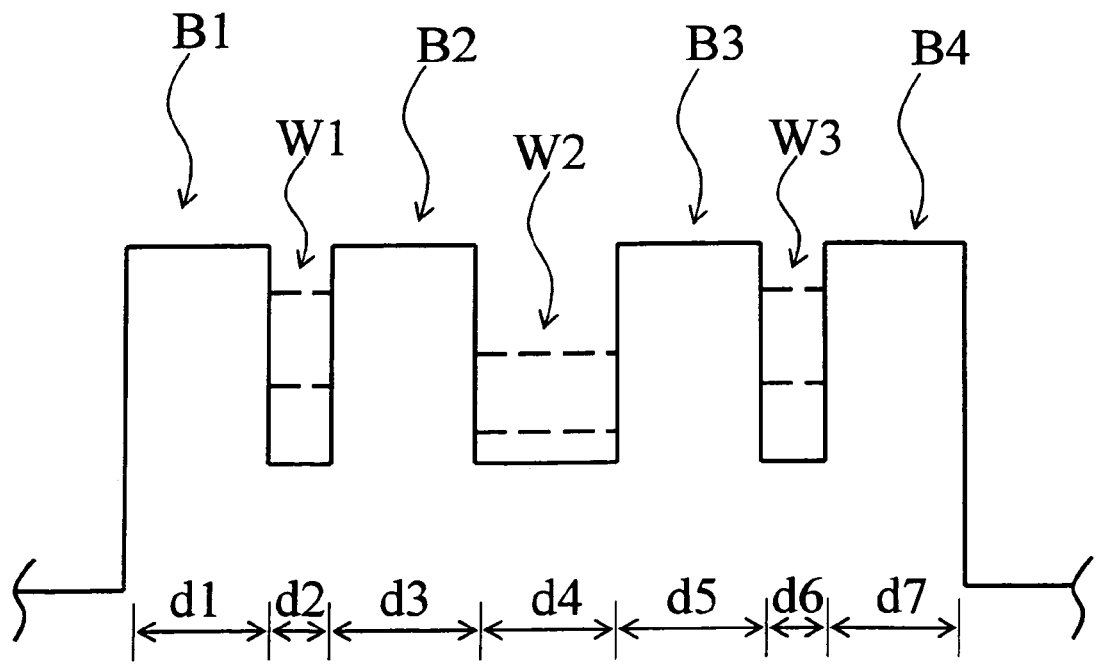
FIG. 9 is a schematic diagram which illustrates the energy diagram of the triple quantum well structure.

FIG. 9 is a schematic diagram which illustrates the energy diagram of the triple quantum well structure.

In the triple quantum well structure illustrated in FIGS. 8 and 9, the width d2 of the first well layer W1 and d6 of the third well layer W3 is the same, and the width d4 of the second well layer W2 differs from that of the first and the third well width. Then, the fall of the band offset by a quantization energy level being in agreement among all quantum well layers when the voltage is applied can be prevented.

That is, when the voltage is applied and the levels of the first well layer W1 and the second well layer W2 are in agreement, the level of third well layer W3 differs from these levels.

The energy level of well layers can be adjusted by setting up the width and material of wells and, the thickness and material of barrier layers appropriately.

Here, the typical materials which constitute a well layer and a barrier layer are the same as those of what was mentioned above.

In the invention, it becomes possible to raise the height of the tunnel barrier of the insulating film to 1.5 eV-3.0 eV more.

When voltage is applied, the height of a tunnel barrier can be raised by making the energy levels made in first through third well layers W1 through W3 not in agreement as illustrated in FIG. 6.

For example, the width d2 and d6 of the first and the third well layers are the same and are 5 angstroms or less, and the width d4 of the second well layer W2 is more than 5 angstroms and less than 10 angstroms, the height of a tunnel barrier can be raised.

About the thickness of the barrier layer, the same conditions as the former are required. Namely, d1>2.5 angstroms;
d3>2.5 angstroms;
d5>2.5 angstroms; and
d7>2.5 angstroms.

Furthermore, it is more desirable to fulfill the following conditions.

d1>3.5 angstroms;
d3>3.5 angstroms;
d5>3.5 angstroms;
d7>3.5 angstroms; and
$2.5>47(d1/\epsilon1+d3/\epsilon2+d5/\epsilon3+d7/\epsilon4)$.

Here, $\epsilon1$, $\epsilon2$, $\epsilon3$, and $\epsilon4$ are the relative dielectric constant of the barrier layer B1, B2, B3 and B4, respectively.

It is possible to change the energy levels made in well layers by using materials which are different in the well layers W1, W2 and W3 like the case of a double well.

Moreover, it is not necessary to use the material as all barrier layers with the same material used for barrier layer B1 through B4 as well as the case of a double well.

As mentioned above, the quantum well structure application insulating film using a quantization level (discrete level by quantum effects) was explained in full detail.

Next, especially the optimum substance as a gate insulating film at the time of making it grow epitaxially directly on Si (or on a strained Si) about the "perovskite type substance $ABO_3$" and "the lamination structure of the perovskite type substance $ABO_3$ and the rocksalt type substance AO" is explained irrespective of the existence of adaptation of quantum well structure. Here, A is at least one of Ba, Sr, calcium, and the Mg, and B is at least one of Ti, Zr, and the Hf(s).

First, the conditions of the gate insulating film on Si (or on strained Si) are the following three points. As far as the inventors gets to know, before the invention, the material which fulfills simultaneously the following "indispensable 3 conditions as an insulating film" was not found out.

(1) In order to make the interface characteristic well and to keep the mobility of both electron and hole high, you have to hold down the lattice constant of an insulating film plus-or-minus 1.5% to the lattice constant of a substrate at the maximum, taking the rotation of a crystal axis into consideration. (when making it grow up to be Si (001) surface, a crystal axis rotates 45 degrees and it grows) (when there is 1.5% or more of lattice constant difference, the interface electric charge increased rapidly and the mobility decreased suddenly.) The lattice constant of the substrate of Si substrate in which distortion is not contained is 5.43 angstroms. Therefore, the lattice constant of the insulating film multiplied by $\sqrt{2}$ (45-degree rotation) must be in the range of 5.349 angstroms to 5.511 angstroms.

For example, since the lattice constant of the substrate of the silicon substrate containing distortion of plus 1% is 5.484 angstroms, the lattice constant of an insulating film must be more than 5.402 angstroms and less than 5.567 angstroms. Since it is thought that a strained Si substrate etc. will come to be used frequently from now on, it is required to choose a lattice constant, taking the amount of distortion of a substrate into consideration.

In the present invention, after considering the case where perovskite type substance $ABO_3$ thin film grows epitaxially directly on Si (001) substrate and where the thin film of Substance AO (A is set to at least one of Ba, Sr, calcium, and the Mg) rocksalt structured and perovskite type substance $ABO_3$ thin film grow epitaxially by turns, the optimum substance in the range of this structure is chosen.

A lattice constant is controllable by both the substitution (A and B) of structure material, and the number of sheets of AO thin film to be inserted.

Hereafter, as a concrete example, although the amount of distortion of a strained Si substrate is set to plus 1%, it is clear that a region shifts with the amount of distortion. That is, in the following explanation, as an example of representation, plus 1% of case is only shown, and you may not necessarily be plus 1%. By strained SOI (silicon on insulator) etc., since the realizable amount of distortion is about plus 1% in the present stage easily, plus 1% is actually made into the example of representation, but it is thought that creation of the strained Si substrate which reaches to 2% or more is attained easily in the future.

For example, if the amount of distortion of a strained Si substrate is plus 1.5%, the lattice constant of a strained Si substrate will become 5.511 angstroms.

Therefore, a thin film with a lattice constant of 5.428 to 5.594 angstroms needs to be formed as a film. If the amount of distortion of the strained Si substrate is plus 2%, the lattice constant of the strained Si substrate will become 5.539 angstroms. Therefore, gate insulating thin film with 5.456 to 5.622 angstroms lattice constant needs to be formed as a film.

Moreover, when the lattice constant by the side of the substrate may have comes to be operated freely, it becomes possible to control the lattice constant of the strained Si substrate so that it is suited for the lattice constant of a gate insulating film. However, since its larger possible one is good when the amount of distortion of a strained Si substrate is taken into consideration from the relation of the mobility, it is as much as possible desirable [enlarging distortion of a strained Si substrate] to unite the lattice constant of a gate insulating film with it as much as possible.

And even when the lattice constant of a strained Si substrate is plus 2% as explained as an example later (5.539 angstroms of lattice constants), it is possible to optimize the gate insulating film.

Here, the lattice constant is 5.93 angstroms when the lattice constant of the substance BaZrO3 of the invention is multiplied by $2^{1/2}$. Therefore, the full limits (larger 1.5% than it) of the lattice constant of the strained Si substrate become 6.02 angstroms. In this marginal condition, since the amount of distortion of a strained Si substrate has reached to 11%, it is thought that it is over the limit of the amount of distortion which can be introduced into a silicon substrate in elasticity. That is, if the gate insulating film of the invention is used, all the distortion substrates that have the realistic amount of distortion can be covered.

(2) It is needed that the barrier is sufficiently high. As mentioned above, a barrier to a hole at a "perovskite type substance" and "the lamination structure of a perovskite type substance and the substance of rocksalt structure" of the invention is large enough (about 2.0 eV is kept). Then, it is necessary to search for the conditions that the barrier for electrons is 1 eV or more. Although this condition is very exacting, if it designs based on the invention, it will become possible in the very large condition range. When using the quantum well insulating film using a discrete resonance quantization level especially, since the barrier height (about 2.5 eV is expectable with the rocksalt structure considered here.) of a barrier substance is also reached, it can realize easily.

(3) As a relative dielectric constant, to fill (real thickness (angstrom))/(relative dielectric constant)<2.5 (angstroms) is needed.

If this condition is fulfilled, equivalent oxide thickness (EOT) will become 10 angstroms or less, and a required electric charge will be kept. Here, since the real thickness is more effective as it is thick, it is desired for permittivity to be large as much as possible.

At least 20 or more are required for the relative dielectric constant of the usual thin film.

On the other hand, as mentioned above, since it uses a non-resonance state in using the quantum well insulating film using a discrete quantization level, the tunnel probability becomes extremely small.

In this case, even if the thickness is thin, it becomes possible to keep the leak current extremely small.

Therefore, even if the thin film that the whole relative dielectric constant becomes small is used, it becomes possible to keep the leak current small. This point is one of the essential effects acquired for the first time by using the quantum well insulating film using the discrete quantization level. As the result, it also becomes possible to lower the minimum of the relative dielectric constant to about ten.

Two methods can be considered in order to constitute the thin film which satisfies all of three conditions explained above. The first method is a method of using the quantum well insulating film using a discrete quantization level as mentioned above. Moreover, the second method is a method of optimizing the substance itself. Moreover, it becomes possible to expand the range of an effective substance by combining the first and the second method.

Hereafter, the second method is explained in detail. Here, the "perovskite type substance $ABO_3$" and "the lamination structure of the perovskite type substance $ABO_3$ and the substance AO of rocksalt structure" are mentioned as an example, and it explains that they can be satisfy all of the three above-mentioned conditions (1) lattice constant (2) barrier for electrons (3) permittivity. Moreover, all the calculation results were sampled appropriately and checked by the actual trial production experiment.

First, a barrier for electrons is explained.

By the perovskite type substance $ABO_3$, even if A site changes to Ba, Sr, Ca, and Mg, the band gap and the barrier for electrons hardly change. On the other hand, when B site is changed, it became clear that the barrier for electrons changed a lot. And it became clear that it is possible to increase the barrier for electrons to 1 eV when forming the perovskite type substance $ABO_3$ as a film directly on Si, by filling (amount of Ti)/amount of Ti+amount of Zr+amount of Hf<=0.5.

Below, the optimum regions are explained for every structure.

(1) The case of "the perovskite type substance $ABO_3$," which is an epitaxial growth on a Si substrate or a strained Si substrate.

Figure 23:
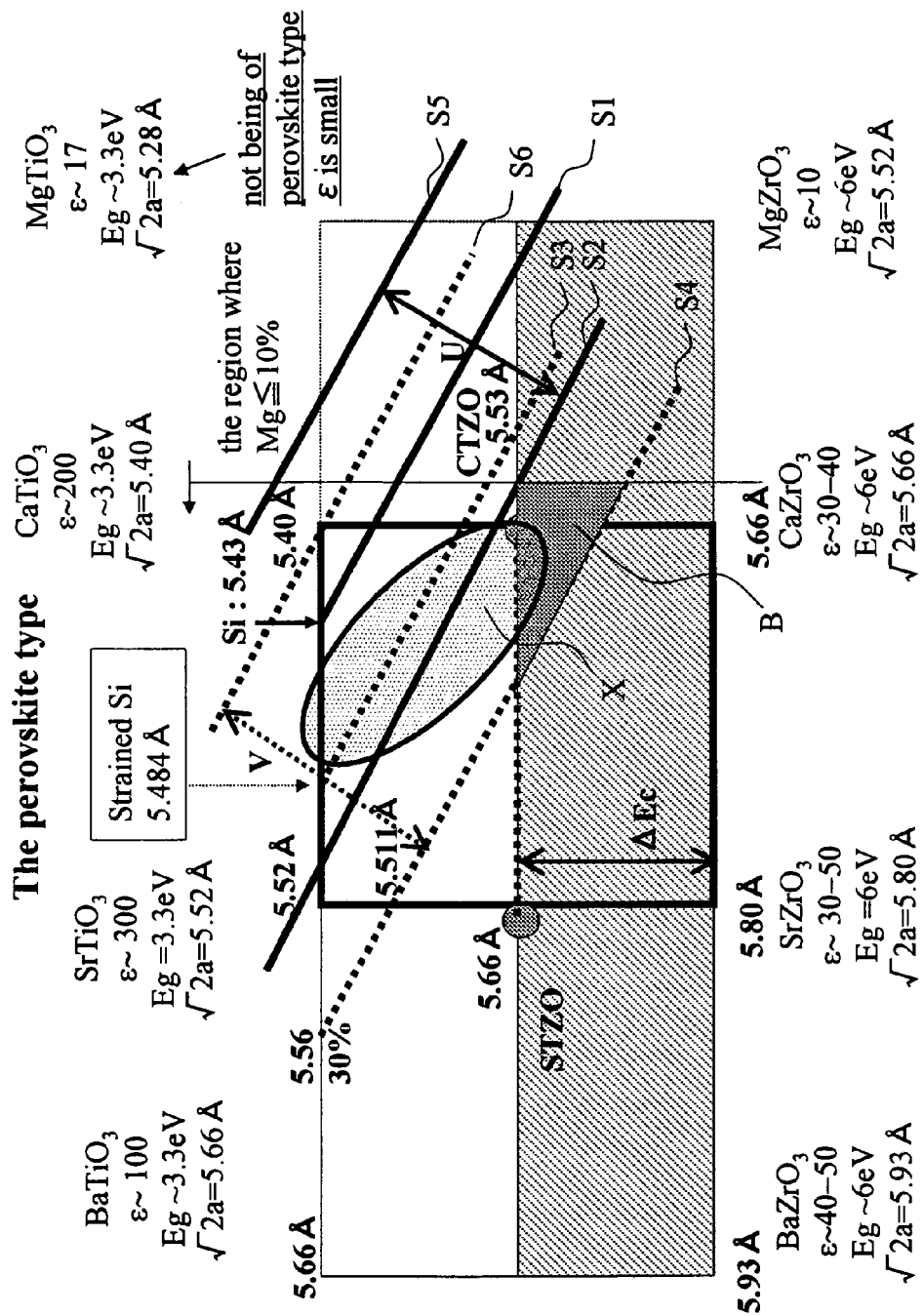
FIG. 23 is a graphical representation showing relations of the lattice constant, the permittivity, and the band gap to the composition in the perovskite type material.

FIG. 23 is a graphical representation showing relations of the lattice constant, the permittivity, and the band gap to the composition in the perovskite type material. The horizontal axis of this figure corresponds to the composition of A site atom in a chemical formula $ABO_3$, and a vertical axis corresponds to the composition of B site atom. Here, in the chemical formula $ABO_3$, the lattice constant, the permittivity, and the band gap at the time of choosing A=(Ba, Sr, Ca, Mg) or B=(Ti, Zr), respectively are expressed concretely. Moreover, the 5.43 angstroms contour line S1 which is the lattice constant of Si substrate is also expressed. Moreover, the 5.511 angstroms contour line S2 which is the maximum (plus 1.5%) of the lattice constant is also expressed with the solid line. Furthermore, the 5.349 angstroms contour line S5 which is the minimum (minus 1.5%) of the lattice constant is also expressed with the solid line.

That the lattice constant of the insulating film is between a contour line S2 and a contour line S5 is the conditions U adjusted in a silicon substrate. The region which is suited for conditions U and whose barrier for electrons is 1.0 eV or more will be described as a region "A" after this.

The barrier for electrons will be set to 1 eV or more if the rate of Zr which occupies B site is made into 50% or more. Therefore, in the graph of FIG. 23, the range of a lower half expressed with the slash agrees on the conditions that a barrier for electrons is high (1 eV or more). As compared with the permittivity of each material, it turns out that the permittivity of a perovskite type substance is sufficiently large. However, if there is much Mg, it becomes impossible to form a perovskite type substance, and permittivity will fall. Therefore, it is necessary to adjust the rate of Mg so that the lattice constant may be made small making it to 10% or less.

The above consideration shows that the region which fills the above "indispensable 3 conditions as the insulating film" does not exist about epitaxial growth on Si substrate. In the Japanese Patent Disclosure JP2002-100767A mentioned above, it is considered that the region X shown in FIG. 23 is the optimum region. However, the "deviation" from the conditions U or a small barrier for electrons less than 1 eV can say that Region X is not suitable as a gate insulating film.

On the other hand, since the optimum lattice constant in the epitaxial growth on an about plus 1% strained Si substrate becomes large, the range to adjust is caught. That is, the lattice constant of a strained Si substrate with distortion of plus 1% is −5.484 angstroms, and the contour line S3 is as illustrated. The maximum of the lattice constant of the gate insulating film adjusted in this lattice constant is 5.56 angstroms, and is expressed by the contour line S4.

Moreover, the minimum of the lattice constant is 5.40 angstroms and is expressed by the contour line S6. That the lattice constant of an insulating film is between the contour line S4 and the contour line S6 are the conditions V adjusted in a strained silicon substrate with distortion of about plus 1%. The region which is between contour lines S4 and S6 (suiting Conditions V) and whose barrier for electrons is 1 eV or more (slash hatch part) is the region B expressed in this figure. For example, in the case of $Ca(Ti_{0.4},Zr_{0.6})O_3$, a barrier for electrons is about 1.2 eV, a lattice constant is 5.556 angstroms, and permittivity is about 40, and it is able to create a very ideal thin film.

In the Japanese Patent Disclosure JP2002-100767A, reference is made about strained Si as an example 4. However, in the example 4 of the Japanese Patent Disclosure JP2002-100767A, $(Sr_{0.5},Ca_{0.5})TiO_3$ which hardly produces a barrier for electrons is used. That is, in this reference, it is not taken into consideration about a barrier for electrons. The Japanese Patent Disclosure JP2002-100767A is describing the region R1 in FIG. 4 thereof as a range which the lattice constant adjusts. However, this corresponds to the solid line S1 which shows 5.43 angstroms of lattice constants of Si in FIG. 23 of the text, and the optimum region does not exist on this straight line.

Moreover, it is clear that the optimum range shifts with the amount of distortion of a strained Si substrate. For example, if the amount of the distortion is plus 1.5%, the lattice constant of a strained Si substrate will become 5.511 angstroms. Therefore, it becomes necessary to form a thin film with 5.428 to 5.594 angstroms of lattice constant as a film. That is, the optimum range becomes larger than Region B. Since the relation of the amount of distortion and the optimum range is the same in each example explained later, detailed explanation is omitted in the following examples.

Figure 24:
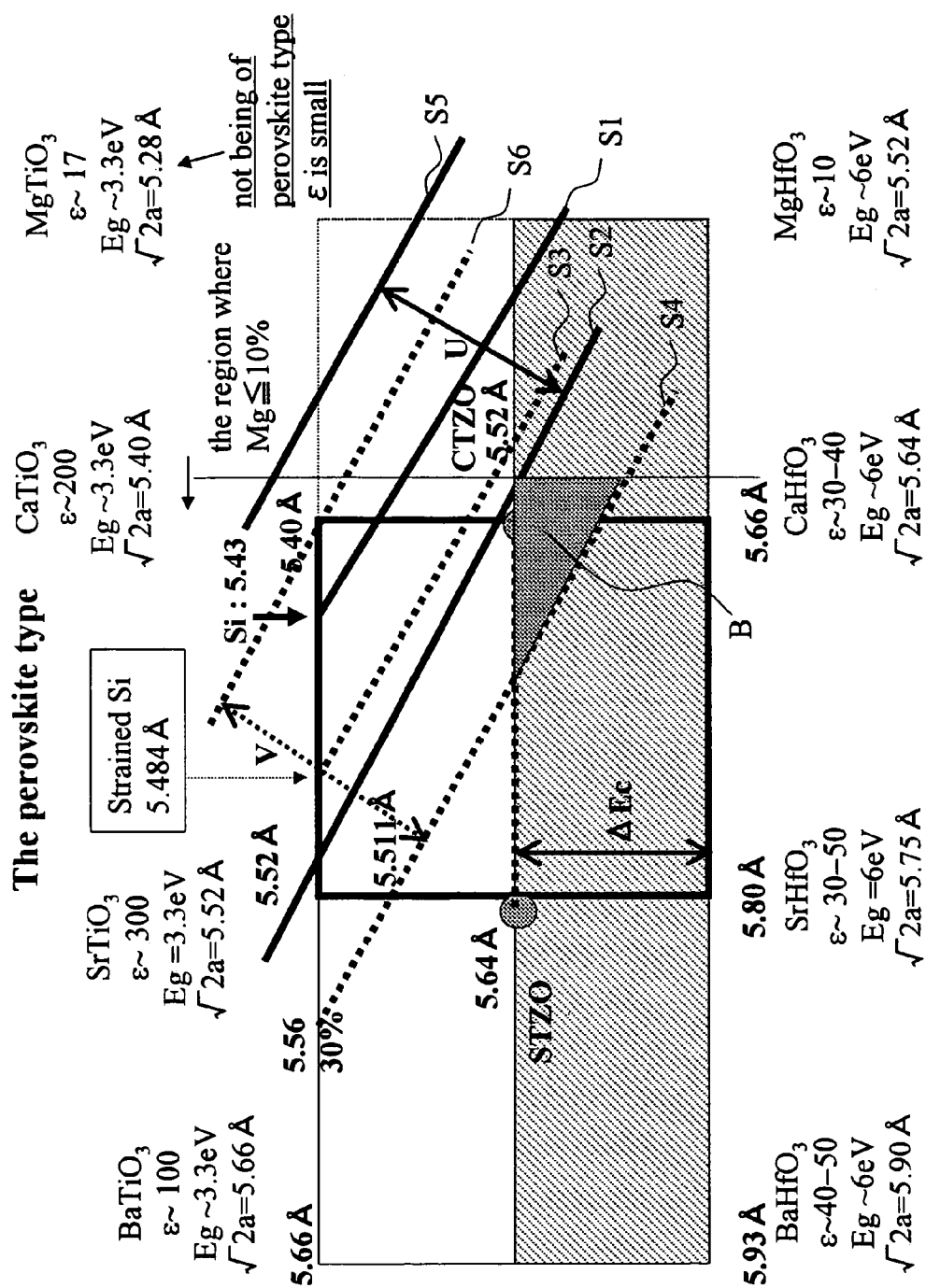
FIG. 24 is a graphical representation showing relations of the lattice constant, the permittivity, and the band gap to the composition in the perovskite type material when adopting Hf as B site instead of Zr of FIG. 23.

FIG. 24 is a graphical representation which summarized the lattice constant, the permittivity, the band gap, etc. when adopting Hf as B site instead of Zr.

Also in this figure, the contour lines S1-S6 of the same lattice constant as FIG. 23 were expressed.

As compared with the case of Zr, the lattice constant of Hf is smaller than that of Zr about 0.6%. When Hf is used compared with the case where Zr is used, the optimum region shifts somewhat, but there is no essential change.

As explained above, it turned out that a good insulating film can be formed when a strained Si substrate is used, although it is difficult to form the optimum insulating film on Si substrate on the substance of a perovskite structure explained about FIGS. 23 and 24.

Figure 25:
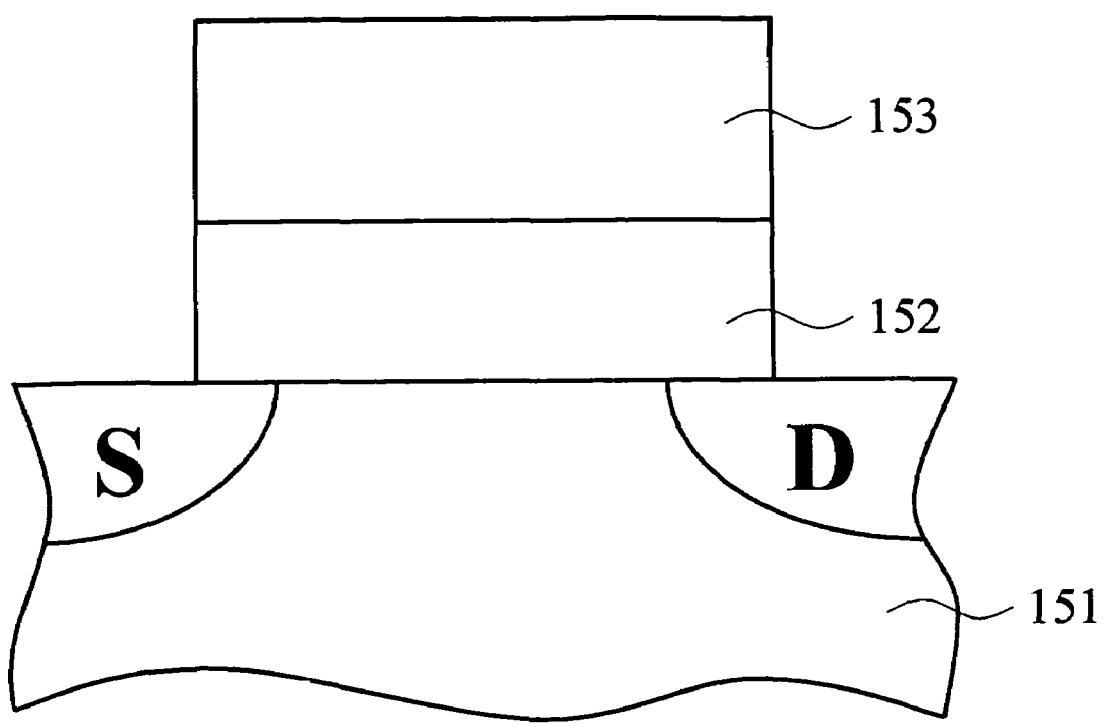
FIG. 25 is a schematic diagram showing MOSFET which uses the insulating film of this example.

FIG. 25 is a schematic diagram showing MOSFET which uses the insulating film of this example.

That is, the source region S and the drain region D are formed on the surface of a silicon substrate or the strained silicon substrate 151. And the insulating film 152 mentioned above is provided on the channel region between these source region and drain region, and the gate electrode 153 is provided on the insulating film 152. And MOSFET of high speed and low power consumption is realizable by using the material in the range of Region B expressed in FIG. 23 and FIG. 24 as a material of the gate insulating film 152.

Figure 26:
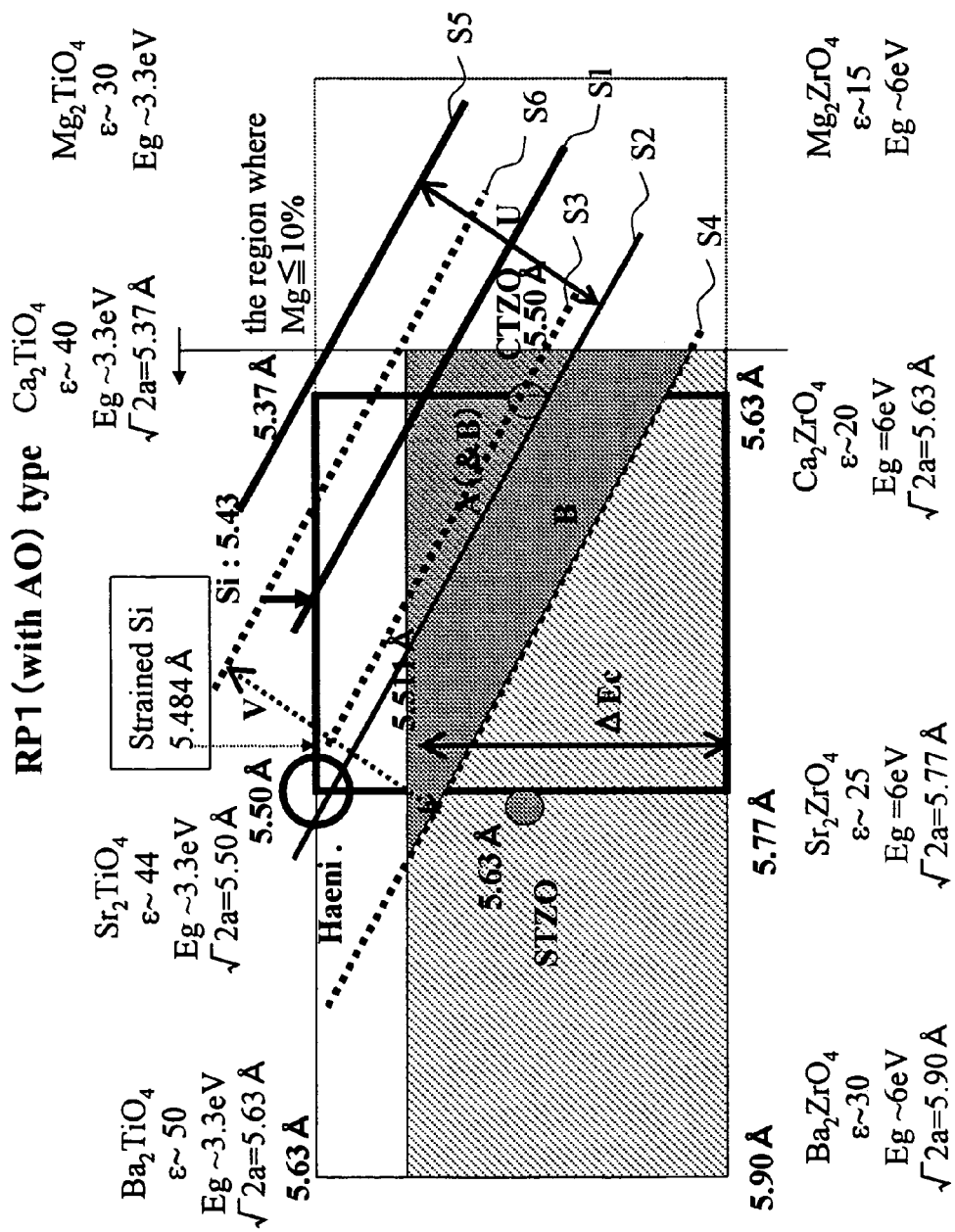
FIG. 26 is a graphical representation showing relations of the lattice constant, the permittivity, and the band gap to the composition in RP type material.

Next, FIG. 26 is a graphical representation showing an example when using RP type material. A lattice constant, permittivity, a band gap, etc. of a case (it abbreviates to "RP1 type".) of n=1 were summarized in RP type $A_{n+1}B_nO_{3n+1}$ in this figure. That is, this figure is concern about epitaxial growth to Si substrate or a strained Si substrate, and is a graphical representation which summarized a lattice constant, a band gap, permittivity, etc. about the material which has the structure where the perovskite type substance $ABO_3$ and the nature AO mono layer of a brocksalt structure were made to laminate by turns. Moreover, also in FIG. 26, the contour lines S1-S6 of a lattice constant are expressed like FIG. 23. Moreover, also in FIG. 26, (Ba, Sr, Ca, Mg) are mentioned as an atom which occupies A site and (Ti, Zr) are mentioned as an atom which occupies B site, respectively.

First, by RP type substance, if a band gap is explained, as mentioned above, since the barrier portion is too thin, the quantum well insulating film in which a discrete quantization level is formed cannot be obtained.

Therefore, it is necessary to increase the amount of Zr(s) (or Hf) and to raise the barrier for electrons ($\Delta$Ec) to 1 eV or more. By RP1 type substance, when the percentage of Zr (+Hf) is 20% or more, the barrier for electrons is 1 eV or more. Therefore, if it is in the shadow area of FIG. 26, it turns out that the conditions that a barrier for electrons is 1.0 eV or more are fulfilled. On the other hand, about permittivity epsilon, when Ba, Sr, and Ca are used for A site, 20 or more are obtained in all the ranges. However, when Mg contains to A site, if there are many amounts of Mg, it will become impossible to form a perovskite type substance, and permittivity will fall. Therefore, a range in which the rate of Mg is made being less than 10% and the lattice constant is made small making the amount of Zr increase is optimum.

Next, a lattice constant will be explained.

Also in FIG. 26, the contour line S1 of 5.43 angstroms of lattice constants of Si substrate and the 5.511 angstroms contour line S2 which is a maximum over the lattice constant were expressed, respectively.

As a result of the above consideration, in the non-strained Si, the range which fulfills the above-mentioned "indispensable 3 conditions as an insulating film" is the region A in FIG. 26. In this region, in the substance which exists down the figure, a barrier for electrons becomes high. Therefore, if it is the thin film of a substance which mixed a small amount of Mg, making the amount of Zr(s) increase to $Ca_2(Ti_{0.5}, Zr_{0.5})O_4$ or here, it can be said that the powerful thin film as an insulating film is obtained.

In the report (Haeni, Appl. Phys. Lett. 78 p.3292 (2001)) mentioned above, the possibility as a gate insulating film of $Sr_2TiO_4$ expressed in FIG. 26 is suggested. However, as shown in FIG. 26, since the barrier for electrons of $Sr_2TiO_4$ is not high enough, the leak current cannot fully be reduced.

Moreover, since the optimum lattice constant in the epitaxial growth on an about plus 1% strained Si substrate becomes large, the optimum range is spread. The lattice constant of the strain Si with strain of plus 1% is 5.484 angstroms, and is expressed by the contour line S3. Moreover, 5.56 angstroms of lattice constants adjusted to this lattice constant is expressed by the contour line S4.

Therefore, the region which suits to the strained Si of plus 1% is Region A and Region B in FIG. 26. This shows that the substance of the very large range functions as a gate insulating film to strained Si. For example, if it is $Ca_2$ $(Ti_{0.4}, Zr_{0.6})O_4$, the very ideal thin film whose barrier for electrons is about 1.8 eV, lattice constant is 5.526 angstroms, and permittivity is about 30 can be created.

Figure 27:
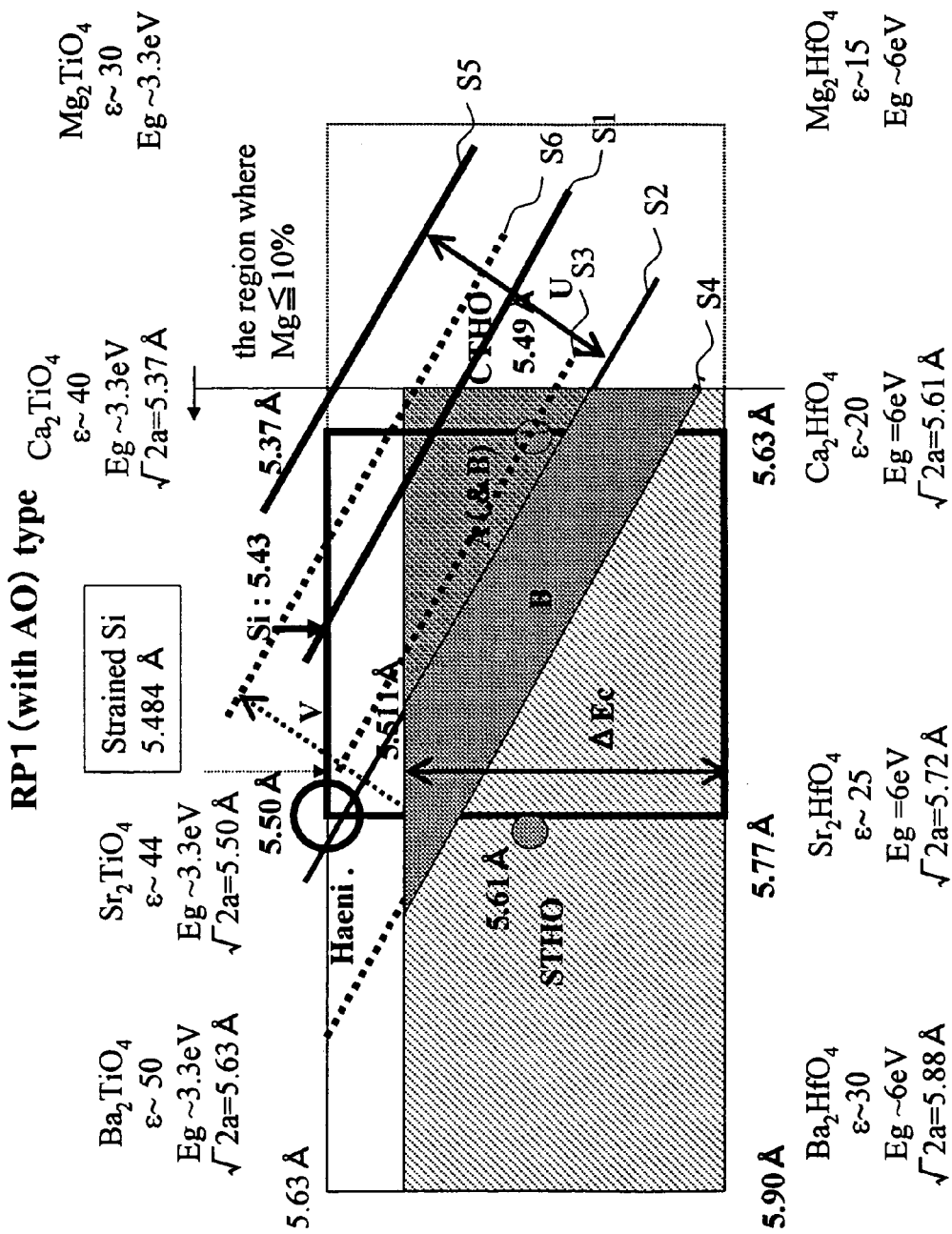
FIG. 27 is a graphical representation showing relations of the lattice constant, the permittivity, and the band gap to the composition in RP type material when adopting Hf as B site instead of Zr of FIG. 26.

FIG. 27 is a graphical representation which summarized the lattice constant, the permittivity, and the band gap when adopting Hf as B site instead of Zr of FIG. 26. Also in this figure, the contour lines S1-S6 of the same lattice constant as FIG. 23 were expressed.

When Zr is compared with Hf, the lattice constant at the time of using Hf is smaller than that of Zr about 0.6%. That is, when Hf is used compared with the case of only Zr, an optimum region shifts somewhat, but there is no essential change. That is, Region A suits as a gate insulating film to the Si, and Region A and Region B suit to the strain Si of plus 1%.

Moreover, only since an optimum region will only shift somewhat if the case where Zr is used is compared with the case where Hf is used, as an atom of B site, explanation when Hf replaces is omitted in the following explanation.

Figure 28:
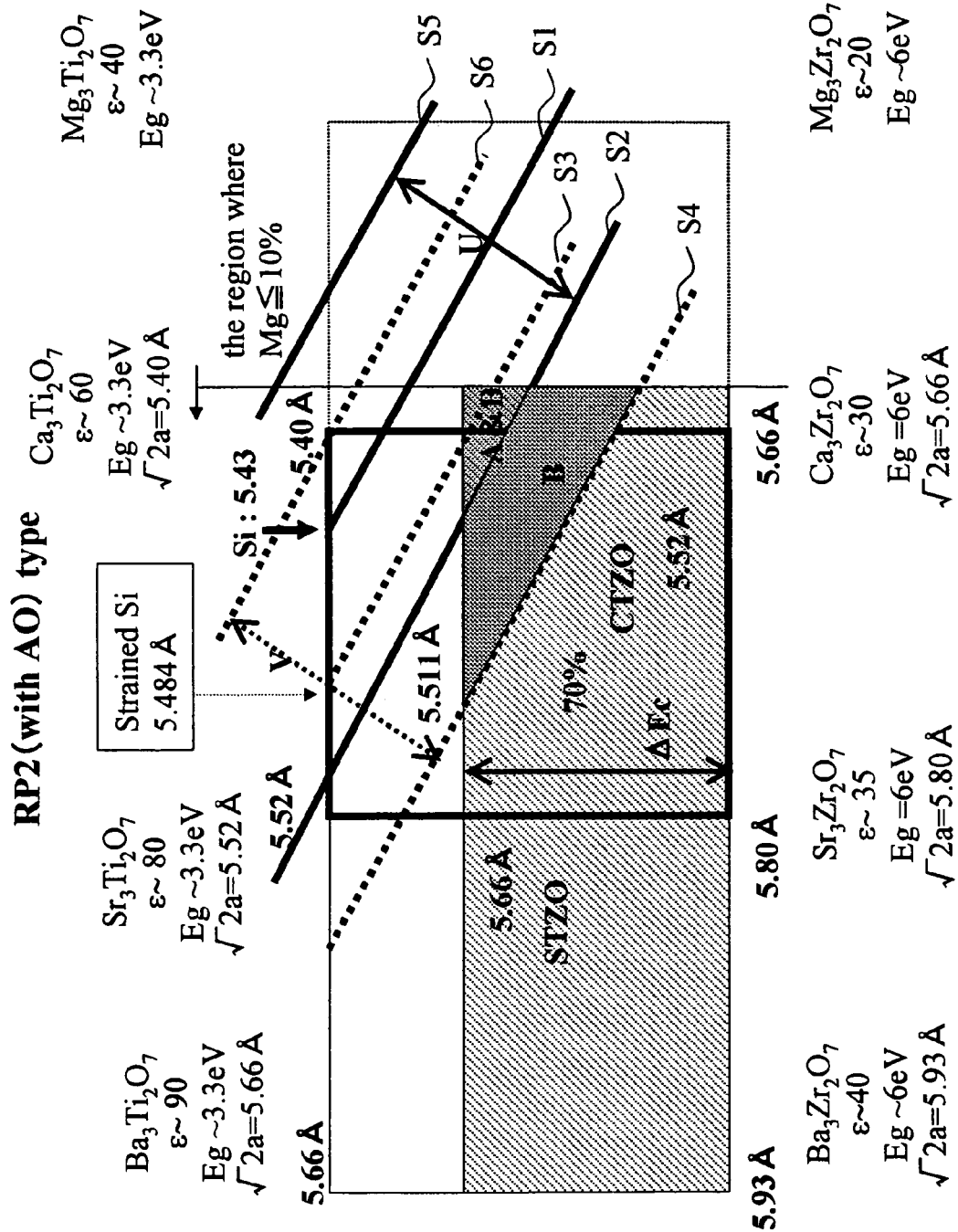
FIG. 28 is a graphical representation showing relations of the lattice constant, the permittivity, and the band gap to the composition in RP type material in the case where it is referred to as n=2 in the material whose thickness of a perovskite is increased i.e., RPn, (An+1BnO$_3$n+1)
Figure 29:
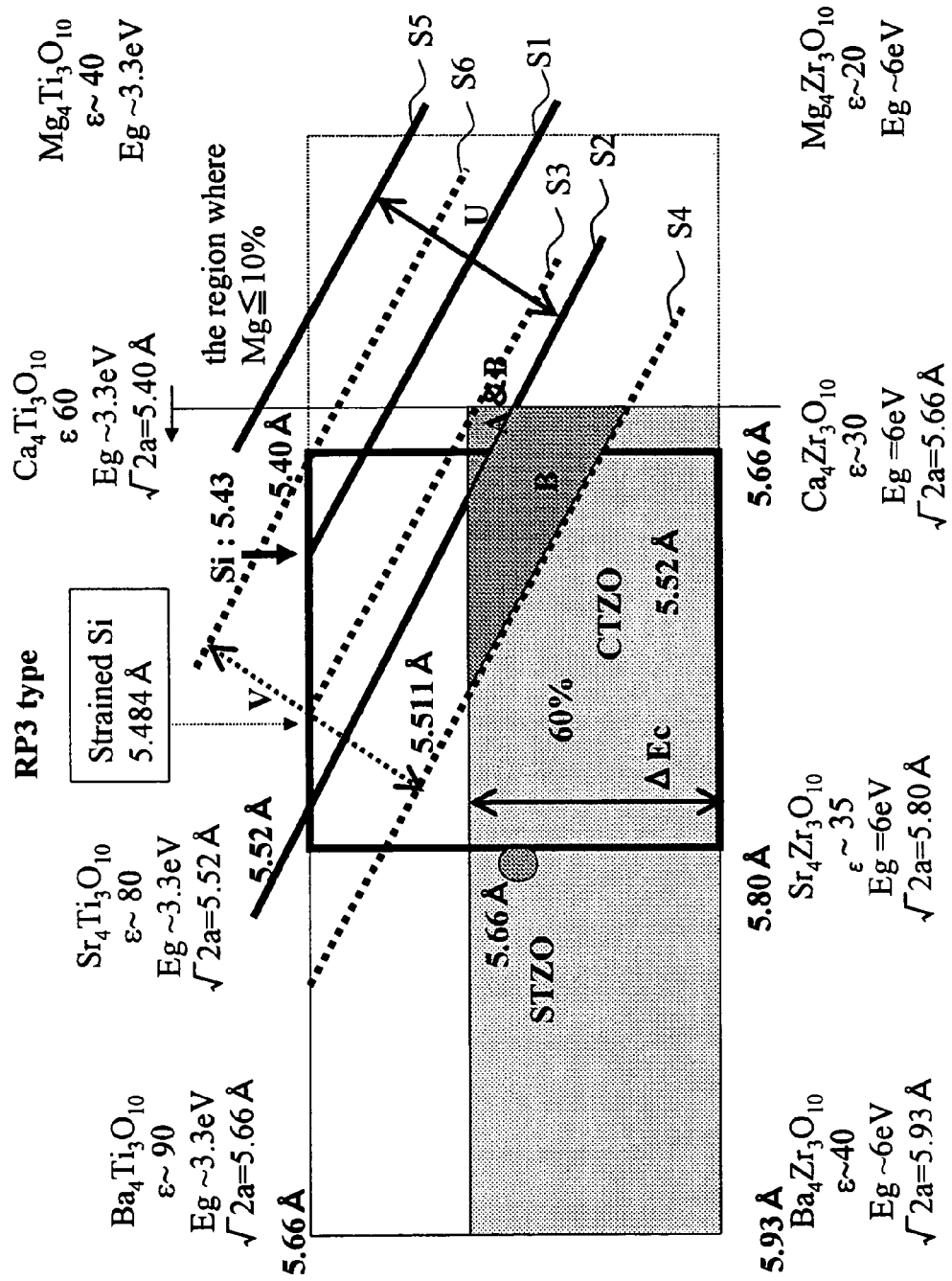
FIG. 29 is a graphical representation showing relations of the lattice constant, the permittivity, and the band gap to the composition in RP type material in the case where it is referred to as n=3 in the material whose thickness of a perovskite is increased i.e., RPn, (An+1BnO$_3$n+1)
Figure 30:
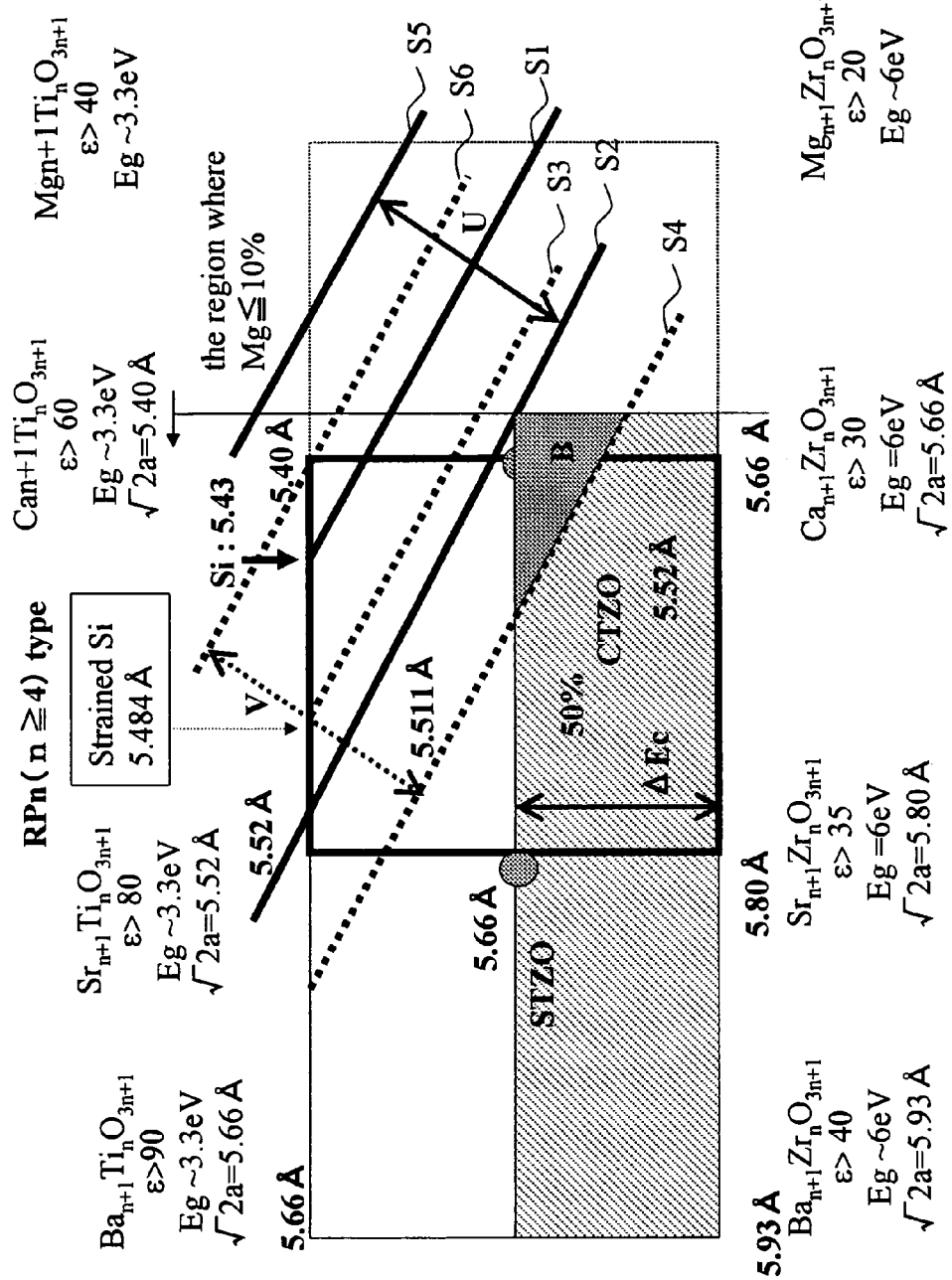
FIG. 30 is a graphical representation showing relations of the lattice constant, the permittivity, and the band gap to the composition in RP type material in the case where it is referred to as n≧4 in the material whose thickness of a perovskite is increased i.e., RPn, (An+1BnO$_3$n+1)

Next, in the substance in which the thickness of a perovskite structure region is increased, i.e., RPn, (An+ $1BnO_3n+1$), the case where it is referred to as n=2, n=3, and n$\geq$4 is summarized into FIG. 28, FIG. 29, and FIG. 30, respectively. Moreover, also in these graph, the contour lines S1-S6 of a lattice constant were expressed.

In any case, permittivity epsilon is large enough, but in order to keep a barrier for electrons (1 eV or more), it is needed that a ratio of (Zr+Hf) of B site are 30% or more, 40% or more, and 50% or more, respectively.

And the first-principles calculation and an experiment show that a lattice constant is in agreement with the lattice constant at the time of a perovskite structure in n$\geq$2.

To a Si substrate, at the time of n$\geq$4, above shows that the region which fulfills "indispensable 3 conditions as an insulating film" does not exist, when it is made to grow epitaxially on Si substrate as expressed in FIG. 30. n=at the time of 2 and 3, the optimal small region A exists as expressed in FIG. 28 and FIG. 29.

On the other hand, on a strained Si substrate (in plus 1% of the case), since the conformity range shifts greatly, an optimum region (region B) appears also when it is n$\geq$4 (FIG. 30). In this case, since it became RP type, the energy of the part which goes up from the bottom of a conduction band is zero mostly, and the bottom of a conduction band will correspond to a barrier for electrons as it is. Since a barrier for electrons will exceed 1.0 eV if the quantity of (Zr+Hf) is more than half of the amount of B sites, a barrier for electrons is kept by it. Since it is in agreement when a lattice constant is a perovskite structure, it becomes being the same as that of FIG. 23, and becomes an optimum region in considerable, then n$\geq$4 which time expressed to FIG. 30 to the region B of FIG. 23.

Moreover, when n is larger than 4, it basically converges in the case of a perovskite structure (FIG. 23). Because the ultimate RP structure where n becomes large infinitely, is a perovskite structure.

On the other hand, in n=2, a barrier for electrons (1 eV or more) is acquired in about 70% of lower range in the graph of FIG. 28. Therefore, in the strained Si of plus 1%, the portion of the region B of this FIG. will call it the optimum region which spread further from the optimum region A in Si substrate.

Moreover, in n=3, about 60% of lower range turns into a range from which a barrier for electrons (1 ev or more) is acquired in the graph of FIG. 29. Therefore, in the strained Si of plus 1%, the region of the region B of this FIG. will call it the optimum region which spread further from the optimum region A in Si substrate.

Figure 31:
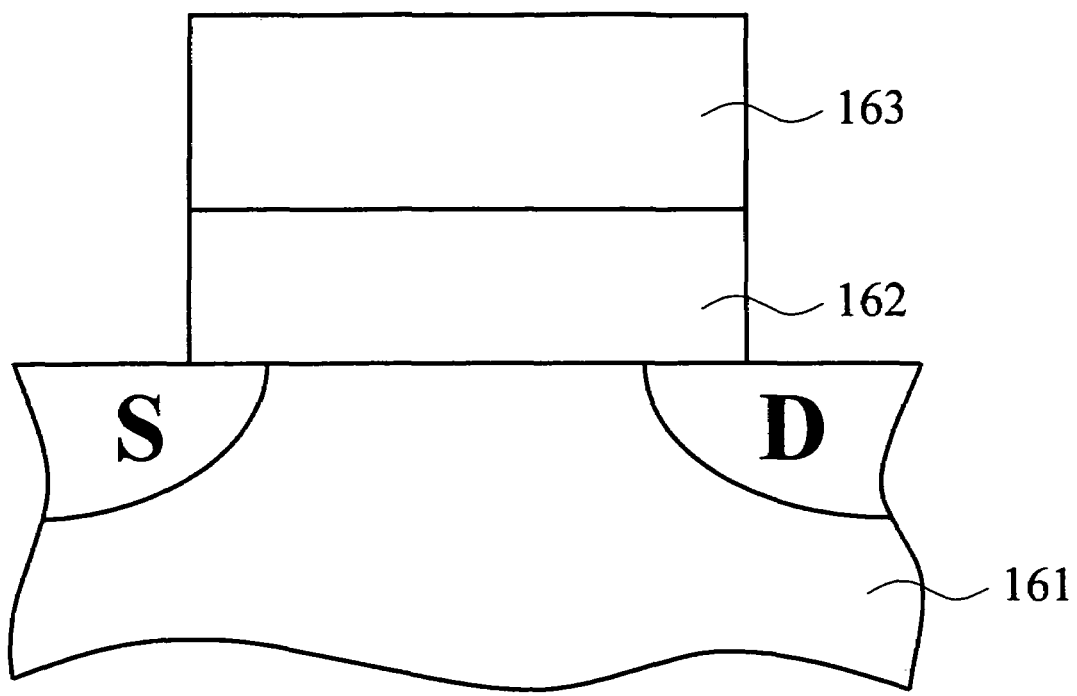
FIG. 31 is a schematic diagram showing MOSFET which uses the RP type insulating film.

FIG. 31 is a schematic diagram showing MOSFET which uses the RP type insulating film. That is, the source region S and the drain region D are formed on the surface of a silicon substrate or a strained Si substrate 161. And the RP type insulating film 162 mentioned above is provided on the channel region between the source region and the drain region, and the gate electrode 163 is provided on it. MOSFET of low power consumption is realizable at high speed by using appropriately the material of the range of Region A or Region B expressed to FIG. 26 through FIG. 30 as a material of the gate insulating film 162.

Figure 32:
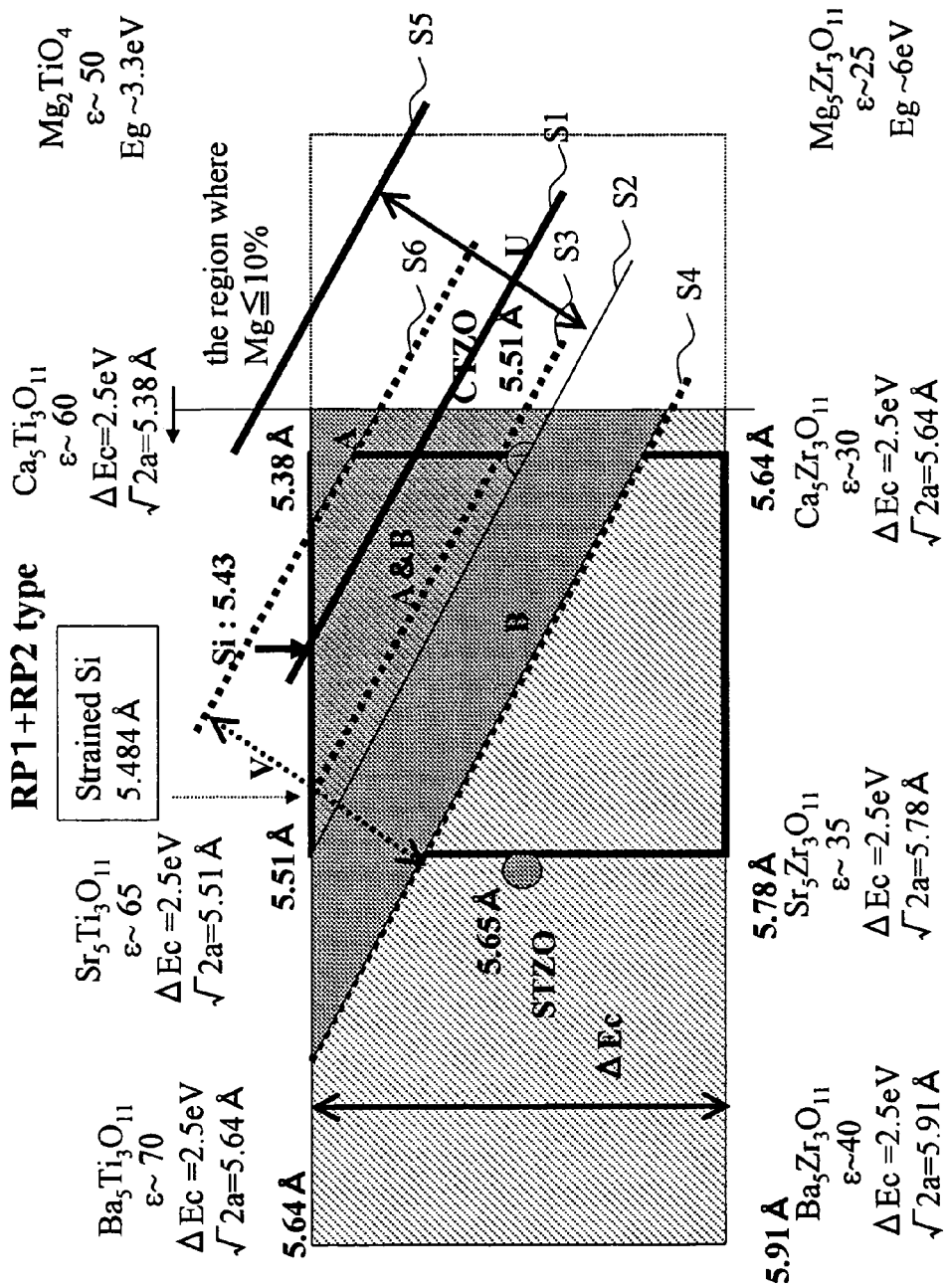
FIG. 32 is a graphical representation which summarizes for a gate insulating film on a Si substrate or on a strained Si substrate surface grown epitaxially, and having the laminated structure (Ruddlesden-Popper type) of the perovskite type substance ABO$_3$ and the layer of a sodium chloride structure AO, where RP1 type and RP2 type are laminated by turns.
Figure 33:
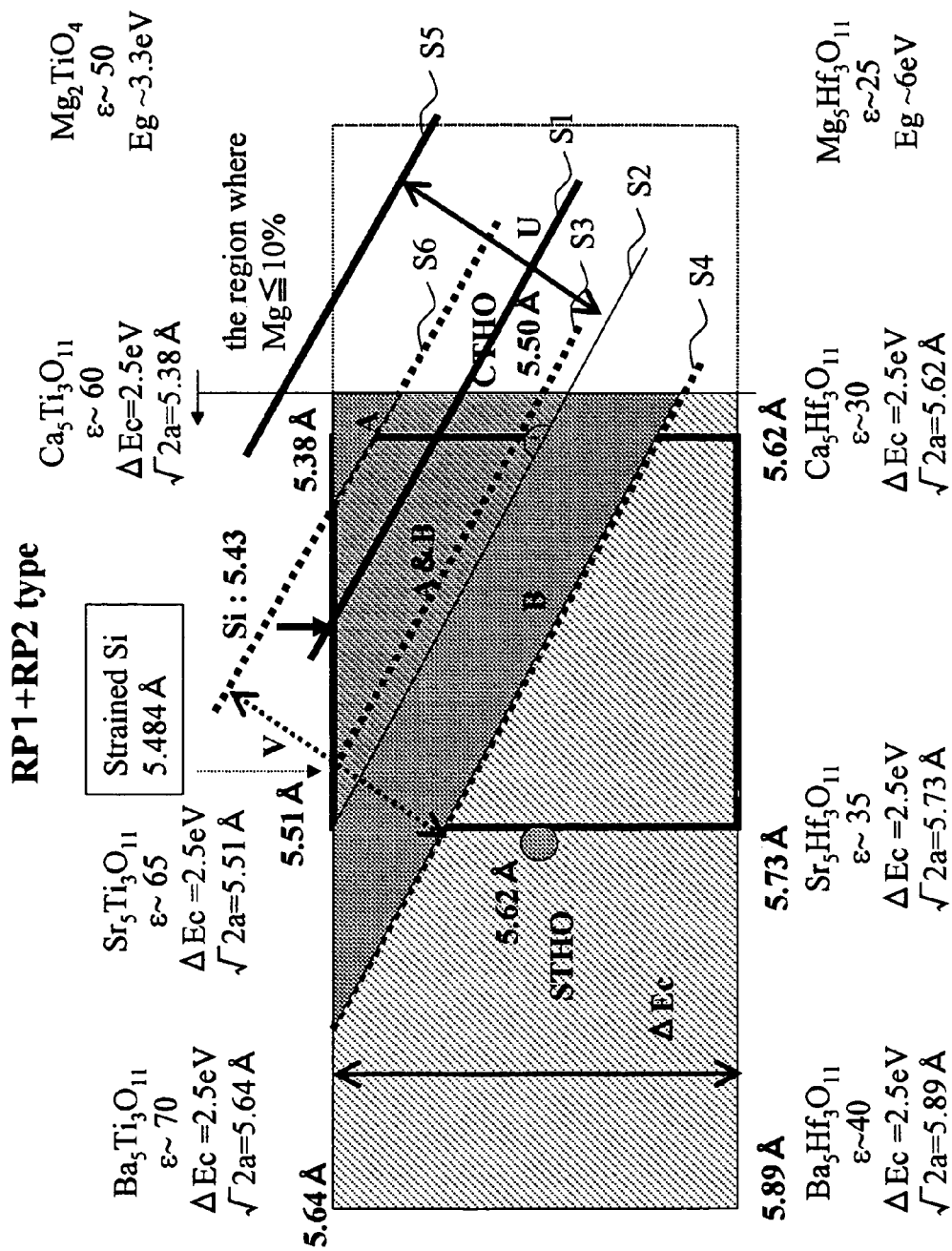
FIG. 33 is a graphical representation showing relations of the lattice constant, the permittivity, and the barrier for electrons to the composition in RP type material when adopting Hf as B site instead of Zr.

Next, referring to FIGS. 32 and 33, it is the gate insulating film which grew epitaxially on Si substrate or the strained Si substrate, and it is "the lamination structure (Ruddlesden- Popper type) of the rocksalt AO structure and the perovskite ABO$_3$ structure", and insulating film RP1 and RP2 laminated by turns is explained.

Moreover, also in these graph, the contour lines S1-S6 of lattice constants were expressed.

Here, since the energy levels of the next doors in a well differ, an interaction is completely lost between the next wells, a band state disappears, and a discrete level appears. For this reason, the quantum well insulating film using a discrete quantization level can be created, and the insulating film which has a very high barrier for electrons in all the regions expressed with the slash in FIG. 32 is obtained.

Moreover, since permittivity epsilon becomes higher than the case of RP1 by mixing RP2, it is kept 20 or more in whole region. Therefore, it can optimize only according to the conditions of a lattice constant, and Region A turns into an optimum region to the Si. However, the region which has overlapped with Region B is described as "A&B" here.

$Ca_5(Ti_{0.5},Zr_{0.5})_3O_{11}$ i.e., the substance which laminated $Ca_2(Ti_{0.5},Zr_{0.5})O_4$ and $Ca_3(Ti_{0.5},Zr_{0.5})_2O_7$ by turns is one of the substances of an optimum.

Since the optimal lattice constant becomes large when the epitaxial growth on an about plus 1% strained Si substrate is considered, the optimal region will shift from Region A. The lattice constant of the strained Si with strain of plus 1% is 5.484 angstroms as expressed with the contour line S3. In this case, it suits to the range of a contour line S4. The region which matches this lattice constant is the region B of FIG. 32, and the region which has overlapped with Region A is described as A&B. It turns out that the substance of a very large region functions as a gate insulating film to strained Si.

If $Ca_5(Ti_{0.4},Zr_{0.6})_3O_{11}$ are used, the very ideal thin film whose barrier for electrons is about 2.5 eV, whose lattice constant is 5.536 angstroms and whose permittivity is about 40 can be created.

FIG. 33 is a summary of the lattice constant, the permittivity, the barrier for electrons, etc. in the case of Hf is used for B site instead of Zr. When Zr is compared with Hf, the lattice constant at the time of using Hf is smaller than that of Zr about 0.6%. That is, when Hf is used compared with the case of only Zr, an optimum region shifts somewhat, but there is no essential change.

Figure 34:
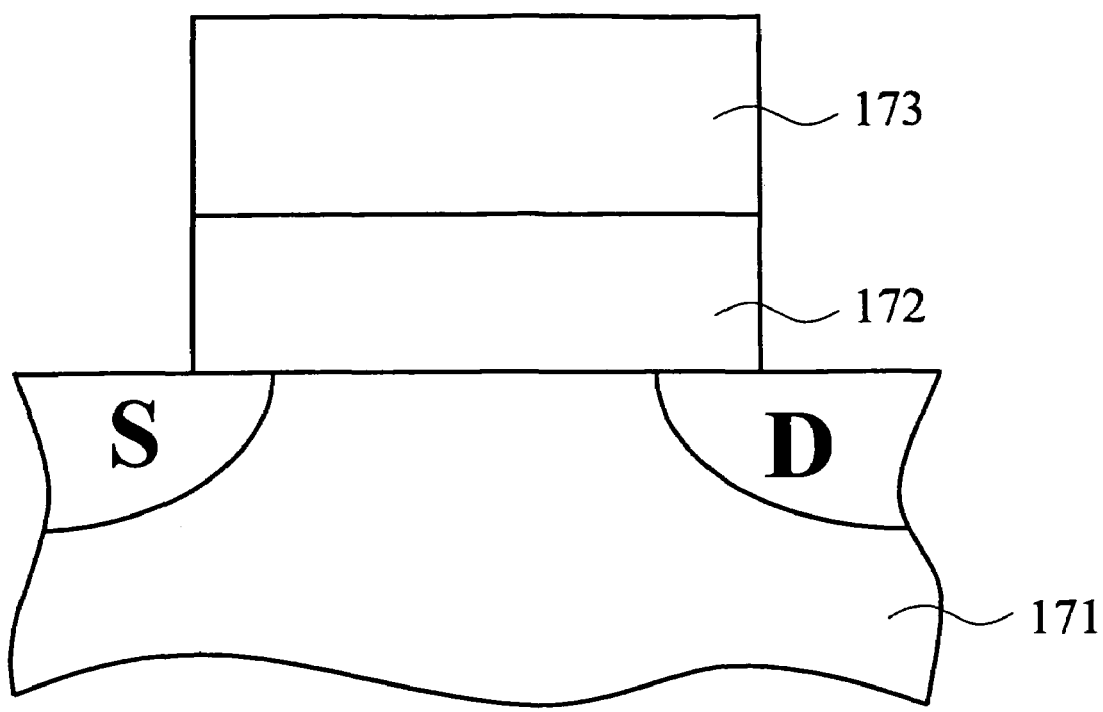
FIG. 34 is a schematic diagram showing MOSFET using the insulating film expressed in FIGS. 32 and 33.

FIG. 34 is a schematic diagram showing MOSFET using the insulating film expressed in FIGS. 32 and 33.

That is, the source region S and the drain region D are formed in the surface of a silicon substrate or a strained Si substrate 171. And the RP type insulating film 172 mentioned above is provided on the channel region between the source region and a drain region, and the gate electrode 173 is provided on it. MOSFET of high speed and low power consumption is realizable by using appropriately the material of the range of Region A or Region B expressed in FIG. 32 or 33 as a material of the gate insulating film 172.

Figure 35:
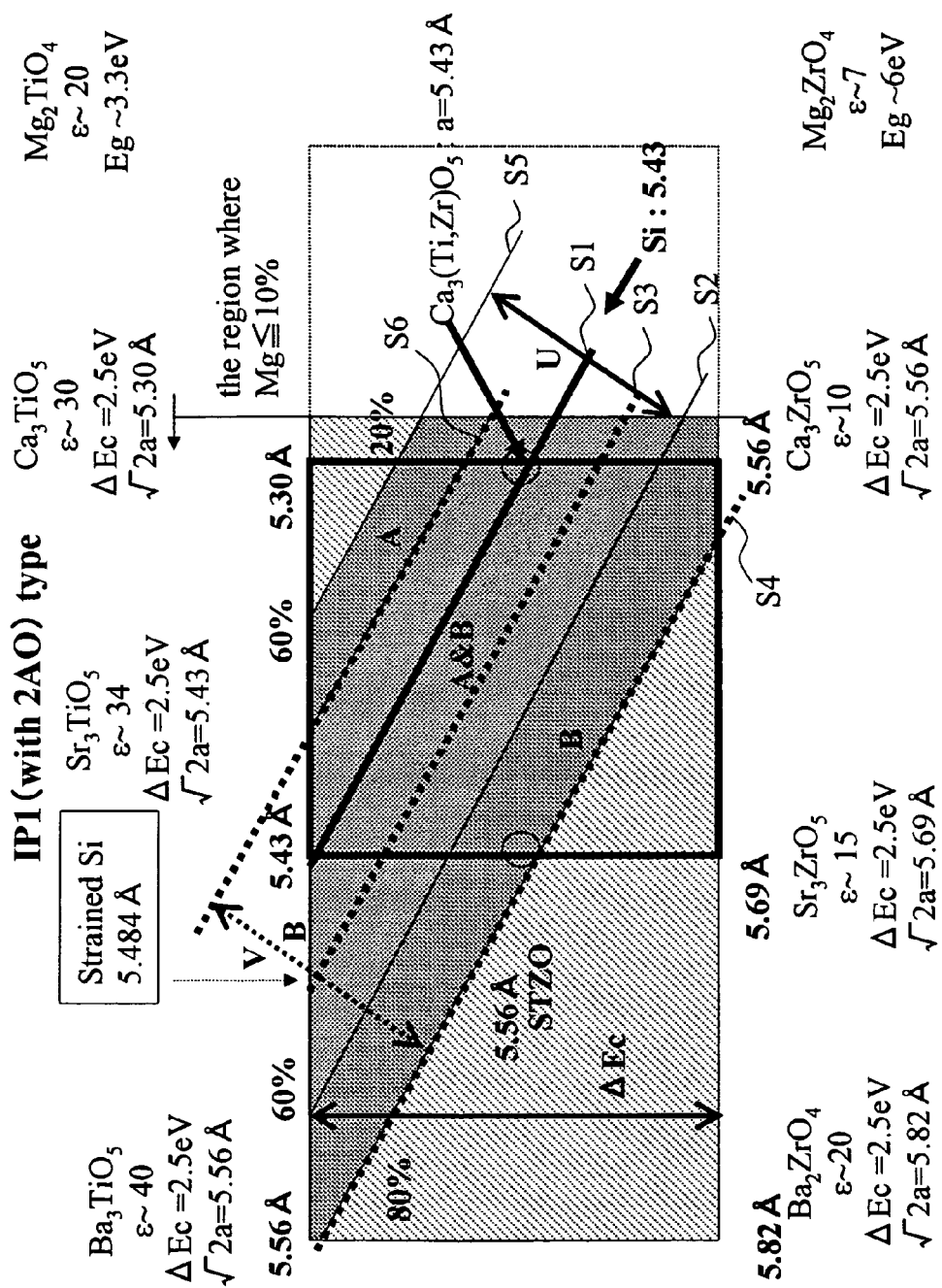
FIG. 35 is a graphical representation showing the gate insulating film grown epitaxially on a Si substrate or on a strained Si substrate, and having a structure where a layer of a perovskite type structure ABO$_3$ and two-layers of a sodium chloride structure AO are laminated.
Figure 36:
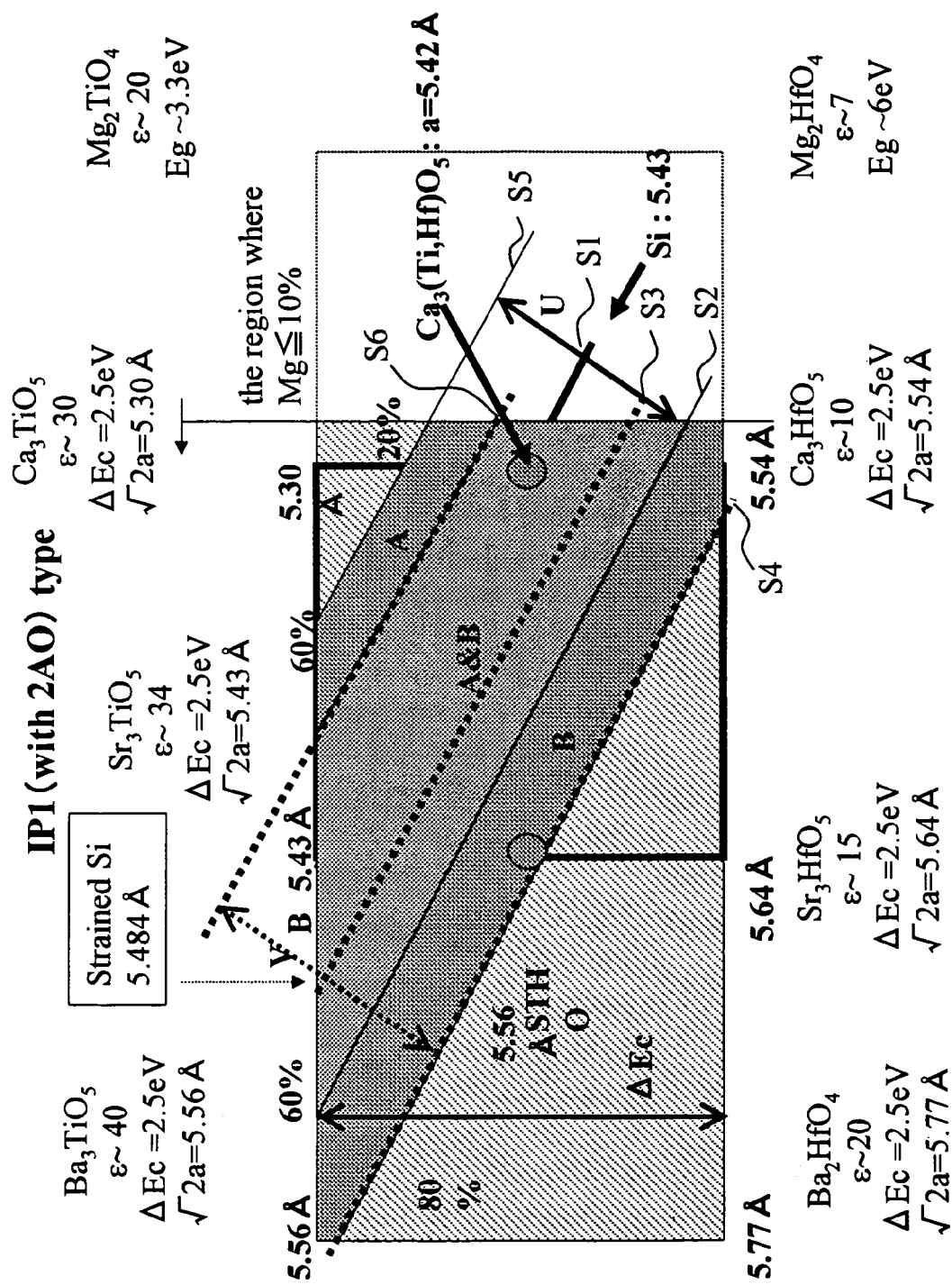
FIG. 36 is a summary of the lattice constant, the permittivity and the barrier for electrons, etc when Hf is used for B site instead of Zr.

Next, referring to FIGS. 35 and 36, it is the gate insulating film grown epitaxially on Si substrate or the strained Si substrate, and the insulating film of "the structure where the perovskite type substance ABO$_3$ and the two-layer nature AO layer of a rocksalt structure were made to laminate" is explained. Moreover, also in these graph, the contour lines S1-S6 of a lattice constant were expressed.

In this lamination structure, a discrete level appears and the quantum well insulating film using a quantization level can be created. As the result, the insulating film which had a very high barrier for electrons is expected in all the regions expressed with the slash in FIG. 35. Since the energy state has leveled, it is as having already explained that the point that penetration probability becomes very small is important.

Furthermore, when two layers of AO layers are inserted, the B-O axis of the direction of thickness of ABO$_3$ will be in agreement. If this axis is in agreement, the dielectric characteristic will improve and the big permittivity epsilon will be obtained. For this reason, permittivity amounts to ten or more in all the regions of graph. In this structure, since the phase of ABO$_3$ is in agreement, this structure will be called an In-Phase (IP) type. Moreover, according to the number n of layers of the perovskite type substance ABO$_3$, it will express "IPn."

That is, this example can be expressed as "IP1 structure." According to the matching condition of a lattice constant, the region A between contour lines S2 and S5 turns into an optimum region to Si. However, the region which has overlapped with the region B which matches strained Si was expressed as "A&B."

In the case of $Sr_3TiO_5$ or $Ca_3(Ti_{0.5},Zr_{0.5})O_5$, the lattice constant of the insulating film coincides with the lattice spacing of Si substrate. Therefore, these materials are most suitable for epitaxial growth. Then, the permittivity epsilon is 34 and 20 respectively and is large enough, and can be called one of the optimal substances as a gate insulating film.

On the other hand, in the epitaxial growth on an about plus 1% strained Si substrate, since the optimal lattice constant becomes large, the optimal region shifts from Region A. The lattice constant of strained Si with strain of plus 1% is 5.484 angstroms, and is expressed by the contour line S3. The range which matches the lattice constant is between contour lines S4 and S6, and serves as Region B. Here, the region which overlapped with Region A was expressed as A&B. It turns out that the substance of a very large region functions as a gate insulating film to strained Si. For example, in $Ba_3TiO_5$ or $(Ba_{0.4},Sr_{0.6})_3 TiO_5$ the barriers for electrons are both about 2.5 eV, the lattice constants are 5.56 and 5.48 angstroms respectively, and the permittivity epsilons are both about 40, and a very ideal gate insulating film can be created.

FIG. 36 is a summary of the lattice constant, the permittivity and the barrier for electrons, etc when Hf is used for B site instead of Zr. When Zr is compared with Hf, the lattice constant at the time of using Hf is smaller than that of Zr about 0.6%. That is, when Hf is used compared with the case of only Zr, an optimum region shifts somewhat, but there is no essential change. That is, when Hf is used compared with the case of only Zr, an optimum region shifts somewhat, but there is no essential change.

It is necessary to note that the barrier for electrons is low when voltage is not applied to an insulating film in an IP1 type gate insulating film. If voltage is added, the energy level in the well of next doors will shift, and a big barrier for electrons will be formed. On the other hand, the energy level of the well of next doors can also be designed to a different value when voltage is not applied. For example, what is necessary is just to combine IP1 type and IP2 type. This is the same with having mentioned above about double well structure or triple well structure, referring to FIG. 4 through FIG. 9.

Moreover, the present invention is not limited to IP1 type, but includes IP2 type, IP3 type, etc. In this case, if compared with IP1 type, a permittivity epsilon will raise more and a lattice constant will become larger than IP1 type. (It is mostly in agreement with the lattice constant of a perovskite structure.) About a barrier for electrons, with IP2 type or IP3 type, since an energy level changes a lot in the well of next doors when thickness is thin, it is easy to use.

Figure 37:
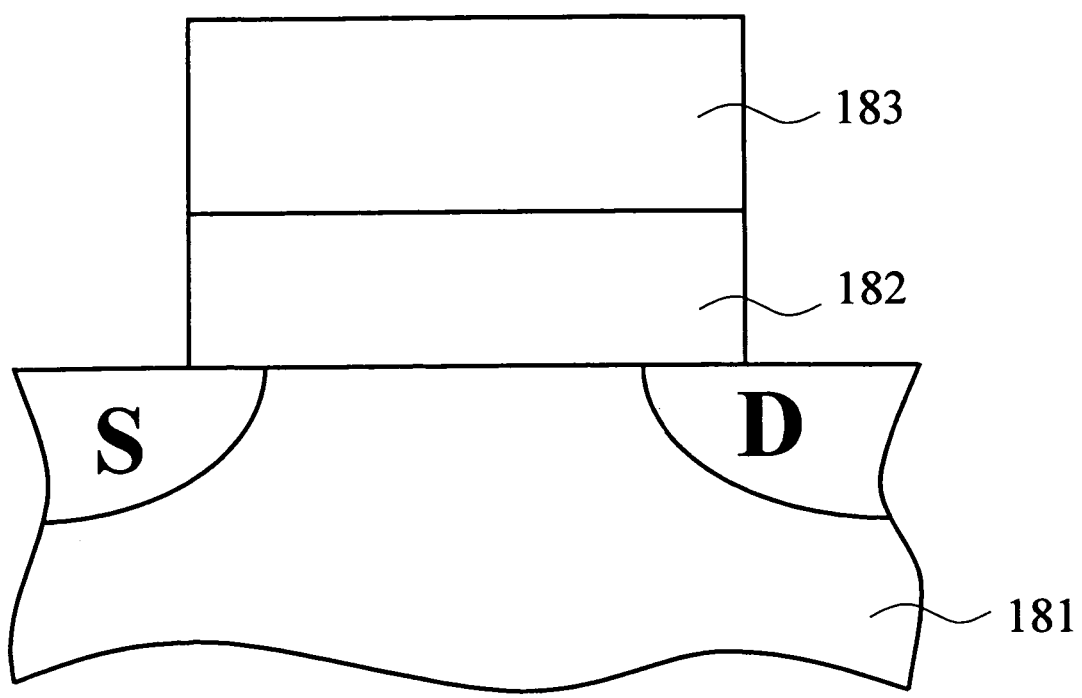
FIG. 37 is a schematic diagram showing MOSFET using the insulating film expressed in FIGS. 35 and 36.

FIG. 37 is a schematic diagram showing MOSFET using the insulating film expressed in FIGS. 35 and 36. That is, the source region S and the drain region D are formed in the surface of a silicon substrate or a strained Si substrate 181. And the IPn type insulating film 182 mentioned above is provided on the channel region between the source region and a drain region, and the gate electrode 183 is provided on it. MOSFET of high speed and low power consumption is realizable by using appropriately the material of the range of Region A or Region B expressed in FIGS. 35 or 36 as a material of the gate insulating film 182.

Figure 38:
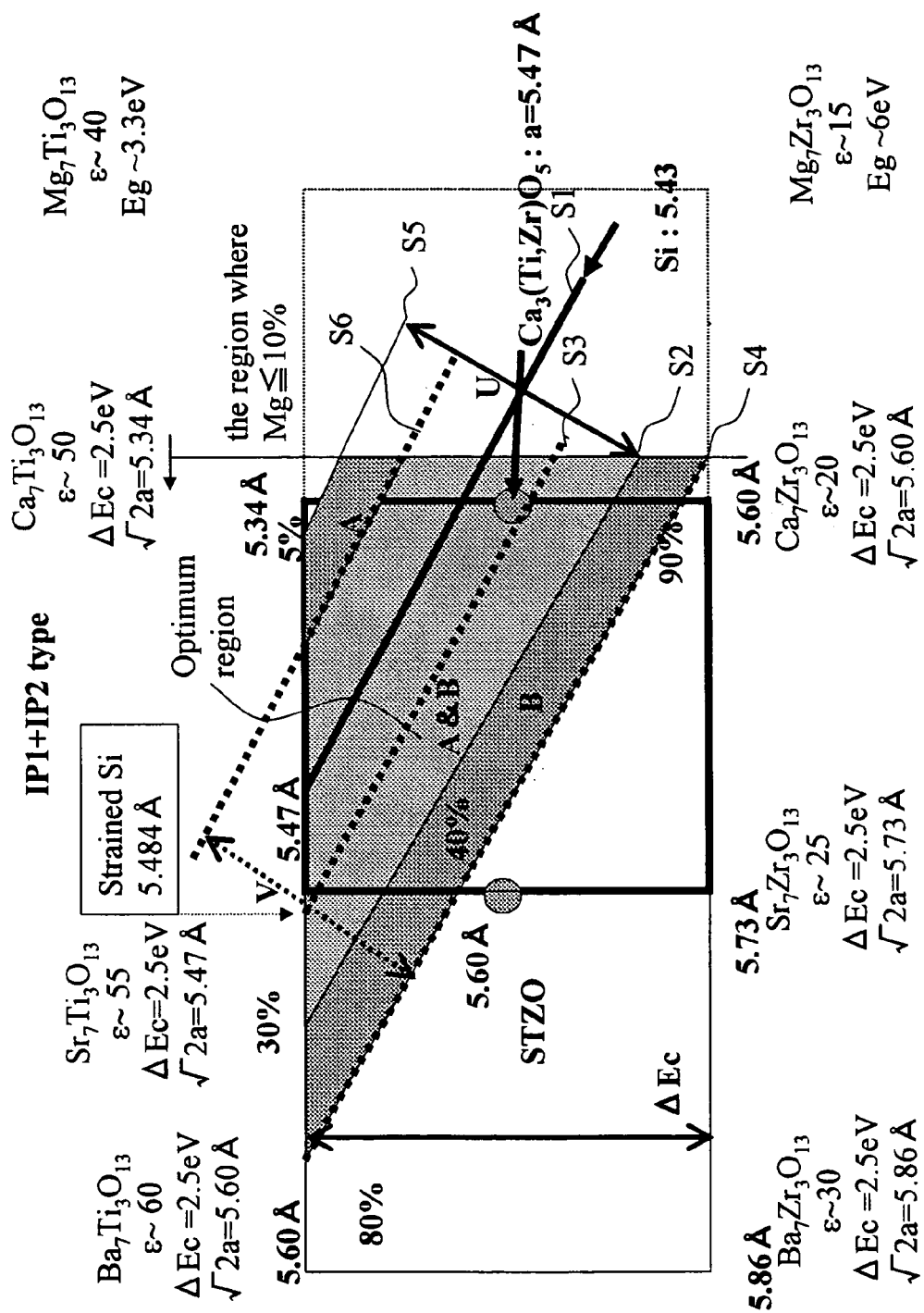
FIG. 38 is a graphical representation showing the gate insulating film grown epitaxially on a Si substrate or on a strained Si substrate, and having a structure where IP1 type and IP2 type are laminated by turns.
Figure 39:
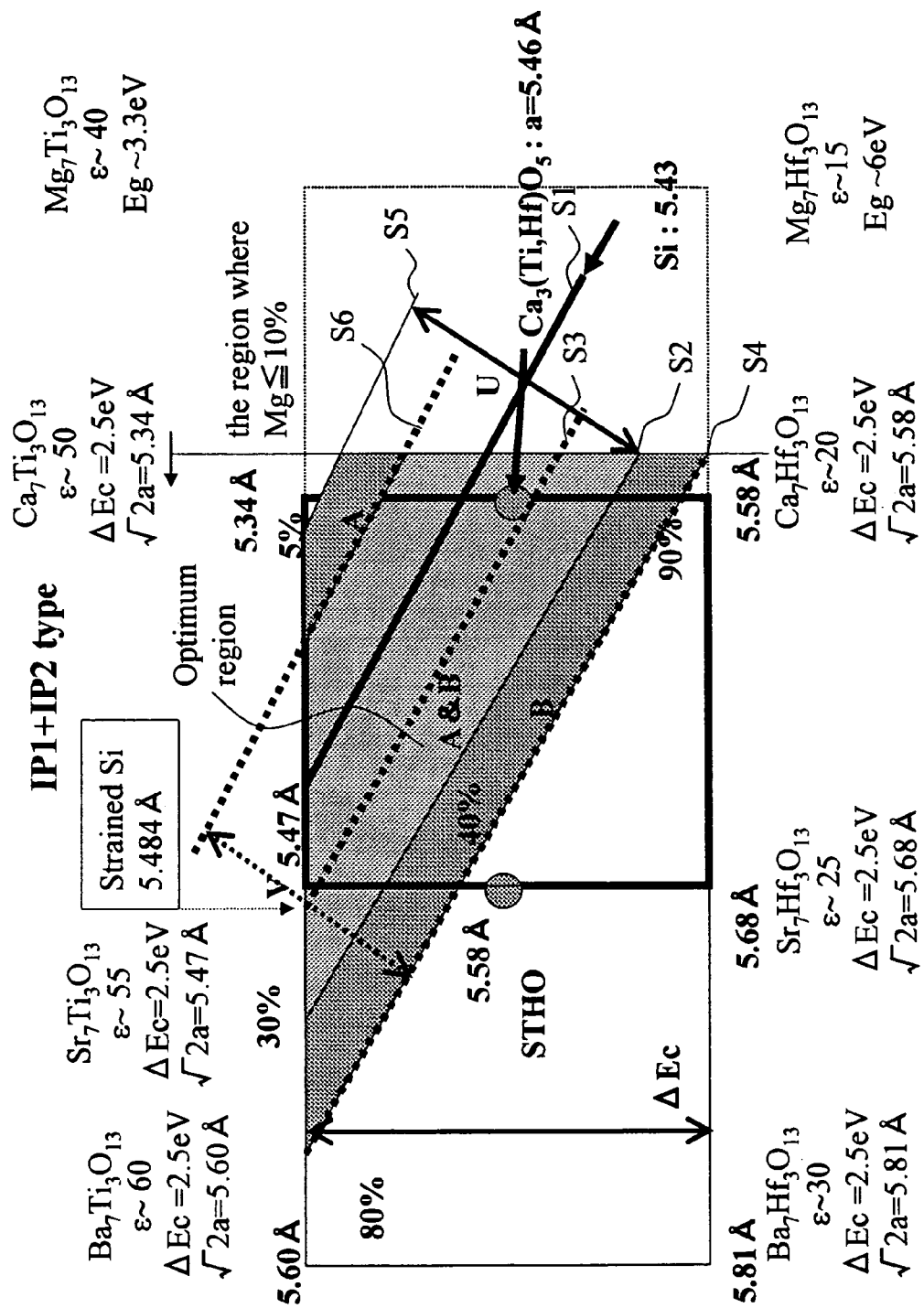
FIG. 39 is a graphical representation showing relations of the lattice constant, the permittivity, and the barrier for electrons to the composition in RP type material when adopting Hf as B site instead of Zr.

Next, it is the gate insulating film grown epitaxially on Si substrate or the strained Si substrate, and the insulating film which made IP1 type and IP2 type laminate by turns is explained referring to FIGS. 38 and 39.

Also in this case, a discrete level appears and the quantum well insulating film using a quantization level can be created. In all the regions expressed with the slash in FIG. 38, an insulating film with a very high barrier for electrons is obtained. Since the energy state has leveled, penetration probability becomes very small, as already explained. Moreover, permittivity epsilon amounts to 20 or more.

According to the adjustment conditions of a lattice constant, the region A between contour lines S2 and S5 turns into an optimum region to Si.

Here, the region which has overlapped with Region B was expressed as A&B. In the case of $(Ca_{0.25},Sr_{0.75})_7Ti_3O_{13}$, the lattice constant of the insulating film coincides with the lattice spacing of Si substrate. Therefore, these materials are most suitable for epitaxial growth. Then, the permittivity epsilon is 50 and large enough, and can be called one of the optimum substances.

On the other hand, in the epitaxial growth on an about plus 1% strained Si substrate, the optimal region shifts from Region A since the optimal lattice constant becomes large. The lattice constant of strained Si with strain of plus 1% is 5.484 angstroms, and is expressed with a contour line S3. The range which matches the lattice constant is the region B between contour lines S4 and S6. Here, the region which overlapped with Region A was expressed as A&B.

It turns out that the substance of a very large region functions as a gate insulating film to strained Si. For example, if $Sr_7Ti_3O_{13}$ is used, a very ideal thin film whose barrier for electrons is about 2.5 eV, lattice constant is 5.47 angstroms, and permittivity epsilon is about 55 can be created.

FIG. 39 is a summary of the lattice constant, the permittivity, the barrier for electrons, etc. when Hf is used as B site instead of Zr. When Zr is compared with Hf, the lattice constant at the time of using Hf is smaller than that of Zr about 0.6%. That is, when Hf is used compared with the case of only Zr, an optimum region shifts somewhat, but there is no essential change.

It also turned out that a thin film whose leak current is very little and permittivity epsilon is high can be created since the axis of a high dielectric layer (well layer) is assembled in the insulating film of an IPn type or type (IPn+IPm) (n, m integer). There may also be an insulating film of an MIM capacitor as an example of application of this insulating film. Moreover, since there is a big effect also in Ferro electricity when the axis is assembled even if it considers a ferroelectric material thin film instead of a high dielectric, it is possible to create a ferroelectric material thin film MIM capacitor with little leak current.

MIM capacitor structure was created by forming $Ba_3TiO_5$ thin film as a film on $SrRuO_3$ electrode, and actually forming $SrRuO_3$ as a film as an up electrode again. Since the in-plane strain was added in this case, ferroelectric material MIM capacitor whose leak current is very small with big polarization has been created.

Moreover, as a suitable capacitor for FeRAM (ferroelectric RAM), $Pb(Zr, Ti)O_3$ is famous. In the case, it is impossible to make PbO a barrier. It is because a barrier for electrons cannot be raised even if some PbO is put in since the orbital energy is lower than Ti. However, it is possible to put in (Ca, Sr, Ba)O instead of PbO. If it devises so that a barrier for electrons may go up and the axis of a dielectric layer may be assembled by this insertion, it is possible to create an MIM capacitor with big polarization and low leak current.

In the above, the optimum range of the insulating film using a layered perovskite substance was explained.

As a result of having given some examples, the following things can say as a conclusion. As a result of giving some examples, it is important to make the level in a well discrete, devising of "making the well of next doors not to be the same energy level", "thickening a barrier layer", etc. And when the above-mentioned device cannot be carried out, the range of the material which can be used can be partly extended by using Zr and Hf as a B site material. In a perovskite type and RP type, it is desirable to attain optimization with devising B site.

Of course, the example shown here is a mere example and can consider various film structures. All the film structures laminated while changing variously the thickness of a barrier layer and the thickness of a well layer which are considered variously are included by the range of the invention.

Moreover, in the above explanation, following three were mentioned as conditions at the time of forming an insulating film. (1) Make mismatch (difference) of lattice constant into less than Plus-or-Minus 1.5% to substrate. (2) Barrier is high. (3) Permittivity is Large. Furthermore, you may also insert an insulating buffer layer between this insulating film and substrate. In this case, especially an important point is a point that a buffer layer does not necessarily need to fulfill the conditions of (2) which is most difficult to be filled. It is because a role assignment can be carried out as the insulating film laminated on a buffer layer bears the conditions of (2) and a buffer layer is made to bear the conditions of the improvement in the interface characteristic, i.e., (1), after fulfilling the conditions of (3) (high permittivity) as a whole as much as possible.

Such structure can be made just because the region of an insulating film has the composition and structure of this example. This buffer layer is very effective when the interface characteristic wants to be improved.

If what has high permittivity is used as a buffer when voltage is added, since the potential drop in a buffer layer portion is suppressed more smallish, it can create the first layer thickly rather than the time only of a barrier layer (namely, when there is no buffer layer). As a result, the effect that the surface of the first layer can be made flatter is acquired.

If a barrier layer is thickened, since permittivity will become small, and it becomes impossible to use as a gate insulating film in the case where there is no buffer layer and a barrier layer with low permittivity is directly grown up on a substrate to it. But if a barrier layer is made thin too much, it will become very difficult to make a flat and uniform film, and leak current will get worse.

For example, the $CeO_2$ thin-film direct junction which grows epitaxially good on Si (111) side can be left on Si (111) substrate by starting with the buffer layer $CeO_2$ (111), when creating quantum well structure $SrO/CeO_2/SrO/CeO_2/$ SrO. Since the difference of the lattice constant of Si substrate and $CeO_2$ is not filled to 1%, it is thought that a very good interface is formed. Therefore, the structure which has $CeO_2$ in right above Si is effective.

It may begin to laminate from SrO, or may begin to laminate from $CeO_2$, or whichever is sufficient. It is an advantage that the material which can grow epitaxially with better interface quality can be chosen. Since the quantum well insulating film on it will bear the height of a barrier if it is a substance with high permittivity, it is that choosing only in the interface characteristic is possible.

Here, there is a tendency for the barrier of materials with high permittivity to be low. As a material of the above-mentioned buffer layer, all the high dielectric thin film material, whose permittivity is high, and whose lattice constant is well in agreement in the lattice constant of a silicon substrate (or strained Si substrate), but whose barrier height for electrons is not high, will be considered as a candidate. As the example of representation, $CeO_2$, YSZ ($Y_2O_3+ZrO_2$), (Ba, Sr, Ca)O, $SrTiO_3$, $Ca(Ti, Zr)O_3$, (Ba, Sr, Ca)$F_2$, etc. can be mentioned.

EXAMPLES

Referring to drawings, some embodiments of the present invention will now be described in more detail. The insulating film of the invention providing single quantum well structure or multi quantum well structure can be manufactured by the sputtering method, the laser ablation method, the chemistry gaseous phase growing-up method (CVD), etc. In the following examples, all of the thin film was grown up by the molecular beam epitaxy (MBE) method.

First, the molecular beam epitaxy equipment used in common will be explained. The vacuum vessel is exhausted by the cryopump. The ultimate vacuum was $10^{-6}$ Pa or less. A substrate holder is provided in a vacuum vessel and a substrate is installed in this substrate holder.

The substrate holder is heated at a heater. Two or more Knudsen cells are provided so that the substrate may be countered, and the cell shutter is provided in the opening of each Knudsen cell. In each Knudsen cell, the metal of each element selected from the group consisting of barium (Ba), Strontium (Sr), calcium (Ca), cerium (Ce), a hafnium (Hf), a zirconium (Zr), titanium (Ti), tantalum (Ta), a ruthenium (Ru), a lantern (La), a yttrium (Y), gadolinium (Gd), niobium (Nb), and vanadium (V) is filled. These metals are the composition metallic elements of the thin films to be formed in the following examples.

Moreover, in order that oxidation reaction required to obtain a thin film may occur, it is set up so that the pure ozone gas evaporated in the liquid ozone storeroom may blow off from a nozzle and may irradiate a substrate. Between a nozzle and a substrate, an ozone shutter is inserted if needed.

FIRST EXAMPLE

First, MOSFET (MOS type field effect transistor) using the insulating film which has the single quantum well structure of $SrO/CeO_2/SrO$ as a first example of the present invention will be explained.

Figure 10:
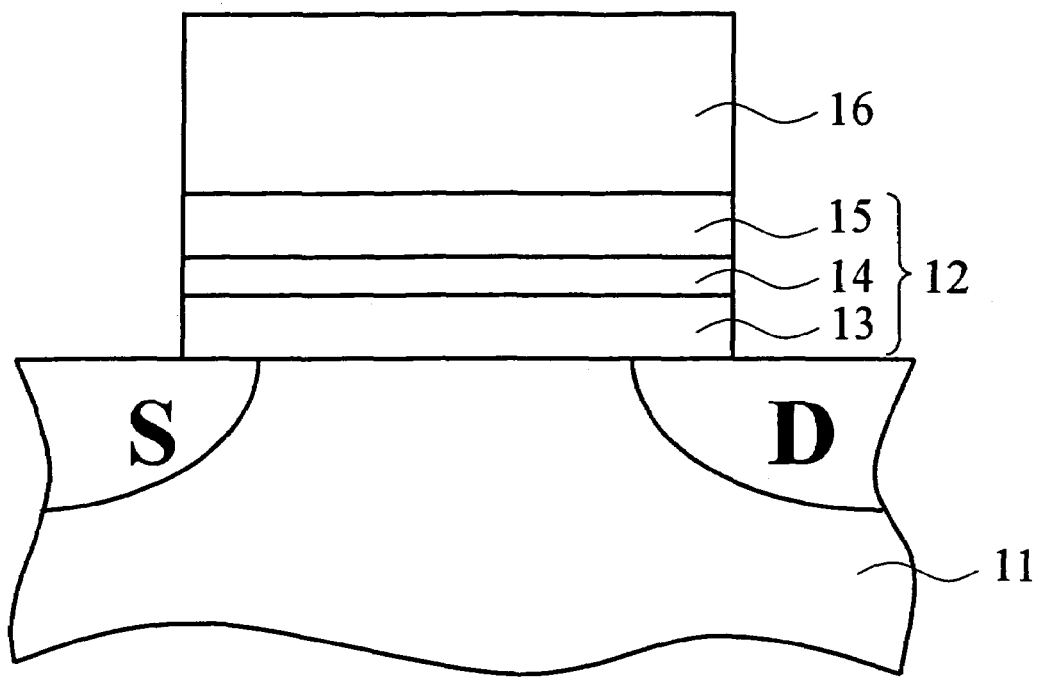
FIG. 10 is a sectional view of the gate insulating-film of MOSFET of the first example of the present invention, and $CeO_2$ is used for the well layer and SrO is used for the barrier layer.

FIG. 10 is a sectional view of the gate insulating-film of MOSFET of the first example of the present invention. That is, in FET of this example, the source region S and the drain region D are formed in the surface of a silicon substrate 11, and the gate electrode 16 is provided through the gate insulating film 12 on the channel region which is formed between them. A gate insulating film has the single quantum well structure where the SrO barrier layer 13, the $CeO_2$ well layer 14, and the SrO barrier layer 15 are laminated.

Hereafter, the manufacture procedure of this insulating film 12 will be explained in detail.

That is, first, the SrO (111) layer 13 was grown epitaxially on the Si substrate 11 whose major surface is (111). The thickness of the SrO layer was made into about 7.5 angstroms. More specifically, first, only strontium (Sr) was grew for ⅓ ML (mono atomic layer: atomic layer) under the environment where ozone was not applied, pressure was $10^{-7}$Pa, and substrate temperature was 850 degrees centigrade. Then, SrO was formed as a film in the ozone flux $1.2 \times 10^{12}$ molecule/second $cm^2$ under the environment where pressure is $10^{-6}$ Pa and substrate temperature is 700 degrees centigrade. ⅓ strontium (Sr) layer of ML manufactured in early stages oxidized in this stage, and changed to the SrO layer.

Moreover, although it is confirmed by the experiment that it is also possible to form a film at about 200-degrees centigrade low temperature, since it is set as 700 degrees centigrade when forming $CeO_2$ as a film, forming a film at 700 degrees centigrade is chosen. If the substance of the portion of $CeO_2$ is able to form as a film at lower temperature or it becomes possible to form $CeO_2$ as a film at lower temperature, a series of insulating-film structures can be created by forming a film at lower temperature.

Next, only 4.7 angstroms of $CeO_2$ (111) layers 14 was formed as a film on the SrO film formed as a film epitaxially. When forming this $CeO_2$ as a film, the pressure was $10^{-6}$ Pa, substrate temperature was 700 degrees centigrade, and ozone flux was $8.8 \times 10^{12}$ molecule/second $cm^2$.

Furthermore, SrO (111) films 15 is grew epitaxially for only 7.5 angstroms, under the environment where pressure is $10^{-6}$ Pa, substrate temperature is 700 degrees centigrade and ozone flux is $1.2 \times 10^{12}$ molecule/second $cm^2$. And the gate electrode 16 was formed by vapor-depositing gold (Au) on it.

Thus, the equivalent oxide thickness (EOT) of the obtained insulating film was a very small value of 6.5 angstroms. Moreover, the leak current when applying the electric field of 5 MV/cm was a very small value of $10^{-4}$ A/$cm^2$.

Incidentally, at the same EOT, the leak current of the gate thin film insulator composed of $CeO_2$ or $SiO_2$ was 1 A/$cm^2$, $10^5$ A/$cm^2$ (extrapolation value), respectively. That is, as for it, the insulating film of these comparative examples turned out that leak current has reached also $10^4$ times and $10^9$ times as compared with this example. Thus, it turned out that the effect of having made quantum well structure in the insulating film is very large.

Furthermore, even if it used (Ba,Sr)O instead of the SrO films 13 and 15, the same effect was attained.

If this mixed crystal is used, a lattice constant can be freely changed in the large range.

Therefore, when making it grow epitaxially, it becomes easier to match the lattice constant of the ground substrate.

In this example, when $(Ba_{0.71},Sr_{0.29})O$ was grown epitaxially on Si substrate, the quality of the film of the barrier layers 13 and 15 improved remarkably. The EOT became 4.3 angstroms when the same single quantum well type gate insulating film as the above, i.e., the quantum well insulating film of the structure of (Ba, Sr)O (9.4A)/CeO$_2$ (4.7A)/(Ba, Sr)O (9.4A), was created by making this thin film into a barrier layer.

This means that the high effect especially therefore produced has the very large permittivity of (Ba, Sr)O compared with it of SrO. The leak current when applying a big electric field of 5 MV/cm was a very small value of $10^{-2}$ A/cm$^2$.

As a comparative example, the leak current of the insulating film which consists only of SiO$_2$ film in the same EOT when 5 MV/cm is applied by extrapolation is $10^6$ A/cm$^2$, and reached $10^8$ times of that of the above-mentioned insulating film. From this, it has checked that the effect of having made quantum well structure was very large.

When (Ba, Sr)O was used, compared with SrO, the interface level density by strain of an interface was able to be reduced single or more figures. The use of this is large at the point which does not remain because it says that it is easy to grow epitaxially on Si, but can control the degree fall of mobility of the transistor by interface defects. By this trial production, the mobility of a transistor showed 25% or more of improvement.

SECOND EXAMPLE

Next, MOSFET using the insulating film which has the single quantum well structure of SrO/SrTiO$_3$ (it may omit following STO)/SrO as a second example of the present invention will be explained.

Figure 11:
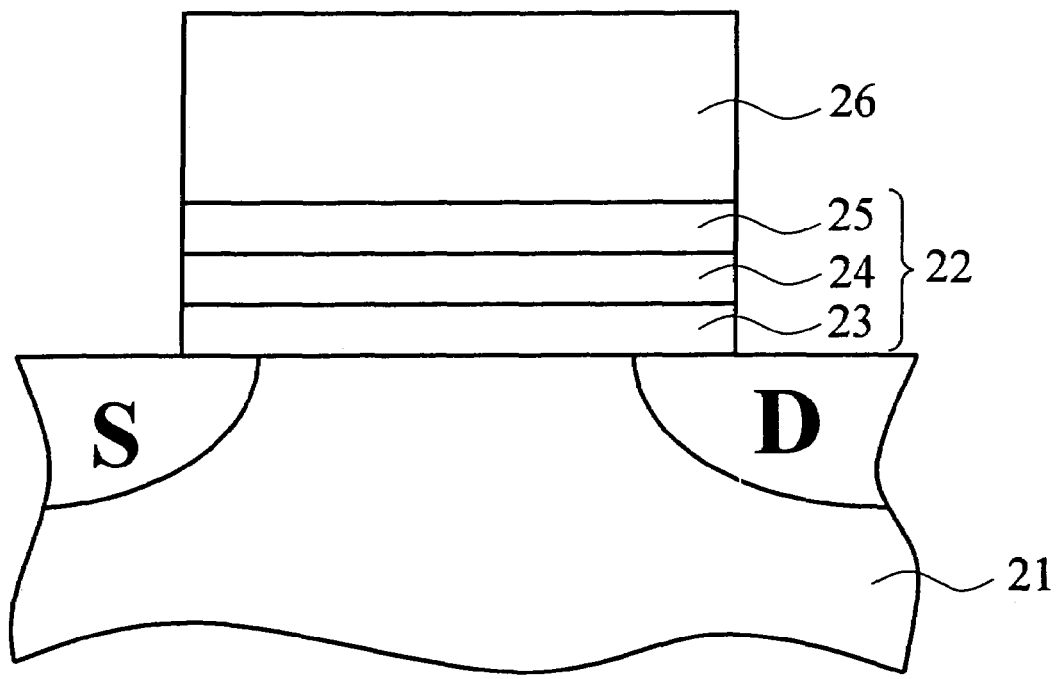
FIG. 11 is a sectional view of the gate insulating film of MOSFET of the second example of the present invention, and $SrTiO_3$ is used for the well layer and SrO is used for the barrier layer.

FIG. 11 is a sectional view of the gate insulating film of MOSFET of the second example of the present invention.

That is, in FET of this example, the source region S and the drain region D are formed in the surface of a silicon substrate 21, and the gate electrode 26 is provided through the gate insulating film 22 on the channel region which is formed between them. A gate insulating film has the single quantum well structure where the SrO barrier layer 23, the STO well layer 24, and the SrO barrier layer 25 were laminated.

This is explained in order of a manufacturing process. That is, first, the SrO (001) layer 23 was grown epitaxially on the Si substrate 21 whose major surface is (001). The thickness of the SrO layer 23 was made into about 5.2 angstroms. More specifically, first, only strontium (Sr) was grew for ¼ ML (mono atomic layer: atomic layer) under the environment where ozone was not applied, pressure was $10^{-7}$ Pa, and substrate temperature was 850 degrees centigrade. Then, SrO was formed as a film in the ozone flux 1.5×10$^{12}$ molecule/second cm$^2$ under the environment where pressure is $10^{-6}$ Pa and substrate temperature is 600 degrees centigrade. ¼ strontium (Sr) layer of ML manufactured in early stages oxidized in this stage, and changed to the SrO layer.

Next, only 3.9 angstroms of SrTiO$_3$ (001) layers 24 was epitaxially formed as a film on it epitaxially. When forming this film, the pressure was $10^{-6}$ Pa, substrate temperature was 600 degrees centigrade, and ozone flux was 1.5×10$^{12}$ molecule/second cm$^2$.

Furthermore, SrO (001) films 25 is grew epitaxially for 5.2 angstroms. Since the conditions of film forming of SrO were able to be made the same as that of SrTiO$_3$ film, it was made the completely same conditions.

And the gate electrode 26 was formed by vapor-depositing gold (Au) on it.

Thus, the equivalent oxide thickness (EOT) of the obtained insulating film was a very small value of 4.1 angstroms. Moreover, the leak current when applying the electric field of 5 MV/cm was a very small value of 2×10$^{-2}$ A/cm$^2$.

As a comparative example, the leak current of the insulating film which consists only of SiO$_2$ film in the same EOT when 5 MV/cm is applied by extrapolation is $10^6$ A/cm$^2$, and reached 5×10$^7$ times of that of the above-mentioned insulating film. From this, it has checked that the effect of having made quantum well structure in the insulating film was very large.

THIRD EXAMPLE

Next, MOSFET in which the insulating film which has double quantum well structure called SrO/STO/SrO/STO/SrO is provided will be explained as a third example of the invention.

Figure 12:
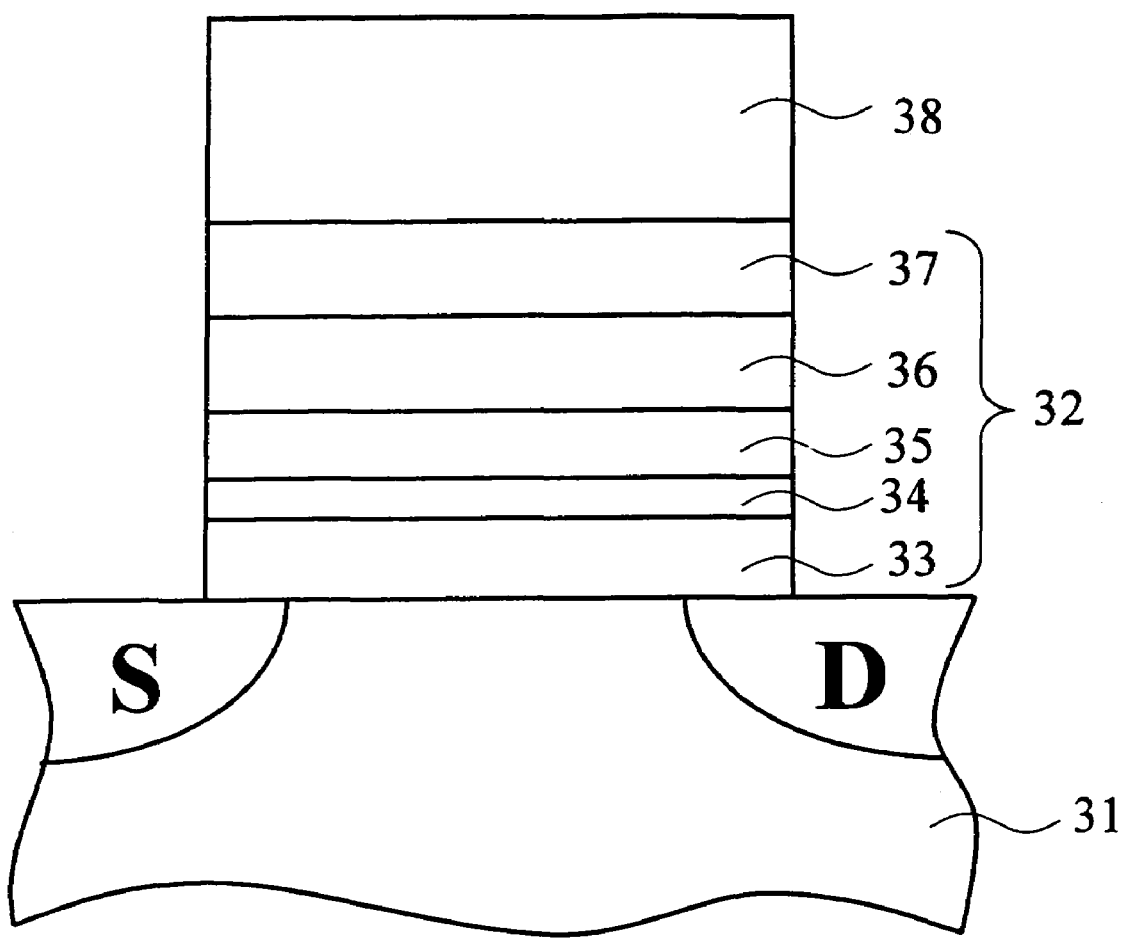
FIG. 12 is a sectional view of the gate insulating film of MOSFET of the third example of the invention, and $SrTiO_3$ is used for the well layer and SrO is used for the barrier layer.

FIG. 12 is a sectional view of the gate insulating film of MOSFET of the third example of the invention.

That is, in FET of this example, the source region S and the drain region D are formed in the surface of a silicon substrate 31, and the gate electrode 38 is provided through the gate insulating film 32 on the channel region which is formed between them. A gate insulating film has the double quantum well structure where the SrO barrier layer 33, the STO well layer 34, the SrO barrier layer 35, the STO well layer 36, and the SrO barrier layer 37 were laminated.

The manufacturing process of this is explained. That is, first, the SrO (001) layer 33 was grown epitaxially on the (001) Si substrate 31. The thickness of the SrO layer 33 was made into about 7.8 angstroms. More specifically, first, only strontium (Sr) was grew for ¼ ML (mono atomic layer: atomic layer) under the environment where ozone was not applied, pressure was $10^{-7}$ Pa, and substrate temperature was 850 degrees centigrade. Then, SrO was formed as a film in the ozone flux 1.5×10$^{12}$ molecule/second cm$^2$ under the environment where pressure is $10^{-6}$ Pa and substrate temperature is 600 degrees centigrade.

Next, only 3.9 angstroms of SrTiO$_3$ (001) layers 34 was formed as a film on it epitaxially. When forming this film, the pressure was $10^{-6}$ Pa, substrate temperature was 600 degrees centigrade, and ozone flux was 1.5×10$^{12}$ molecule/second cm$^2$.

Formation of the film of the SrO layer 35, SrTiO$_3$ 36 and the SrO layer 37 was performed under the same conditions as these conditions.

That is, only 5.2 angstroms of SrO (001) film 35 was formed as a film on SrTiO$_3$ layer 34 epitaxially.

Next, only 7.8 angstroms of the SrTiO$_3$ (001) layers 36 was formed as a film on it epitaxially. Furthermore, SrO (001) films 37 is grew epitaxially for 7.8 angstroms. And the gate electrode 38 was formed by vapor-depositing gold (Au) on it.

Thus, the equivalent oxide thickness (EOT) of the obtained insulating film was a very small value of 8.3 angstroms.

Moreover, the leak current when applying the electric field of 5 MV/cm was a very small value of $10^{-6}$ A/cm$^2$.

As a comparative example, the leak current of the insulating film which consists only of SiO$_2$ film in the same EOT when 5 MV/cm is applied by extrapolation is $10^3$ A/cm$^2$, and reached $10^9$ times of that of the above-mentioned insulating film. From this, it has checked that the effect of having made quantum well structure in the insulating film was very large.

When voltage is applied, the state in two well layers 34 and 36 may be in agreement in energy as a special case. In such a case, it is necessary to design gate structure, paying attention to this point since band offset falls. In this example, the phenomenon in which: the leak current increased rapidly in near the electric field of 5.7 MV/cm was seen. What is necessary is just to use it below by this electric field fundamentally. This situation can also be avoided by providing triple well structure which will be explained in detail about the fifth example.

FOURTH EXAMPLE

Next, the insulating film whose thickness of the double quantum well structure of the third example mentioned above will be explained as the fourth example of the invention.

That is, the lamination structure of the insulating film was $SrO/SrTiO_3/SrO/SrTiO_3/SrO$.

The thickness of all of SrO layers was 5.2 angstroms, and the thickness of all of SrTiO layers was 3.9 angstroms. The method of forming films is the same as that of the third example.

In the case of the insulating film of this example, the band offset was about 1 eV before the voltage is applied. However, since there was almost no interaction between well layers, the leak current when applying the big electric field of 5 MV/cm was the very small value of $10^{-5}$ A/cm$^2$. That is, when voltage was applied, the band offset went up substantially.

Moreover, the equivalent oxide thickness (EOT) of the obtained insulating film was a very small value of 6.2 angstroms.

THE FIFTH EXAMPLE

Next, MOSFET in which the insulating film which has triple quantum well structure of SrO/STO/SrO/STO/SrO/STO/SrO is provided will be explained as the fifth example of the invention.

Figure 13:
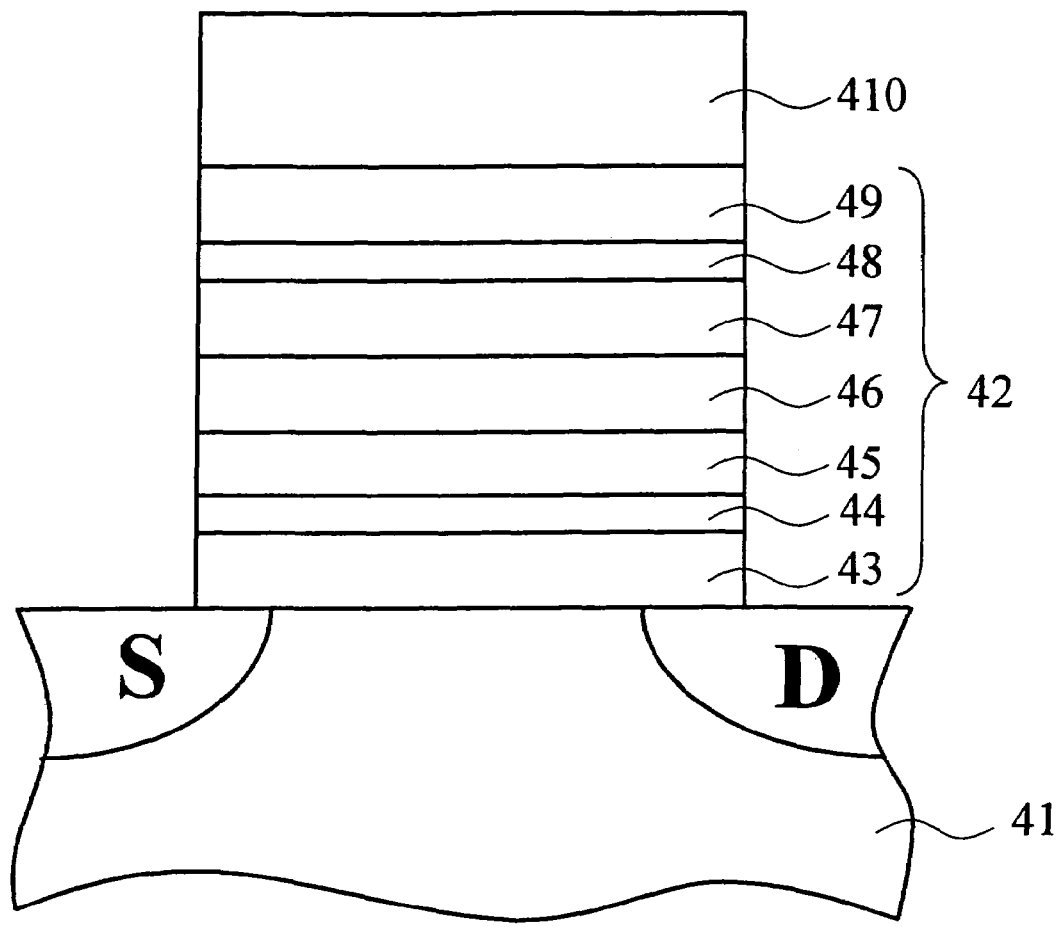
FIG. 13 is a sectional view of the gate insulating film of MOSFET of the fifth example of the invention, and $SrTiO_3$ is used for the well layer and SrO is used for the barrier layer.

FIG. 13 is a sectional view of the gate insulating film of MOSFET of the fifth example of the invention.

That is, in FET of this example, the source region S and the drain region D are formed in the surface of a silicon substrate 41, and the gate electrode 410 is provided through the gate insulating film 42 on the channel region which is formed between them. A gate insulating film has triple quantum well structure where the layers are laminated in this order of SrO barrier layer 43, the STO well layer 44, the SrO barrier layer 45, the STO well layer 46, the SrO barrier layer 47, the STO well layer 48, and the SrO barrier layer 49.

This manufacturing process will be explained.

First, the SrO (001) layer 43 was grown epitaxially on the Si substrate 41 whose major surface is (001).

The thickness of the SrO layer 43 was made into about 5.2 angstroms. More specifically, first, only strontium (Sr) was grew for ¼ ML (mono atomic layer: atomic layer) under the environment where ozone was not applied, pressure was $10^{-7}$ Pa, and substrate temperature was 850 degrees centigrade. Then, SrO was formed as a film in the ozone flux $1.5 \times 10^{12}$ molecule/second cm$^2$ under the environment where pressure is $10^{-6}$ Pa and substrate temperature is 600 degrees centigrade.

Next, only 3.9 angstroms of SrTiO$_3$ (001) layers 44 was formed as a film on it epitaxially. When forming this film, the substrate temperature was 600 degrees centigrade and the ozone flux was $1.5 \times 10^{12}$ molecule/second cm$^2$.

Next forming films of SrO, SrTiO$_3$, SrO, SrTiO$_3$, and SrO was performed while these conditions were maintained.

That is, 5.2 angstroms of SrO (001) film 45 was formed as a film on SrTiO$_3$ layer 44 epitaxially. Next, 7.8 angstroms of the SrTiO$_3$ (001) layers 46 was formed as a film on it epitaxially. Furthermore, 5.2 angstroms of SrO (001) film 35 was formed as a film on SrTiO$_3$ layer 34 epitaxially. Next, only 7.8 angstroms of the SrTiO$_3$ (001) layers 36 was formed as a film on it epitaxially.

Furthermore, about 5.2 angstroms of the SrO (001) layer 49 was formed as a film on the SrTiO$_3$ layer 48 epitaxially. And the gate electrode 410 was formed by vapor-depositing gold (Au) on it.

Thus, the equivalent oxide thickness (EOT) of the obtained insulating film was a very small value of 8.4 angstroms. Moreover, the leak current when applying the electric field of 5 MV/cm was a very small value of $10^{-6}$ A/cm$^2$. This result is mostly in agreement with the result of the example mentioned above.

As a comparative example, the leak current of the insulating film which consists only of SiO$_2$ film in the same EOT when 5 MV/cm is applied by extrapolation is $10^3$ A/cm$^2$, and reached $10^9$ times of that of the above-mentioned insulating film. From this, it has checked that the effect of having made quantum well structure in the insulating film was very large.

In triple well of the invention, also when the voltage was applied, the phenomenon in which the leak current increased rapidly was not seen. This point is the difference with the case of a double well.

THE SIXTH EXAMPLE

Next, the MIM (metal, insulator, and metal) capacitor using the insulating film of the invention will be explained as the sixth example of the invention.

Figure 14:
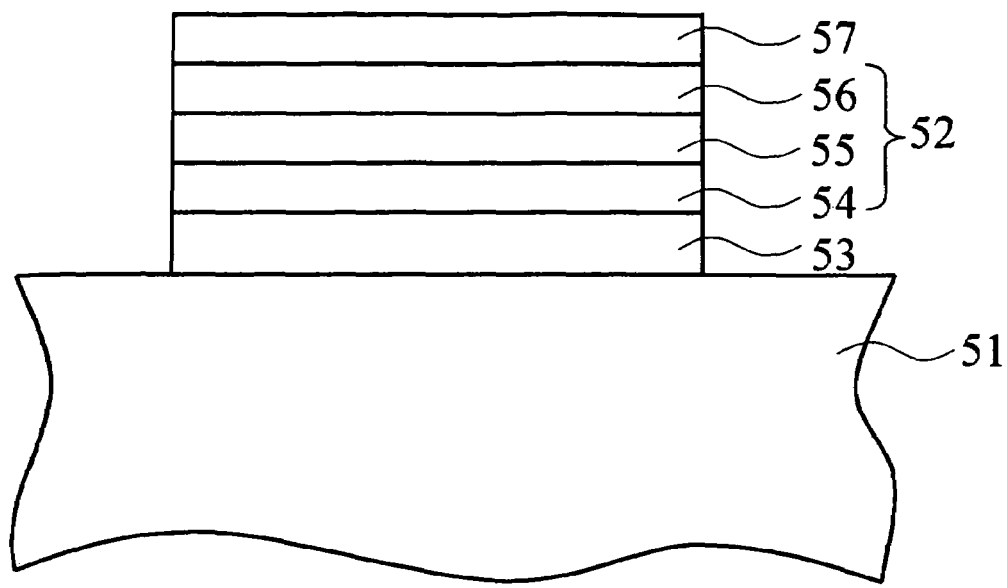
FIG. 14 is a sectional view of the gate insulating film of MIM capacitor, and $SrTiO_3$ is used for the well layer, SrO is used for the barrier layer, and $SrRuO_3$ is used for the electrode.

FIG. 14 is a sectional view of the MIM capacitor of this example. This structure is explained in order of the manufacturing process.

First, although the major surface used MBE for (001) SrTiO$_3$ substrate 51 and created the capacitor to it, structure was given to the gate insulating film 52 at this time. Specifically, SrRuO$_3$ electrode 53 was grown epitaxially on SrTiO$_3$ substrate 51, and the SrO (001) layer 54 was grown epitaxially on it. The thickness of the SrO layer 54 was made into about 5.2 angstroms.

Next, the 3.9 angstroms of the SrTiO$_3$ (001) layers 55 was grew epitaxially on it. Furthermore, about 5.2 angstroms of SrO (001) layers 56 of the as same thickness as that of the preceding was grown epitaxially on the SrTiO$_3$ layer 55 and SrRuO$_3$ electrode 57 was grown epitaxially on it.

Generally, the pressure was $10^{-6}$ Pa, the substrate temperature was 600 degrees centigrade, and the ozone flux was $1.5 \times 10^{12}$ molecule/second cm$^2$.

Thus, the equivalent oxide thickness (EOT) of the obtained insulating film capacitor was a very small value of 4.1 angstroms. Moreover, the leak current when applying the large electric field of 5 MV/cm was a very small value of $10^{-6}$ A/cm$^2$.

As a comparative example, the leak current of the insulating film which consists only of SiO$_2$ film in the same EOT when 5 MV/cm is applied by extrapolation is $5\times10^7$ A/cm$^2$, and reached $10^6$ times of that of the above-mentioned insulating film. From this, it has checked that the effect of having made quantum well structure in the insulating film capacitor was very large.

THE SEVENTH EXAMPLE

Next, MOSFET in which the insulating film which has the single quantum well structure of Ce-silicate/CeO$_2$/SrO will be explained as the seventh example of the invention.

Figure 15:
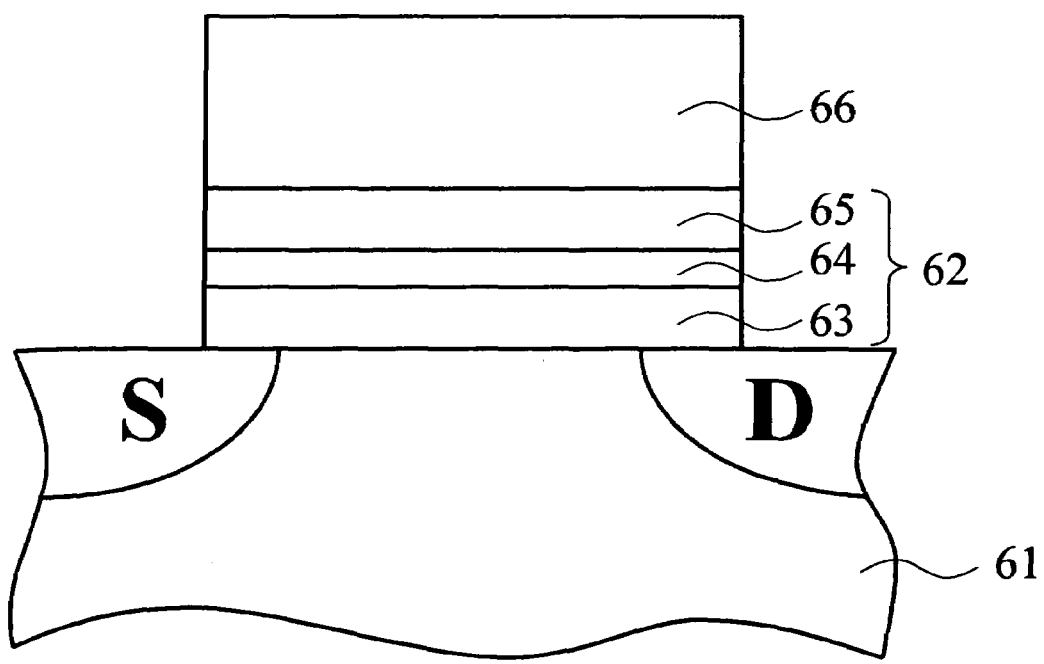
FIG. 15 is a sectional view of the gate insulating film of MOSFET of the seventh example of the invention, and $CeO_2$ is used for the well layer and Ce-Silicate and SrO are used for the barrier layer.

FIG. 15 is a sectional view of the gate insulating film of MOSFET of the seventh example of the invention.

That is, in FET of this example, the source region S and the drain region D are formed in the surface of a silicon substrate 61, and the gate electrode 66 is provided through the gate insulating film 62 on the channel region which is formed between them. The gate insulating film has the single quantum well structure where layers were made laminated in this order of the Ce-silicate (Si) barrier layer 63, the CeO$_2$ well layer 64, and the SrO barrier layer 65.

This manufacturing process is explained.

First, the CeO$_2$ (111) layer 64 was grown epitaxially on the Si substrate 61 whose major surface is (111). Thickness of CeO2 layer was made into about 8.2 angstroms.

The surface of the Si substrate was Hydrogen-terminated by HF processing and NH$_4$F, and CeO$_2$ was formed as a film after an appropriate time. When forming CeO$_2$ as a film, the pressure was $10^{-6}$ Pa, the substrate temperature was 700 degrees centigrade, and the ozone flux was $8.8\times10^{12}$ molecule/second cm$^2$. Next, 0.7.5 angstroms of the SrO (111) film 65 was grown epitaxially under the condition where the pressure is $10^{-6}$ Pa, the substrate temperature is 700 degrees centigrade and the ozone flux is $1.2\times10^{12}$ molecule/second cm$^2$. In this stage, oxygen annealing was performed for 30 seconds at 800 degrees centigrade.

At this time, Ce silicate barrier layer 63 grew up to be the thickness of about 3.5 angstroms at the interface of Si and CeO$_2$. This barrier layer was able to be used as the barrier of well structure. And the gate electrode 66 was formed by vapor-depositing gold (Au) on it.

Thus, the equivalent oxide thickness (EOT) of the obtained insulating film was a very small value of 3.8 angstroms. Moreover, the leak current when applying the electric field of 5 MV/cm was a very small value of $3\times10^{-2}$ A/cm$^2$.

As a comparative example, the leak current of the insulating film which consists only of SiO$_2$ film in the same EOT when 5 MV/cm is applied by extrapolation is $10^7$ A/cm$^2$, and reached $3\times10^8$ times of that of the above-mentioned insulating film. From this, it has checked that the effect of having made quantum well structure in the insulating film was very large.

Moreover, you may use the well layer in which La$_2$O$_3$, Y$_2$O$_3$, Gd$_2$O$_3$, SrTiO$_3$, etc. were grown epitaxially instead of CeO2. In these cases, it is possible respectively to make La silicate, Y silicate, Gd silicate, and SiO$_2$ by annealing as a thin film barrier layer, and quantum well structure can be formed.

The characteristic that it is possible to create EOT in thickness of about 4-6 angstroms in any case, and leak current becomes $10^{-2}$—about $10^{-4}$ A/cm$^2$ is acquired. It means that the validity of quantum well structure was shown since the improvement of $10^8$ to $10^9$ orders was found compared with the case of the SiO$_2$ same film of EOT.

THE EIGHTH EXAMPLE

Next, MOSFET in which the insulating film which has the single quantum well structure of Hf-silicate/HfO$_2$/SrO is provided will be explained as the eighth example of the invention.

Figure 16:
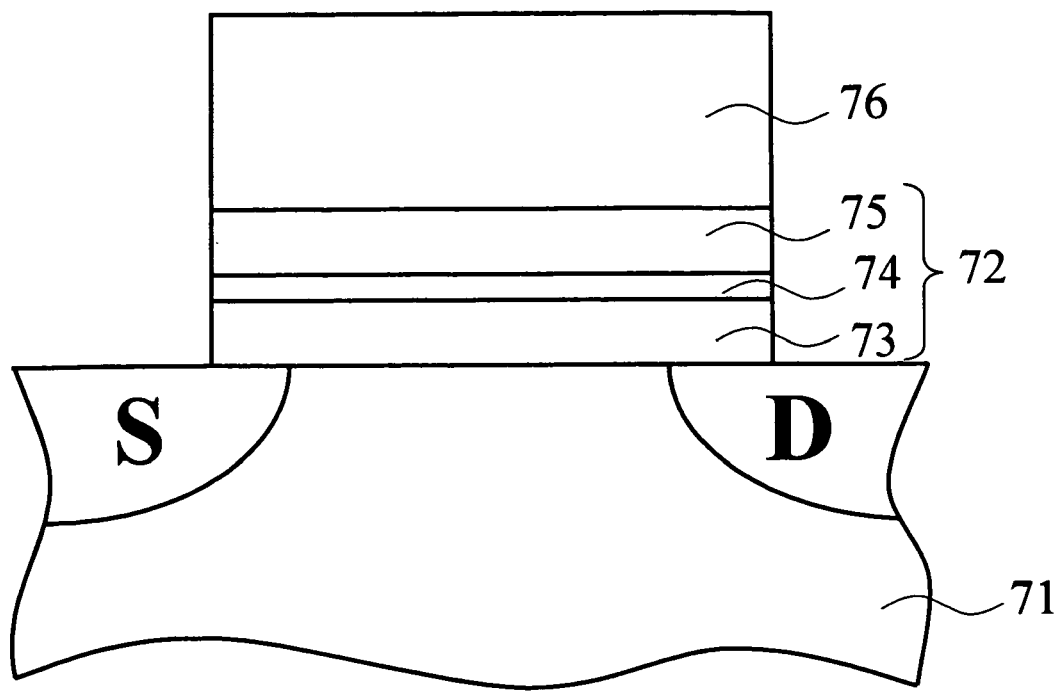
FIG. 16 is a sectional view of the gate insulating film of MOSFET of the eighth example of the invention, and HfO2 is used for the well layer and Hf-Silicate and SrO are used for the barrier layer.

FIG. 16 is a sectional view of the gate insulating film of MOSFET of the eighth example of the present invention.

That is, in FET of this example, the source region S and the drain region D are formed in the surface of a silicon substrate 71, and the gate electrode 76 is provided through the gate insulating film 72 on the channel region which is formed between them. The gate insulating film has the single quantum well structure in which the Hf-silicate barrier layer 73, the HfO2 well layer 74, and the SrO barrier layer 75 are made to laminated in this order.

This manufacturing process will be explained.

First, the HfO$_2$ layer was grown on the Si substrate 71 whose major surface was (111).

At this time, the HfO2 layer did not carry out epitaxial growth but was in the amorphous state. Although MBE equipment is used in this example, if it can be made to grow up in layers, CVD will also serve as the leading film forming technique, for example.

The thickness of HfO$_2$ layer was made into about 8.2 angstroms. The surface of the Si substrate 71 was Hydrogen-terminated by HF processing and NH$_4$F, and HfO$_2$ was formed as a film after an appropriate time.

At this time, the pressure was $10^{-6}$ Pa, the substrate temperature was 700 degrees centigrade, and the ozone flux was $8.8\times10^{12}$ molecule/second cm$^2$.

Next, the SrO (111) layer 75 was formed on this HfO$_2$ layer. In this case, 7.5 angstroms of the SrO (111) layer 75 was grown under the condition where the pressure is $10^{-6}$ Pa, the substrate temperature is 700 degrees centigrade and the ozone flux is $1.2\times10^{12}$ molecule/second cm$^2$. In this stage, annealing in oxygen for 30 seconds was performed at 800 degrees centigrade. By this annealing, Hf silicate layer 73 was able to grow up to be the thickness of 3.5 angstroms at the interface of the Si substrate 71 and HfO$_2$ layer 74, and this was able to be made into the barrier layer of well structure. And the gate electrode 76 was formed by vapor-depositing gold (Au) on it.

Thus, the equivalent oxide thickness (EOT) of the obtained insulating film was a very small value of 6.8 angstroms. Moreover, the leak current when applying the electric field of 5 MV/cm was a very small value of $10^{-4}$ A/cm$^2$.

As a comparative example, the leak current of the insulating film which consists only of SiO$_2$ film in the same EOT when 5 MV/cm is applied by extrapolation is $10^5$ A/cm$^2$, and reached $10^9$ times of that of the above-mentioned insulating film. From this, it has checked that the effect of having made quantum well structure in the insulating film was very large.

Moreover, even if it uses the amorphous thin film of ZrO$_2$, Al$_2$O$_3$, Ta$_2$O$_3$, TiO$_2$, the nitrides HfON, ZrON, and AlON and TaON, and TiON instead of a HfO$_2$ amorphous thin film to an interface with Si, it was possible to have made Zr-silicate, Al-silicate, Ta-silicate, Ti-silicate, Hf-silicate, Zr-silicate, Al-silicate, Ta-silicate, and Ti-silicate, respectively, as thin film barrier structure, and it was possible to have created well structure.

Furthermore, even if the amorphous thin film of SrTiO$_3$, the amorphous thin film of SrZrO$_3$, the amorphous thin film of mixed crystal Sr(Ti, Zr)O$_3$, the amorphous thin film of Sr$_2$Nb$_2$O$_7$, and the amorphous thin film of Sr$_2$V$_2$O$_7$ instead of the HfO$_2$ amorphous thin film, it was possible to have made SiO$_2$ thin film as thin film barrier structure to an interface with Si, and it was possible to have created well structure.

In any case, it is possible to create EOT to about 5-9 angstroms thickness, and the characteristic that leak current is 10$^{-2}$-10$^{-6}$ A/cm$^2$ is acquired. Since the 10$^8$-10$^9$ order grade improvement of the leak current is carried out compared with the case of the SiO$_2$ film of EOT, it can be said that the validity of quantum well structure was shown.

THE NINTH EXAMPLE

Next, MOSFET in which the insulating film which has the single quantum well structure of SrO/Ca(Ti, Zr)O$_3$ (it may omit following CTZO)/SrO is provided will be explained as the ninth example of the invention.

Figure 17:
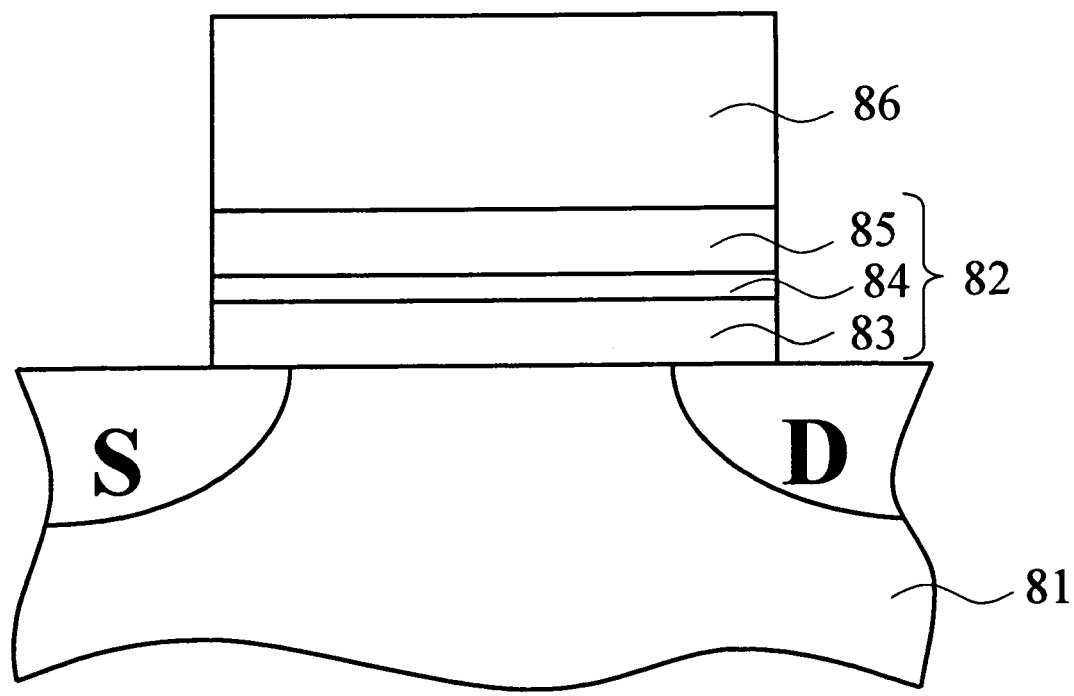
FIG. 17 is a sectional view of the gate insulating film of MOSFET of the ninth example of the invention, and the strained Si-SOI substrate is used, and $Ca(Ti_{0.5},Zr_{0.5})$ is used for the well layer and SrO is used for the barrier layer.

FIG. 17 is a sectional view of the gate insulating film of MOSFET of the eighth example of the invention.

That is, in FET of this example, the source region S and the drain region D are formed on the surface of the strained Si-SOI (silicon on insulator) substrate 81, and the gate electrode 86 is provided through the gate insulating film 82 on the channel region which is formed between them.

The gate insulating film has the single quantum well structure where the SrO barrier layer 83, the CTZO well layer 84, and the SrO barrier layer 85 was made to laminate in this order.

First, the formation method of strained Si-SOI will be explained below.

First, the SiGe buffer layer and the stress relaxation SiGe layer were formed on Si substrate by CVD.

Next, pouring oxygen was performed by the SIMOX (separation by implanted oxygen) method. The dose amount of oxygen was set to 4×10$^{17}$ cm$^{-2}$. Then, by performing annealing at 1350 degrees centigrade for 6 hours, the embedded oxide film was formed into the first SiGe layer. At this time, in the bent SiGe layer, it embeds with SiGe in 1350-degree centigrade high temperature annealing, and stress relaxation happens by the slide of the interface of an oxide film. Then, if a SiGe layer is oxidized by the annealing in [of 1200 degrees centigrade] oxygen in order to make germanium into high concentration, it will embed with SiGe and concentration of germanium concentration will occur in the interface side with an oxide film. If etching removes the oxide film of the surface, the SiGe thin film containing high-concentration germanium will be formed. If Si is grown up by CVD on this film, Si thin film which sensed the lattice constant of SiGe of a ground and was distorted will be formed. The strained Si-SIO substrate was created in this way.

Next, although a major surface uses MBE for the strained Si substrate 81 of (001) and creates the gate insulating film 82 to it, structure is given to the gate insulating film 82 at this time. First, the SrO (001) layer 83 was grown epitaxially. The thickness of a SrO layer was made into about 5.2 angstroms. First, the hydrogen terminus of the Si substrate surface was carried out to HF processing by NH$_4$F, and, specifically, SrO was formed as a film on after an appropriate time.

Next, only Sr was grown for 2 ML under the environment where there was no ozone, the pressure was 10$^{-7}$ Pa and the substrate temperature was low temperature of 200 degrees centigrade. Then, the ozone flux of 1.5×10$^{12}$ molecule/second cm$^2$ was irradiated for 30 seconds under the environment where the pressure was 10$^{-6}$ Pa and the substrate temperature was 200 degrees centigrade. Thereby, two layers of SrO layers have been made (about 5.2 angstroms).

And, the Ca(Ti$_{0.5}$,Zr$_{0.5}$)O$_3$ (001) layers 84 was grown epitaxially on it for 3.9 angstroms. At this time, the pressure was 10$^{-6}$ Pa, the substrate temperature was 600 degrees centigrade, and the ozone flux was 1.5×10$^{12}$ molecule/second cm$^2$. Furthermore, the SrO (001) film 85 was grown epitaxially on the Ca(Ti$_{0.5}$,Zr$_{0.5}$)O$_3$ film for 5.2 angstroms. Since the growth conditions of the SrO film were able to be made the same as that of the Ca(Ti$_{0.5}$,Zr$_{0.5}$)O$_3$ film, it was completely made the same. Gold was formed as a film on it by vapor deposition as the gate electrode 86.

Thus, the equivalent oxide thickness (EOT) of the obtained insulating film was a very small value of 3.2 angstroms. Moreover, the leak current when applying a big electric field of 5 MV/cm was as small as 5×10$^{-2}$ A/cm$^2$.

As a comparative example, the leak current of the insulating film which consists only of SiO$_2$ film in the same EOT when 5 MV/cm is applied by extrapolation is 10$^7$ A/cm$^2$, and reached 2×10$^8$ times of that of the above-mentioned insulating film. From this, it has checked that the effect of having made quantum well structure in the insulating film was very large.

This example showed that the gate insulating film with quantum well structure could also be adapted for MOSFET using a strained Si-SOI substrate.

Moreover, it was also possible to use (Ba, Sr, Ca)O instead of the SrO film. Since it was made possible to change the lattice constant within quite large limits, it became easy to unite the lattice constant of a ground surface when growing it epitaxially.

When it was made to grow epitaxially on the strained Si substrate using (Ba$_{0.85}$,Sr$_{0.15}$)O mentioned above, the membranous of the barrier improved remarkably. EOT became 2.8 angstroms when the same well type gate insulating film as the above was constituted by making this thin film into a barrier layer. The leak current when applying the big electric field of 5 MV/cm was as small as 6×10$^{-2}$ A/cm$^2$.

As a comparative example, the leak current of the insulating film which consists only of SiO$_2$ film in the same EOT when 5 MV/cm is applied by extrapolation is 2×10$^7$ A/cm$^2$, and reached 3×10$^8$ times of that of the above-mentioned insulating film. From this, it has checked that the effect of having made quantum well structure in the insulating film was very large.

By using (Ba, Sr)O for an insulating film, the interface level density by strain of an interface can be reduced 1/10 or less of that of SrO. Consequently, the mobility of a transistor could be prevented from falling by the interface level and the mobility has been improved 20% or more.

THE TENTH EXAMPLE

Next, MIM in which the insulating film which has the single quantum well structure of SRO/BSO/BSTO/BSO/SRO is provided will be explained as the tenth example of the present invention.

Figure 18:
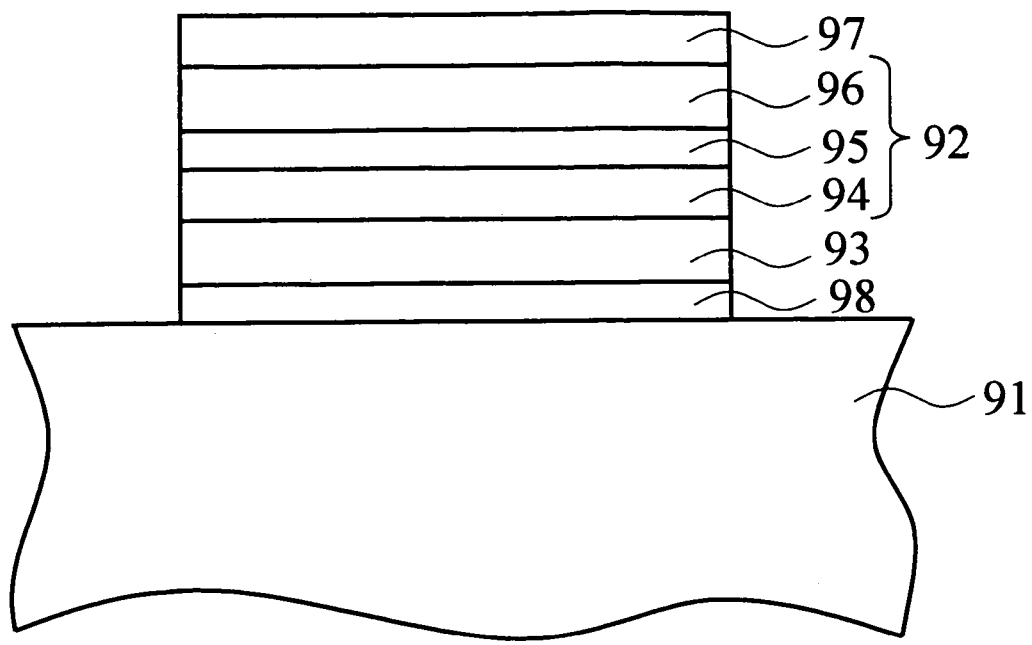
FIG. 18 is a sectional view of the gate insulating film of MIM capacitor of the tenth example of the invention, and $(Ba_{0.2},Sr_{0.8})TiO_3$ is used for the well layer and $(Ba_{0.75},Sr_{0.25})$ is used for the barrier layer, and $SrRuO_3$ is used for the electrode.

FIG. 18 is a sectional view of the MIM capacitor of this example.

Hereafter, this MIM capacitor will be explained according to the manufacturing process.

First, the SrTiO$_3$ layer 98 was grown epitaxially on the Si substrate 91 whose major surface was (001).

The surface of the Si substrate was Hydrogen-terminated by HF processing and NH$_4$F, and SrO was formed as a film after an appropriate time. Next, only Sr was grown for 1 ML under the environment where there was no ozone, the pressure was $10^{-7}$ Pa and the substrate temperature was low temperature of 200 degrees centigrade. Then, the ozone flux of $1.5 \times 10^{12}$ molecule/second cm$^2$ was irradiated for 15 seconds under the environment where the pressure was $10^{-6}$ Pa and the substrate temperature was 200 degrees centigrade. Thereby, one layer of the SrO was made. After growing Ti for 1 ML on it, the same ozone flux as the above was irradiated for 20 seconds. Then, TiO$_2$ film was grown for 1 ML. By repeating this process, the SrTiO$_3$ thin film was grown epitaxially on Si.

Next, the SrRuO$_3$ electrode 93 was grown epitaxially on the SrTiO$_3$ and the (Ba$_{0.75}$,Sr$_{0.25}$)O (001) layer 94 was grown epitaxially on the SrRuO$_3$ electrode 93. The thickness of (Ba, Sr)O layers was made into about 5.4 angstroms. The (Ba 0.2, Sr0.8) TiO$_3$ (001) layer 95 was grown epitaxially for 3.95 angstroms on it. Only about 5.4 angstroms only of as same the thickness as the point grew the (Ba$_{0.75}$,Sr$_{0.25}$)O (001) layer 96 was grown epitaxially on the (Ba, Sr)TiO$_3$ film for the same 5.4 angstroms as the above. And the SrRuO$_3$ electrode 97 was grown epitaxially on the (Ba$_{0.75}$, Sr$_{0.25}$)O (001) layer 96. The forming condition of the portion of capacitor was made that the pressure was $10^{-6}$ Pa, the substrate temperature was 600 degrees centigrade, and the ozone flux is $1.5 \times 10^{12}$ molecule/second cm$^2$.

Thus, the equivalent oxide thickness (EOT) of the obtained insulating film capacitor was a very small value of 2.1 angstroms. Moreover, the leak current when applying a big electric field of 5 MV/cm was as small as $10^{-1}$ A/cm$^2$. As a comparative example, the leak current of the insulating film which consists only of SiO$_2$ film in the same EOT when 5 MV/cm is applied by extrapolation is $10^8$ A/cm$^2$, and reached $10^9$ times of that of the above-mentioned insulating film. From this, it has checked that the effect of having made quantum well structure in the insulating film of MIM capacitor was very large.

In particular, the permittivity of the barrier layer (Ba0.75, Sr0.25)O is 20 or more, the permittivity of the thin well layer (Ba0.2, Sr0.8)TiO$_3$ currently quantized is 500 or more, and permittivity is very large. Therefore, it turns out that it is very effective that the leak current comes to be stopped by quantization.

As a comparative example, the capacitor in which the thickness of (Ba0.2, Sr0.6) TiO$_3$ is 32 angstroms was made. Then, the equivalent oxide thickness (EOT) of the obtained insulating film capacitor was a very small value of 2.4 angstroms.

Moreover, the dielectric breakdown was carried out when the leak current when applying the big electric field of 5 MV/cm was measured. From this, it is surmised that the leak current has reached the very big value of $10^9$ A/cm$^2$ or more.

Moreover, in this comparative example, the leak current in the same EOT as this example when 5 MV/cm is applied by extrapolation is $10^8$ A/cm$^2$, and it turned out that the performance has rather fallen. This is considered to be because for the energy level not to be quantized in the quantum well though it is the same lamination structure.

That is, the zero-point-vibration energy inside a well is 0.036 eV, and it is considered that the effective rise of band offset is hardly acquired in the structure of this comparative example. Moreover, the interval of the level of quantization is also 0.1 eV order, and an energy level overlaps mutually and continues a level at the temperature beyond room temperature. That is, it turned out that it cannot but stop the leak current by thickening the thickness although the permittivity falls in the capacitor of the lamination structure where the quantization effect is not seen.

THE ELEVENTH EXAMPLE

Next, MIM in which the insulating film which has double quantum well structure called SRO/BSO/BSTO/BSO/BSTO/BSO/SRO is provided will be explained as the eleventh example of the present invention.

Figure 19:
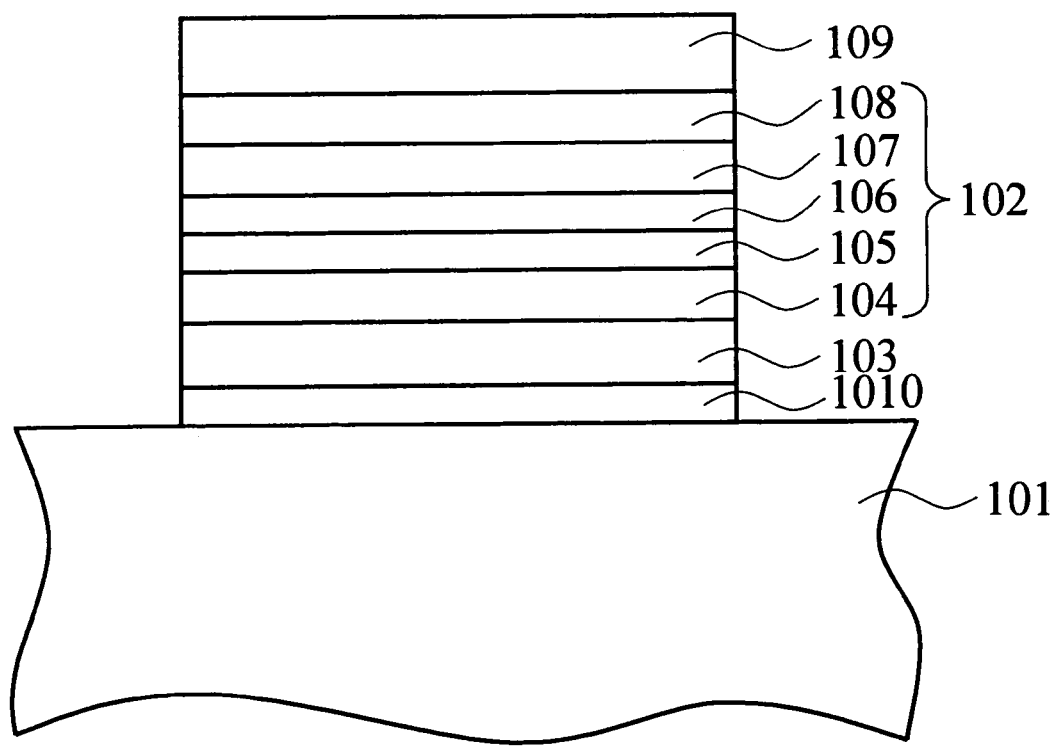
FIG. 19 is a sectional view of the gate insulating film with the double quantum well of MIM capacitor of the eleventh example of the invention, and $(Ba_{0.2},Sr_{0.8})TiO_3$ is used for the well layer and $(Ba_{0.75},Sr_{0.25})O$ is used for the barrier layer, and $SrRuO_3$ is used for the electrode.

FIG. 19 is a sectional view of the MIM capacitor of this example.

Hereafter, this MIM capacitor will be explained according to the manufacturing process.

The capacitor was made using MBE on the (001) Si substrate 101. That is, the SrTiO$_3$ layer 1010 was grown epitaxially on Si by the same method as the tenth example. And the SrRuO$_3$ electrode 103 was grown epitaxially on the SrTiO$_3$ layer 1010 and the (Ba$_{0.75}$,Sr$_{0.25}$)O (001) layer 104 was grown epitaxially on the SrRuO$_3$ electrode 103. The thickness of (Ba, Sr)O layers was made into about 5.4 angstroms.

And, the (Ba$_{0.2}$,Sr$_{0.8}$)TiO$_3$ (001) layers 105 was grown epitaxially for 3.95 angstroms on the (Ba, Sr)O layers. Furthermore, the (Ba$_{0.75}$,Sr$_{0.25}$)O (001) film 106 was grown epitaxially on this (Ba, Sr)TiO$_3$ film for the same 5.4 angstroms as the above. Furthermore, the (Ba$_{0.2}$,Sr$_{0.8}$)TiO$_3$ (001) layers 107 was grown epitaxially for 7.9 angstroms on the (Ba$_{0.75}$,Sr$_{0.25}$)O (001) film 106. Furthermore, the (Ba$_{0.75}$,Sr$_{0.25}$)O (001) film 108 was grown epitaxially on this (Ba, Sr)TiO$_3$ film for the same 5.4 angstroms as the above and the SrRuO3 electrode 109 was grown epitaxially on the (Ba$_{0.75}$,Sr$_{0.25}$)O (001) film 108.

The forming condition of the portion of capacitor was made that the pressure was $10^{-6}$ Pa, the substrate temperature was 600 degrees centigrade, and the ozone flux is $1.5 \times 10^{12}$ molecule/second cm$^2$.

Thus, the equivalent oxide thickness (EOT) of the obtained insulating film capacitor was a very small value of 3.3 angstroms. Moreover, the leak current when applying a big electric field of 5 MV/cm was as small as $5 \times 10^{-3}$ A/cm$^2$.

As a comparative example, the leak current of the insulating film which consists only of SiO$_2$ film in the same EOT when 5 MV/cm is applied by extrapolation is $10^7$ A/cm$^2$, and reached $2 \times 10^9$ times of that of the above-mentioned insulating film. From this, it has checked that the effect of having made quantum well structure in the insulating film of MIM capacitor was very large.

Furthermore, as a modification of this example, the insulating film of the triple quantum well structure was made by growing (Ba$_{0.75}$,Sr$_{0.25}$)O (001) for 5.4 angstroms, growing (Ba0.2, Sr0.8)TiO$_3$ (001) for 3.95 angstroms and growing the SrRuO$_3$ electrode on it in the double quantum well structure of this example.

The equivalent oxide thickness (EOT) of the obtained insulating film capacitor was a very small value of 4.3 angstroms. Moreover, the leak current when applying a big electric field of 5 MV/cm was as small as $5 \times 10^{-4}$ A/cm$^2$.

As a comparative example, the leak current of the insulating film which consists only of SiO$_2$ film in the same EOT when 5 MV/cm is applied by extrapolation is $10^6$ A/cm$^2$, and reached $2 \times 10^9$ times of that of the above-mentioned insulating film. From this, it has checked that the effect of having made quantum well structure in the insulating film of MIM capacitor was very large.

THE TWELFTH EXAMPLE

Next, MIM in which the insulating film which has the single quantum well structure of SRO/Al$_2$O$_3$/HfO$_2$/Al$_2$O$_3$/SRO is provided will be explained as the twelfth example of the invention.

Figure 20:
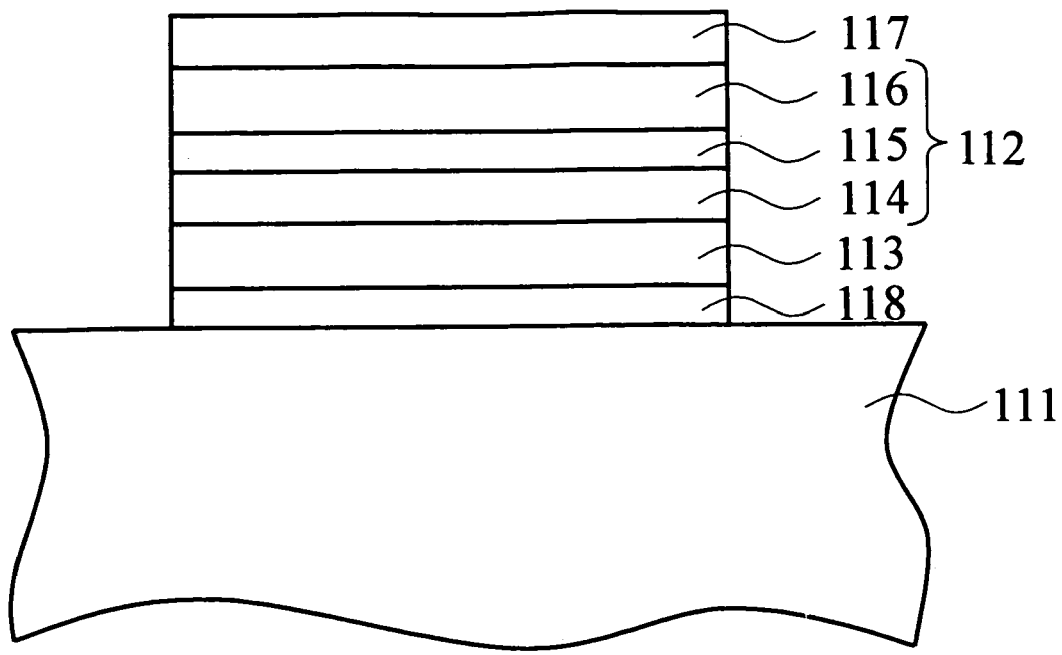
FIG. 20 is a sectional view of the gate insulating film of MIM capacitor of the twelfths example of the invention, and $HfO_3$ is used for the well layer and $Al_2O_3$ is used for the barrier layer, and $SrRuO_3$ is used for the electrode.

FIG. 20 is a sectional view of the MIM capacitor of this example.

Hereafter, this structure will be explained according to the manufacturing process.

The capacitor was made using MBE on the (001) Si substrate 111. That is, the SrTiO$_3$ layer 118 was grown epitaxially on Si by the same method as the tenth example. And the SrRuO$_3$ electrode 113 was grown epitaxially on the SrTiO$_3$ layer 118 and the Al$_2$O$_3$ layer 114 was grown on the SrRuO$_3$ electrode 113. Then, Al$_2$O$_3$ was an amorphous thin film, and made the thickness of Al$_2$O$_3$ layers into 5 angstroms. And, the HfO$_2$ layer 115 was formed as a film in layers for 5 angstroms on the Al$_2$O$_3$ layer 114. And, the Al$_2$O$_3$ layer 116 was formed as a film in layers for the same 5 angstroms as the above on the HfO$_2$ layer 115.

The condition of forming the portion of capacitor was made that the pressure was $10^{-6}$ Pa, the substrate temperature was 400 degrees centigrade, and the ozone flux was $1.5 \times 10^{12}$ molecule/second cm$^2$. That is, since it is film forming at low temperature, it is very effective as a process of manufacturing capacitors.

Thus, the equivalent oxide thickness (EOT) of the obtained insulating film capacitor was a very small value of 4.8 angstroms. Moreover, the leak current when applying a big electric field of 5 MV/cm was as small as $10^{-3}$ A/cm$^2$.

As a comparative example, the leak current of the insulating film which consists only of SiO$_2$ film in the same EOT when 5 MV/cm is applied by extrapolation is $5 \times 10^5$ A/cm$^2$, and reached $5 \times 10^8$ times of that of the above-mentioned insulating film. From this, it has checked that the effect of having made quantum well structure in the insulating film of MIM capacitor was very large.

Moreover, by using the amorphous thin films of ZrO$_2$, Ta$_2$O$_3$, TiO$_2$ and their nitrides HfON, ZrON, TaON, TiON, SrTiO$_3$, SrZrO$_3$ and their mixed crystal Sr(Ti, Zr)O$_3$, Sr$_2$Nb$_2$O$_7$, Sr$_2$V$_2$O$_7$ instead of the amorphous thin film of HfO$_2$, the completely same well structure was able to be made.

On the other hand, in the thin film of the above-mentioned well portion, other materials as a barrier portion were also able to be used. Although a prototype was built in this example by combining each of an (Ba, Sr, Ca)O, SiON, Hf-silicate, Zr-silicate, and Ti-silicate amorphous thin film to the above-mentioned substance as an extremely stable substance, in any case, EOT can be created to about 4-9 angstroms, and the characteristic that leak current is $10^{-2}$—about $10^{-6}$ A/cm$^2$ is acquired. It means that the validity of quantum well structure was shown since the improvement of $10^8$ to $10^9$ orders was found compared with the case of the SiO$_2$ same film of EOT.

THE THIRTEENTH EXAMPLE

Next, MIM in which the insulating film which has double quantum well structure of SRO/Al$_2$O$_3$/HfO$_2$/Al$_2$O$_3$/HfO$_2$/Al$_2$O$_3$/SRO is provided will be explained as the thirteenth example of the present invention.

Figure 21:
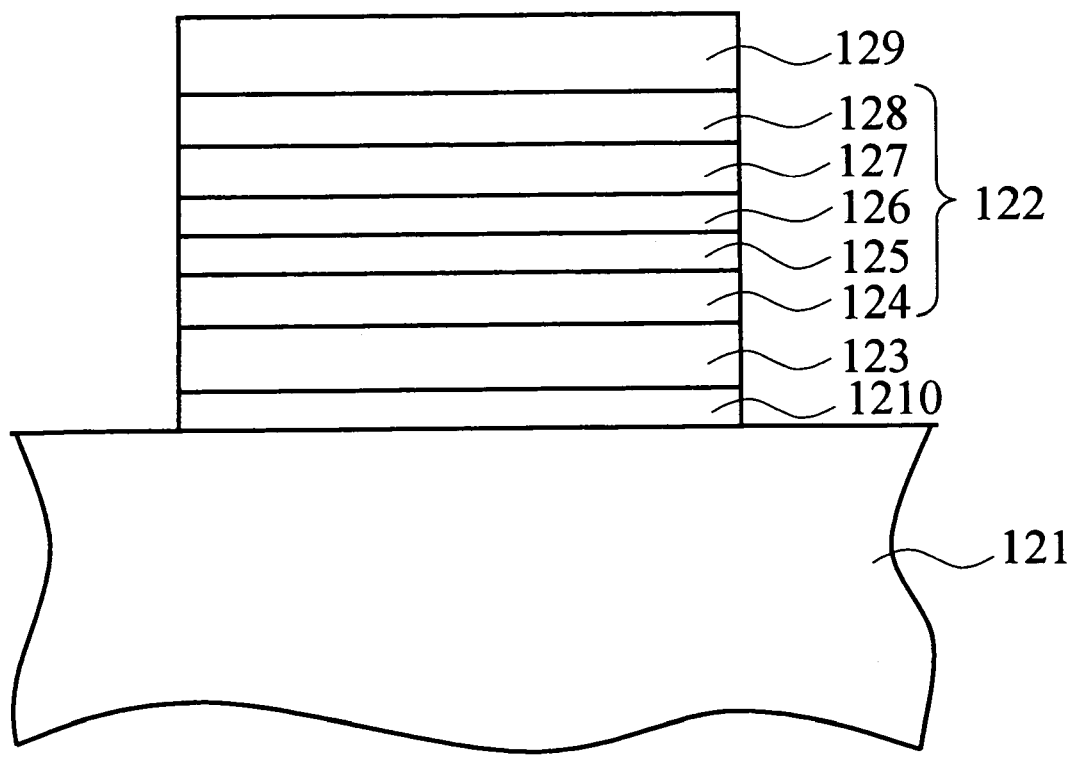
FIG. 21 is a sectional view of the gate insulating film with the double quantum well of MIM capacitor of the thirteenth example of the invention, and $HfO_3$ is used for the well layer and $Al_2O_3$ is used for the barrier layer and $SrRuO_3$ is used for the electrode.

FIG. 21 is a sectional view of the MIM capacitor of this example. Hereafter, this capacitor will be explained, referring to the manufacturing process.

The capacitor was made using MBE on the Si substrate 121 whose major surface is (001). That is, the SrTiO$_3$ layer 1210 was grown epitaxially on Si by the same method as the tenth example. And the SrRuO$_3$ electrode 123 was grown epitaxially on the SrTiO$_3$ layer 1210 and the Al$_2$O$_3$ layer 124 was grown on the SrRuO$_3$ electrode 123. Then, Al$_2$O$_3$ was an amorphous thin film, and made the thickness of Al$_2$O$_3$ layers into 5 angstroms.

And, the HfO$_2$ layer 125 was formed as a film in layers for 5 angstroms on the Al$_2$O$_3$ layer 124. And, the Al$_2$O$_3$ layer 126 was formed as a film in layers for the same 5 angstroms as the above on the HfO$_2$ layer 125.

And, the HfO$_2$ layer 127 was formed as a film in layers for 10 angstroms on the Al$_2$O$_3$ layer 126 and the Al$_2$O$_3$ layer 128 was formed as a film in layers for 5 angstroms on the HfO$_2$ layer 127.

Thus, the double quantum well structure was made into the insulator 122 of the MIM capacitor. Finally, the SrRuO$_3$ electrode 129 was formed for 50 angstroms. The condition of forming the portion of capacitor was made that the pressure was $10^{-6}$ Pa, the substrate temperature was 400 degrees centigrade, and the ozone flux is $1.5 \times 10^{12}$ molecule/second cm$^2$. That is, since it is film forming at low temperature, it is very effective as a process of manufacturing capacitors.

Thus, the equivalent oxide thickness (EOT) of the obtained insulating film capacitor was a very small value of 8.1 angstroms. Moreover, the leak current when applying a big electric field of 5 MV/cm was as small as $10^{-6}$ A/cm$^2$.

As a comparative example, the leak current of the insulating film which consists only of SiO$_2$ film in the same EOT when 5 MV/cm is applied by extrapolation is $10^3$ A/cm$^2$, and reached $10^9$ times of that of the above-mentioned insulating film. From this, it has checked that the effect of having made quantum well structure in the insulating film of MIM capacitor was very large.

Moreover, by using the amorphous thin films of ZrO$_2$, Ta$_2$O$_3$, TiO$_2$ and their nitrides HfON, ZrON, TaON, TiON, SrTiO$_3$, SrZrO$_3$ and their mixed crystal Sr(Ti, Zr)O$_3$, Sr$_2$Nb$_2$O$_7$, Sr$_2$V$_2$O$_7$ instead of the amorphous thin film of HfO$_2$, the completely same well structure was able to be made. On the other hand, in the thin film of the above-mentioned well portion, other materials as a barrier portion were also able to be used. Although a prototype was built in this example by combining each of an (Ba, Sr, Ca)O, SiON, Hf-silicate, Zr-silicate, and Ti-silicate amorphous thin film to the above-mentioned substance as an extremely stable substance, in any case, EOT can be created to about 4-10 angstroms and the characteristic that leak current is $10^{-3}$—about $10^{-8}$ A/cm$^2$ is acquired. It means that the validity of quantum well structure was shown since the improvement of $10^9$ orders was found compared with the case of the SiO$_2$ same film of EOT.

THE FOURTEENTH EXAMPLE

Next, MIM in which the insulating film which has the triple quantum well structure of SRO/Al$_2$O$_3$/HfO$_2$/Al$_2$O$_3$/HfO$_2$/Al$_2$O$_3$/HfO$_2$/Al$_2$O$_3$/SRO is provided will be explained as the fourteenth example of the present invention.

Figure 22:
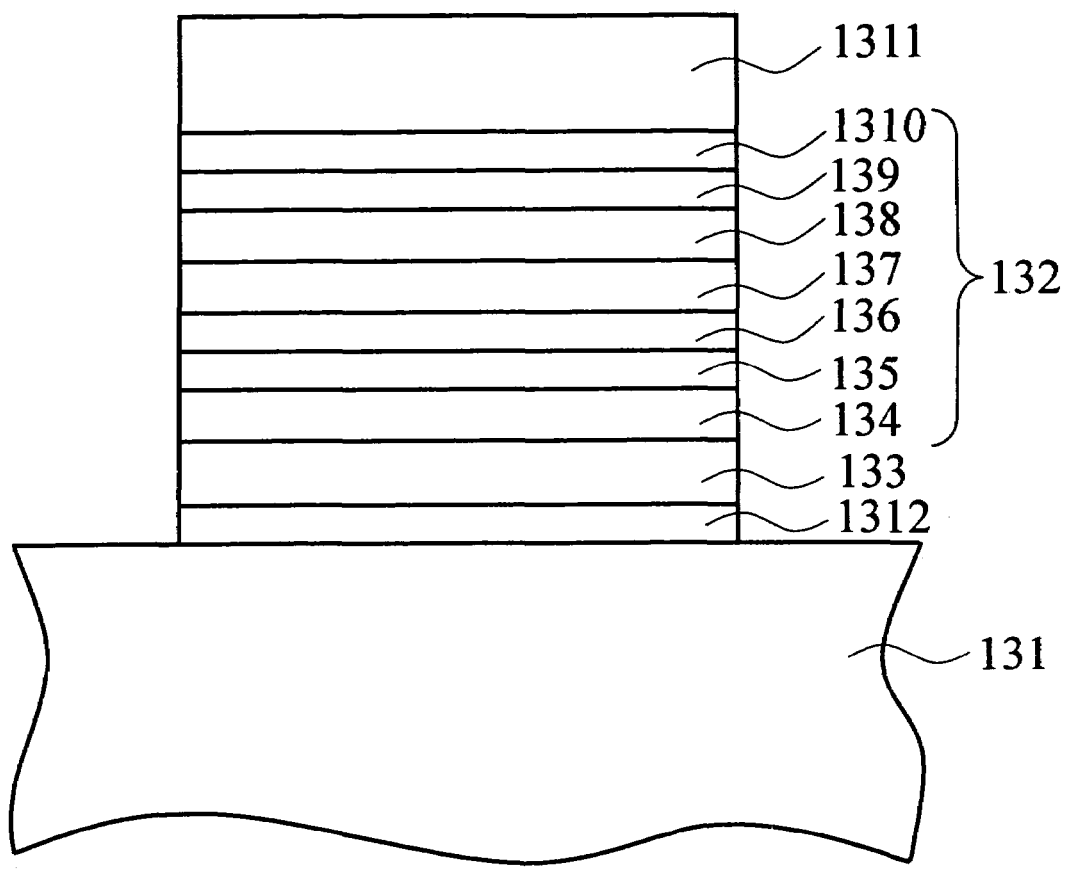
FIG. 22 is a sectional view of the gate insulating film with the triple quantum well of MIM capacitor of the fourteenth example of the invention, and HfO$_3$ is used for the well layer and Al$_2$O$_3$ is used for the barrier layer, and SrRuO$_3$ is used for the electrode.

FIG. 22 is a sectional view of the MIM capacitor of this example. Hereafter, this capacitor will be explained, referring to the manufacturing process.

The capacitor was made using MBE on the Si substrate 131 whose major surface is (001). That is, the SrTiO$_3$ layer 1312 was grown epitaxially on Si by the same method as the tenth example. And the SrRuO$_3$ electrode 133 was grown epitaxially on the SrTiO³ layer 1312 and the $Al_2O_3$ layer 134 was grown on the $SrRuO_3$ electrode 133. Then, $Al_2O_3$ was an amorphous thin film, and made the thickness of $Al_2O_3$ layers into 5 angstroms.

And, the $HfO_2$ layer 135 was formed as a film in layers for 4 angstroms on the $Al_2O_3$ layer 134. And, the $Al_2O_3$ layer 136 was formed as a film in layers for the same 3.7 angstroms as the above on the $HfO_2$ layer 135.

And, the $HfO_2$ layer 137 was formed as a film in layers for 8 angstroms on the $Al_2O_3$ layer 136 and the $Al_2O_3$ layer 138 was formed as a film in layers for 3.7 angstroms on the $HfO_2$ layer 137. And, the $HfO_2$ layer 139 was formed as a film in layers for 4 angstroms on the $Al_2O_3$ layer 138 and the $Al_2O_3$ layer 1310 was formed as a film in layers for 3.7 angstroms on the $HfO_2$ layer 139.

Thus, the triple quantum well structure was made into the insulator 132 of the MIM capacitor. Finally, the $SrRuO_3$ electrode 1311 was formed for 50 angstroms.

The condition of forming the portion of capacitor was made that the pressure was $10^{-6}$ Pa, the substrate temperature was 400 degrees centigrade, and the ozone flux is $1.5 \times 10^{12}$ molecule/second $cm^2$. That is, since it is film forming at low temperature, it is very effective as a process of manufacturing capacitors.

Thus, the equivalent oxide thickness (EOT) of the obtained insulating film capacitor was a very small value of 9.7 angstroms. Moreover, the leak current when applying the big electric field of 5 MV/cm was as small as $5 \times 10^{-8}$ $A/cm^2$ or less.

As a comparative example, the leak current of the insulating film which consists only of $SiO_2$ film in the same EOT when 5 MV/cm is applied by extrapolation is $10^2$ $A/cm^2$, and reached $2 \times 10^9$ times of that of the above-mentioned insulating film. From this, it has checked that the effect of having made quantum well structure in the insulating film of MIM capacitor was very large.

Moreover, by using the amorphous thin films of $ZrO_2$, $Ta_2O_3$, $TiO_2$ and their nitrides HfON, ZrON, TaON, TiON, $SrTiO_3$, $SrZrO_3$ and their mixed crystal $Sr(Ti, Zr)O_3$, $Sr_2Nb_2O_7$, $Sr_2V_2O_7$ instead of the amorphous thin film of $HfO_2$, the completely same well structure was able to be made.

On the other hand, in the thin film of the above-mentioned well portion, other materials as a barrier portion were also able to be used. Although a prototype was built in this example by combining each of an (Ba, Sr, Ca)O, SiON, Hf-Silicate, Zr-Silicate, and Ti-Silicate amorphous thin film to the above-mentioned substance as an extremely stable substance, in any case, EOT can be created to about 8-10 angstroms, and the $10^{-6}$—or less $10^{-8}$ $A/cm^2$ characteristic is acquired for leak current. It means that the validity of quantum well structure was shown since the improvement of $10^9$ or more orders was found compared with the case of the $SiO_2$ same film of EOT.

As mentioned above, there are various combinations of substances used as a well layer or a barrier layer in the first through 14th examples of the invention. Because wells (or barriers) are not always composed of same substance in the trial production of insulators. If quantum well structure can be made, it was proved as compared with the $SiO_2$ insulating film that leak current can be controlled extraordinarily.

According to the embodiment of the invention, it turned out that there is very big flexibility in the combination of material. Therefore, it is possible to look for the combination equipped with the required characteristic very broadly.

THE FIFTEENTH EXAMPLE

Next, the MOSFET in which the material which is corresponds to the region B expressed in FIG. 23 and FIG. 24 is provided as an insulating film will be explained as the fifteenth example of the invention.

As an example of creation of actual MOSFET structure, although the case of $Ca(Ti_{0.4},Zr_{0.6})O_3$ is described, if it is in this region B, it was possible to make the MOSFET which has the characteristic that the permittivity is large, the leak current is small and the mobility is large.

FIG. 25 is a sectional view of the gate insulating-film of MOSFET of the example of the invention.

That is, in FET of this example, the source region S and the drain region D are formed on the surface of the (001) strained Si substrate 151. And the gate electrode 153 is provided through the gate insulating film 152 on the channel region formed between these regions. The gate insulating film is a thin film of the perovskite structure which is formed in the form where a CaO layer touches the silicon substrate and is expressed with $Ca(Ti_{0.4},Zr_{0.6})O_3$. The manufacturing method of the strained Si substrate is a method described in the ninth example. And the amount of the strain at this time was +1%. Also in subsequent examples, the strained Si substrate which has the strain of +1% will be used. Hereafter, a film forming process is explained briefly.

First, the CaO layer was grown epitaxially on the (001) Si substrate and the strained Si substrate using MBE. The surface of the Si substrate was Hydrogen-terminated by HF processing and $NH_4F$, and CaO was formed as a film after an appropriate time. Although the planarizing of the substrate included many processing, the planarizing of the substrate used here was processing to a grade in which atomic steps did not appear in all over the gate insulating film. Since the region of the gate insulating film is becoming small now, the present processing method may be enough for planarizing processing.

The CaO thin film was grown for 1 ML under the environment where there is no ozone, the pressure was $10^{-7}$ Pa and the substrate temperature was 200 degrees ° C., and the ozone flux $1.5 \times 10^{12}$ molecule/second $cm^2$ was irradiated to the film for 15 seconds under the environment where the pressure was $10^{-6}$ Pa and the substrate temperature was 200 degrees centigrade. Thereby, one layer of CaO layers was made. After growing the metal (Ti, Zr) for 1 ML on it so that Ti:Zr=0.4:0.6, the same ozone flux as the above was irradiated for 20 seconds. Then, $(Ti_{0.4},Zr_{0.6})O_2$ film was grown for 1 ML. By repeating this process, $Ca(Ti_{0.4},Zr_{0.6})O_3$ thin film was grown epitaxially on the strained Si substrate.

Thus, finally the $Ca(Ti_{0.4},Zr_{0.6})O_3$ thin film was grown epitaxially for 51 angstroms by real thickness. It was a thin gate insulating film with the thickness converted into $SiO_2$ thickness (EOT) of 5.0 angstroms, where the permittivity was about 40. Moreover, the leak current when applying a big electric field of 5 MV/cm was as small as $8 \times 10^{-2}$ $A/cm^2$. This is because the real thickness is as thick as 51 angstroms.

As a comparative example, the leak current of the insulating film which consists only of $SiO_2$ film in the same EOT when 0.5 MV/cm is applied by extrapolation is $5 \times 10^5$ $A/cm^2$, and reached $6 \times 10^6$ times of that of the above-mentioned insulating film. From this, it has checked that the effect of having made quantum well structure in the insulating film of $Ca(Ti_{0.4},Zr_{0.6})O_3$ was very large. Moreover, in the case of the $(Sr_{0.5},Ca_{0.5})TiO_3$ thin film, the leak current of the same order as the case of $SrTiO_3$ will flow. That is, it was proved that although the lattice constant was well in agreement with the lattice constant of +1% of strained Si substrate, the barrier for electrons was almost equal to zero in $(Sr_{0.5},Ca_{0.5})TiO_3$ thin film.

Next, the effect of the lattice constant of the gate insulating film being in agreement with the lattice constant of the substrate was investigated. The interface electric charge trap densities Dit ($cm^{-2}/eV$) of MOSFET made on the strained Si substrate were a quite low value of $4 \times 10^{11}$ $cm^{-2}/eV$. Although this value is larger than the latest best value of $10^{10}$ $cm^{-2}/eV$ at $SiO_2/Si$ interface, it is a quite desirable value. The effect of the lattice constant of the gate insulating film being in agreement with the lattice constant of the substrate and using the strained Si substrate enables the mobility being 750 ($cm^2/Vsec$) at the maximum. This value is a desirable value when the lattice constant is larger for about plus 1%. If the lattice constant of the gate insulating film can be made more in agreement with the lattice constant of the substrate, a better mobility value is expectable. However, since the barrier for electrons is not kept large enough in the perovskite structure as expressed in FIG. 23 and FIG. 24, the lattice constant cannot be made in agreement in the gate insulating film for MOSFET.

On the other hand, henceforth [the example 16 explained below], since the lattice constant can be made well in agreement now, change of mobility can be explained. If the lattice constant of the gate insulating film exceeds plus 1.5% to the substrate lattice constant, the interface electric charge trap will increase rapidly. If the lattice constant of the gate insulating film exceeds plus 2% to the substrate lattice constant, the interface electric charge trap will amount to $10^4$ $cm^{-2}/eV$. Therefore, it is necessary to make the lattice constant of the gate insulating film less than +1.5%.

THE SIXTEENTH EXAMPLE

Next, the MOSFET in which the material which is correspond to the region A or the region B expressed in FIG. 26 is provided as the insulating film will be explained as the sixteenth example of the invention.

FIG. 27 expresses the result of having introduced Hf. As a result of the following examples' creating and comparing MOSFET in parallel, there was almost no difference with the case of Zr.

In FIG. 26, the region A expresses the range of the optimum material to the epitaxial growth on a silicon substrate, and the region B expresses the range of the optimum material to the epitaxial growth on a plus 1% strained Si substrate. The case of $Ca_2(Ti_{0.5},Zr_{0.5})O_4$ as an example of creation of actual MOSFET structure in this example 16. The case on a silicon substrate and the case on a plus 1% strained Si substrate will be explained as this example. It was possible to make the MOSFET which has the characteristic that the permittivity is large, the leak current is small and the mobility is large.

FIG. 31 is a sectional view of the gate insulating-film of MOSFET of the example of the present invention. Since the structure is the same even if the strain of the substrate changes, the case of the silicon substrate or the plus 1% strained Si substrate is expressed.

That is, in FET of this example, the source region S and the drain region D are formed on the surface of the (001) Si substrate or the strained Si substrate 161. And the gate electrode 163 is provided through the gate insulating film 162 on the channel region formed between these regions. The gate insulating film is a thin film of the perovskite structure which is formed in the form where a CaO layer touches the silicon substrate and is expressed with $Ca_2(Ti_{0.5},Zr_{0.5})O_4$. The thickness of a perovskite portion is one layer, and the index of RP type structure is 1 and is a RP1 type thin film.

The manufacturing method of the strained Si substrate was a method mentioned above about the example 9.

And at this time the amount of strain was plus 1%. Also in subsequent examples, the strained Si substrate which has the plus 1% amount of strain is used. Hereafter, the film forming process is explained briefly.

First, the CaO layer was grown epitaxially on the (001) Si substrate and the strained Si substrate using MBE. The surface of the Si substrate and the surface of the strained Si substrate were Hydrogen-terminated by HF processing and $NH_4F$, and CaO was formed as a film after an appropriate time. Although the planarizing of the substrate included many processing, the planarizing of the substrate used here was processing to a grade in which atomic steps did not appear in all over the gate insulating film. Since the region of the gate insulating film is becoming small now, the present processing method may be enough for planarizing processing.

The CaO thin film was grown for 2 ML under the environment where there is no ozone, the pressure was $10^{-7}$ Pa and the substrate temperature was 200 degrees centigrade, and the ozone flux $1.5 \times 10^{12}$ molecule/second $cm^2$ was irradiated to the film for 30 seconds under the environment where the pressure was $10^{-6}$ Pa and the substrate temperature was 200 degrees centigrade. Thereby, two layers of CaO layers were made. After growing the metal (Ti, Zr) for 1 ML on it so that Ti:Zr=0.5:0.5, the same ozone flux as the above was irradiated for 20 seconds.

Then, $(Ti_{0.5},Zr_{0.5})O_2$ film was grown for 1 ML. By repeating this process, $Ca_2(Ti_{0.5},Zr_{0.5})O_4$ thin film was grown epitaxially on the silicon substrate and the strained Si substrate.

Thus, finally the $Ca_2(Ti_{0.5},Zr_{0.5})O_4$ thin film was grown epitaxially for 51 angstroms by real thickness.

It was a thin gate insulating film with the thickness converted into $SiO_2$ thickness (EOT) of 6.6 angstroms, where the permittivity was about 31. Moreover, the leak current when applying a big electric field of 5 MV/cm was as small as $4 \times 10^{-2}$ $A/cm^2$. This is because the real thickness is as thick as 51 angstroms. On the no-strained silicon substrate, the leak current increased not a little to the twice value of $8 \times 10^{-2}$ $A/cm^2$. This is because of the noise accompanying the increase in an interface electric charge trap.

As a comparative example, the leak current of the insulating film which consists only of $SiO_2$ film in the same EOT when 5 MV/cm is applied by extrapolation is $10^5$ $A/cm^2$, and reached $2.5 \times 10^6$ times of that of the above-mentioned insulating film. From this, it has checked that the effect of having made quantum well structure in the insulating film of $Ca_2(Ti_{0.5},Zr_{0.5})O_4$ was very large.

Moreover, in the case of $Sr_2TiO_4$ thin film, in the same EOT, it remains in the improvement of about single figure compared with the case of SiON. That is, although the lattice constant is well in agreement with the lattice constant of +1% of strained Si substrate in $Sr_2TiO_4$ thin film, it means that it was proved that the barrier for electrons is not fully improved.

Next, the effect of the lattice constant of the gate insulating film being in agreement with the lattice constant of the substrate was investigated. The interface electric charge trap densities Dit ($cm^{-2}/eV$) of MOSFET made on the strained Si substrate were a quite low value of $10^{11}$ $cm^{-2}/eV$. Although this value is larger than the latest best value of $10^{10}$ $cm^{-2}/eV$ at SiO$_2$/Si interface, it is a quite desirable value. The effect of the lattice constant of the gate insulating film being in agreement with the lattice constant of the substrate and using the strained Si substrate enables the mobility being 850 (cm$^2$/Vsec) at the maximum. This value is the desirable value acquired since the lattice constant was in agreement with the lattice constant of the strained Si substrate. On the other hand, the interface electric charge trap density Dit (cm$^{-2}$/eV) of MOSFET on the no-strained silicon substrate was 4×10$^{11}$ cm$^{-2}$/eV. Since there was about 1% of deviation of the lattice constant, the interface electric charge trap density Dit was somewhat large. However, it was a still very desirable value. Although the mobility didn't rise by strain since Si substrate was used, the mobility of 435 (cm$^2$/Vsec) was realized at the maximum. This value can be called a desirable value if it takes into consideration that the lattice constant has shifted from the lattice constant of the silicon substrate about 1%.

If the lattice constant of the gate insulating film can be made more in agreement with the lattice constant of the substrate even if on the silicon substrate, the more desirable value of mobility is expectable. What is necessary to keep the barrier for electrons large enough is just to form for example, Ca$_2$(Ti$_{0.25}$,Zr$_{0.75}$)O$_4$ thin film in RP1 type structure, as shown in FIG. 26 and FIG. 27. In this case, as for mobility, 505 (cm$^2$/Vsec) is realized at the maximum.

If the lattice constant of the gate insulating film exceeds plus 1.5% of the substrate lattice constant, the interface electric charge trap will increase rapidly to 10$^{15}$ cm$^{-2}$/eV when the lattice constant is +2%. Therefore, it is necessary to keep the lattice constant of the gate insulating film less than plus 1.5%.

Also in RPn (n=2, 3, 4, . . . ) type gate insulating film, if the material in the optimum region shown in FIGS. 28 and 29 is used, the improvement of the same order in the characteristic of the leak current as the above will be seen. For example, as for the maximum of the mobility, 850 to 700 cm$^2$/Vsec is obtained on the strained Si substrate, and 505 to 400 is obtained on the Si substrate. When the difference of the lattice constant of the gate insulating film and the lattice constant of the substrate exceeds 1.5%, the interface electric charge trap increases rapidly to 10$^{14}$ cm$^{-2}$/eV at plus 2%, and the mobility decreases rapidly to below 225 cm$^2$/Vsec even on the strained Si substrate.

THE SEVENTEENTH EXAMPLE

Next, the MOSFET in which the material which is corresponds to the region A or Region B expressed in FIG. 32 is provided as the insulating film will be explained as the seventeenth example of the present invention. FIG. 33 expresses the case where Hf is introduced. As a result of creating MOSFET in parallel and comparing in the following example, there was almost no difference between the case of Zr and the case of Hf.

In FIG. 32, the region A expresses the range of materials optimum in the epitaxial growth on the silicon substrate and the region B expresses the range of materials optimum in the epitaxial growth on the +1% strained Si substrate.

As an example of actual MOSFET structure, the structure where Ca$_5$(Ti$_{0.5}$,Zr$_{0.5}$)$_3$O$_{11}$, i.e., Ca$_2$(Ti$_{0.5}$,Zr$_{0.5}$)O$_4$ and Ca$_3$(Ti$_{0.5}$,Zr$_{0.5}$)$_2$O$_7$ are laminated by turns will be explained in this example 17. The case on the silicon substrate and the case on plus 1% strained Si substrate will be explained as this example. It was possible to make the MOSFET which has the characteristic that the permittivity is large, the leak current is small and the mobility is large.

FIG. 34 is a sectional view of the gate insulating-film portion of MOSFET of the example of the invention. Since the structure was the same even if the strain of the substrate changed, the case of the silicon substrate and the plus 1% strained Si substrate was expressed collectively.

That is, in FET of this example, the source region S and the drain region D are formed on the surface of the (001) Si substrate or the strained Si substrate 171. And the gate electrode 173 is provided through the gate insulating film 172 on the channel region formed between these regions. The gate insulating film is a thin film which laminated by turns the Ruddlesden-Popper (RP) type structure which is formed in the form where a CaO layer touches a silicon substrate, and is expressed with Ca$_2$(Ti$_{0.5}$,Zr$_{0.5}$)O$_4$ and Ca$_3$(Ti$_{0.5}$,Zr$_{0.5}$)$_2$O$_7$.

The thickness of the perovskite portion is one layer or two layers, and the index of RP type structure is 1 or 2. That is, it is the mutual lamination thin film of RP1 type and RP2 type. The method mentioned above about the example 9 was used for the manufacturing method of the strained Si substrate. And the amount of strain at this time was plus 1%. Also in subsequent examples, the strained Si substrate which has +1% of this amount of strain will be used. Hereafter, a film forming process is explained briefly.

First, the CaO layer was grown epitaxially on the (001) Si substrate and the strained Si substrate using MBE. The surface of the Si substrate and the surface of the strained Si substrate were Hydrogen-terminated by HF processing and NH$_4$F, and CaO was formed as a film after an appropriate time. Although the planarizing of the substrate included many processing, the planarizing of the substrate used here was processing to a grade in which atomic steps did not appear in all over the gate insulating film. Since the region of the gate insulating film is becoming small now, the present processing method may be enough for planarizing processing.

The CaO thin film was grown for 2 ML under the environment where there is no ozone, the pressure was 10$^{-7}$ Pa and the substrate temperature was 200 degrees centigrade, and the ozone flux 1.5×10$^{12}$ molecule/second cm$^2$ was irradiated to the film for 30 seconds under the environment where the pressure was 10$^{-6}$ Pa and the substrate temperature was 200 degrees centigrade. Thereby, two layers of CaO layers are made. After growing the metal (Ti, Zr) for 1 ML on it so that Ti:Zr=0.5:0.5, the same ozone flux as the above was irradiated for 20 seconds. Then, the (Ti$_{0.5}$,Zr$_{0.5}$)O$_2$ film was grown for 1 ML.

Next, after growing the metal (Ti, Zr) for 2 ML on it so that Ti:Zr=0.5:0.5, the same ozone flux as the above was irradiated for 40 seconds. Then, the (Ti$_{0.5}$,Zr$_{0.5}$)O$_2$ film was grown for 2 ML. And, the mutual lamination thin film of RP1 type and RP2 type grew epitaxially on the silicon substrate and the strained Si substrate by repeating this process.

Thus, finally the Ca$_2$(Ti$_{0.5}$,Zr$_{0.5}$)O$_4$ thin film was grown epitaxially for 52 angstroms by real thickness.

It was a thin gate insulating film with the thickness converted into SiO$_2$ thickness (EOT) of 4.5 angstroms, where the permittivity was about 45. Moreover, the leak current when applying the big electric field of 5 MV/cm was as small as 1.2×10$^{-3}$ A/cm$^2$ on the strained Si substrate. This is because real thickness is as thick as 52 angstroms.

However, since it increased also to it, well structure was made by having laminated RP1+RP2 and by turns and the level inside a well was leveled completely, it is large as an effect that the barrier for electrons went up greatly. On the silicon substrate, the leak current increased to a twice value of $2.5 \times 10^{-3}$ A/cm$^2$. This is because of the noise accompanying the increase in an interface electric charge trap.

As a comparative example, the leak current of the insulating film which consists only of SiO$_2$ film in the same EOT when 5 MV/cm is applied by extrapolation is $8 \times 10^5$ A/cm$^2$, and reached $6.7 \times 10^8$ times of that of the above-mentioned insulating film. From this, it has checked that the effect of the multi quantum well structure gate insulating film laminated by turns of RP1+RP2 was very large.

Next, the effect that the lattice constant of the gate insulating film was in agreement with the lattice constant of the substrate was investigated.

The interface electric charge trap density Dit (cm$^{-2}$/eV) of MOSFET made on the strained Si substrate was quite low value of $2 \times 10^{11}$ cm$^{-2}$/eV. Although this value is larger than the latest best value of $10^{10}$ cm$^{-2}$/eV at SiO$_2$/Si interface, it is a quite desirable value. The effect of the lattice constant of the gate insulating film being in agreement with the lattice constant of the substrate and using the strained Si substrate enables the mobility being 800 (cm$^2$/Vsec) at the maximum. This value is the desirable value acquired only when the lattice constant was shifted for only 0.5% to the lattice constant of the strained Si substrate.

On the other hand, the interface electric charge trap density Dit (cm$^{-2}$/eV) of the MOSFET on the silicon substrate was $8 \times 10^{11}$ cm$^{-2}$/eV. Since there was about 1.5% of deviation of the lattice constant, the interface electric charge trap density Dit was somewhat large. Consequently, although the mobility doesn't rise for the strain since the Si substrate is used, the mobility is realized 400 (cm$^2$/Vsec) at the maximum. This value can be called good value if it takes into consideration that the lattice constant has shifted from the lattice constant of a silicon substrate about 1.5%. However, it was a still very desirable value.

If the lattice constant of the gate insulating film can be made more in agreement with the lattice constant of the substrate even if on the silicon substrate, the more desirable value of mobility is expectable. Since a discrete energy level is formed and the well structure is made in RP1+RP2 type structure, the barrier for electrons can be kept large enough as long as this structure is maintained. Therefore, what is necessary is to consider only a lattice constant. As for the thin film which laminated by turns RP type structure expressed with Ca$_2$(Ti$_{0.5}$,Zr$_{0.5}$)O$_4$, Ca$_3$(Ti$_{0.5}$,Zr$_{0.5}$)$_2$O$_7$, (Ca$_{0.4}$,Sr$_{0.6}$)$_2$TiO$_4$ and (Ca$_{0.4}$,Sr$_{0.6}$)$_3$Ti$_2$O$_7$ as examples, a lattice constant is in agreement with a silicon substrate. Therefore, it was possible to have created MOSFET (for the former two materials to be 505 cm$^2$/Vsec and for the latter two materials to be 455 cm$^2$/Vsec) which shows high mobility. Although the performance is falling [latter ones] about ten percent, since the substance which constitutes an interface is (Ca0.4, Sr0.6)O, this is because roughness is made to the interface compared with the time of CaO. However, the effect of the difference of a lattice constant is far more important, and as long as it makes the demerit of (Ca0.4, Sr0.6)O being a mixed crystal completely like the creation process of a CaO film, you may say that there is almost nothing.

If the lattice constant of the gate insulating film exceeds plus 1.5% of the substrate lattice constant, an interface electric charge trap will increase rapidly to $10^{14}$ cm$^{-2}$/eV at +2% of the lattice constant. Therefore, it is necessary to stop the lattice constant of the gate insulating film by +1.5%. You may think that this point is a request in the case of creating the thin film of rocksalt structure on a silicon substrate or a strained Si substrate. If it is rocksalt structure, mixed crystal films, such as (Ca0.4, Sr0.6)O, is also the same, and in order to create a good interface, it is required for a lattice constant difference with a substrate to be less than 1.5%.

Although it was here shown in the example on the strained Si substrate that Ca$_2$(Ti$_{0.5}$,Zr$_{0.5}$)O$_4$ and the lamination structure of Ca$_3$(Ti$_{0.5}$,Zr$_{0.5}$)$_2$O$_7$ are promising, it is Sr$_2$TiO$_4$ and Sr$_3$Ti$_2$O$_7$ lamination structure etc. is promising. Since it is necessary especially as a B site to make temperature of K cell into high temperature in MBE growth to use Zr and Hf, the film forming of only Ti is easier. At the meaning, it is Sr$_2$TiO$_4$. And it can be said that the lamination structure of Sr$_3$Ti$_2$O$_7$ is more effective. This point is being able to say similarly about other examples. This means being so effective, if B site is the substance of only Ti even if strain is on a silicon substrate and there is nothing, since it is concerned with the ease of MBE film forming.

THE EIGHTEENTH EXAMPLE

Next, the MOSFET in which the material which is correspond to the region A or the region B expressed in FIG. 35 is provided as the insulating film will be explained as the eighteenth example of the present invention. FIG. 36 expresses the case where Hf is introduced. As a result of creating MOSFET in parallel and comparing in the following example, there was almost no difference between the case of Zr and the case of Hf.

In FIG. 35, the region A expresses the range of materials optimum in the epitaxial growth on the silicon substrate and the region B expresses the range of materials optimum in the epitaxial growth on the +1% strained Si substrate. In this example 18, the case of Sr$_3$TiO$_5$ is explained as an example of actual MOSFET structure. Hereafter, the case on the silicon substrate and the case on plus 1% strained Si substrate are described as this example. It was possible to make the MOSFET which has the characteristic that the permittivity is large, the leak current is small and the mobility is large.

FIG. 37 is a sectional view of the gate insulating-film portion of the MOSFET of the example of the invention. Since the structure is the same even if the strain of the substrate changes, the case of silicon substrate or +1% strained Si substrate is expressed.

That is, in FET of this example, the source region S and the drain region D are formed on the surface of the (001) Si substrate or the strained Si substrate 181. And the gate electrode 183 is provided through the gate insulating film 182 on the channel region formed between these regions. The gate insulating film is a thin film of the "in phase structure" expressed with Sr$_3$TiO$_5$, which the SrO layer is formed in the form which touches a silicon substrate. In "in phase structure", as mentioned above, when two layers of AO(s) are inserted, the B-O axis of the direction of thickness of ABO$_3$ will be in agreement. That is, the phase of ABO$_3$ is in agreement in the direction of thickness. Moreover, since it expresses like IPn according to the number n of layers of the perovskite type substance ABO$_3$, it will be called IP1 structure here. The method described in the example 9 is used for the manufacturing method of the strained Si substrate. And the amount of strain at this time was +1%. Also in subsequent examples, the strained Si substrate which has +1% of this amount of strain will be used. Hereafter, a film forming process is explained briefly.

First, the CaO layer was grown epitaxially on the (001) Si substrate and the strained Si substrate using MBE. The surface of the Si substrate and the surface of the strained Si substrate were Hydrogen-terminated by HF processing and NH$_4$F, and SrO was formed as a film after an appropriate time. Although the planarizing of the substrate included many processing, the planarizing of the substrate used here was processing to a grade in which atomic steps did not appear in all over the gate insulating film. Since the region of the gate insulating film is becoming small now, the present processing method may be enough for planarizing processing.

The SrO thin film was grown for 3 ML under the environment where there is no ozone, the pressure was $10^{-7}$ Pa and the substrate temperature was 200 degrees centigrade, and the ozone flux $1.5 \times 10^{12}$ molecule/second cm$^2$ was irradiated to the film for 45 seconds under the environment where the pressure was $10^{-6}$ Pa and the substrate temperature was 200 degrees centigrade.

Thereby, three layers of SrO layers were made. After growing the Ti metal for 1 ML on it, the same ozone flux as the above was irradiated for 20 seconds. Then, TiO$_2$ film was grown for 1 ML. By repeating this process, Sr$_3$TiO$_5$ thin film was grown epitaxially on the silicon substrate and the strained Si substrate.

Thus, finally the Sr$_3$TiO$_5$ thin film was grown epitaxially for 60 angstroms by real thickness.

It was a thin gate insulating film with the thickness converted into SiO$_2$ thickness (EOT) of 6.9 angstroms, where the permittivity was about 34. Moreover, the leak current when applying a big electric field of 5 MV/cm was as small as $5 \times 10^{-6}$ A/cm$^2$ on the Si substrate. This is because the real thickness is as thick as 51 angstroms. However, since well structure was made by RP1 structure film and the level inside a well was leveled completely, the influence that the barrier for electrons went up greatly affects thickness is the largest. On the no-strained silicon substrate, the leak current increased not a little to the twice value of $10^{-5}$ A/cm$^2$. This is because of the noise accompanying the increase in an interface electric charge trap.

As a comparative example, the leak current of the insulating film which consists only of SiO$_2$ film in the same EOT when 5 MV/cm is applied by extrapolation is $10^5$ A/cm$^2$, and reached $2 \times 10^{10}$ times of that of the above-mentioned insulating film. From this, it has checked that the effect of the Sr$_3$TiO$_5$ insulating film was very large.

Next, the effect of the lattice constant of the gate insulating film being in agreement with the lattice constant of the substrate was investigated. The interface electric charge trap densities Dit (cm$^{-2}$/eV) of MOSFET made on the strained Si substrate were a quite low value of $10^{11}$ cm$^{-2}$/eV. Although this value is larger than the latest best value of $10^{10}$ cm$^{-2}$/eV at SiO$_2$/Si interface, it is a quite desirable value.

Consequently, as for the mobility, 500 (cm$^2$/Vsec) was realized at the maximum. This value is the desirable value acquired since the lattice constant was in agreement with the lattice constant of the strained Si substrate. On the other hand, the interface electric charge trap density Dit (cm$^{-2}$/eV) of MOSFET on the no-strained silicon substrate was $4 \times 10^{11}$ cm$^{-2}$/eV. Since there was about 1% of deviation of the lattice constant, the interface electric charge trap density Dit was somewhat large. However, it was a still very desirable value. The mobility also raised by strain since the strain Si substrate was used, and the mobility of 750 (cm$^2$/Vsec) was realized at the maximum. This value can be called a desirable value if it takes into consideration that the lattice constant has shifted from the lattice constant of the silicon substrate about 1%.

If the lattice constant of the gate insulating film can be made more in agreement with the lattice constant of the substrate even if on the silicon substrate, the more desirable value of mobility is expectable. What is necessary to keep the barrier for electrons large enough is just to form for example, Ca$_3$(Ti$_{0.7}$,Zr$_{0.3}$)O$_5$ thin film, Sr$_3$(Ti$_{0.2}$,Zr$_{0.8}$)O$_5$ thin film and (Ba$_{0.6}$,Sr$_{0.4}$)$_3$TiO$_5$ thin film in RP1 type structure, as shown in FIG. 26A and FIG. 26B. In this case, as for mobility, 850, 850 and 840 (cm$^2$/Vsec) are realized at the maximum, respectively.

If the lattice constant of the gate insulating film exceeds plus 1.5% of the substrate lattice constant, the interface electric charge trap will increase rapidly to $10^{15}$ cm$^{-2}$/eV when the lattice constant is +2%. Therefore, it is necessary to keep the lattice constant of the gate insulating film less than plus 1.5%.

Also in IP n (n=2, 3, 4, ... ) type gate insulating film, if the material in the optimum region is used, the improvement of the same order in the characteristic of the leak current as the above will be seen. For example, as for the maximum of the mobility, 850 to 700 cm$^2$/Vsec is obtained on the strained Si substrate, and 505 to 400 are obtained on the Si substrate. When the difference of the lattice constant of the gate insulating film and the lattice constant of the substrate exceeds 1.5%, the interface electric charge trap increases rapidly to $10^{14}$ cm$^{-2}$/eV at plus 2%, and the mobility decreases rapidly to below 225 cm$^2$/Vsec even on the strained Si substrate.

Furthermore, the case where the thickness of the barrier portion is larger can also be considered. As structure when the thickness of the barrier portion is still larger, since well structure is realized, it becomes a very ideal material group from a viewpoint of a barrier for electrons. Therefore, it will be judged whether the mismatch of the lattice constant is fundamentally contained in less than plus-or-minus 1.5% of the lattice constant of the substrate in this case.

Since an electron and a hole are confined in the inside of the well with well structure, it becomes unnecessary for the thickness to be large. It is ideal if the permittivity is larger than 20, however, it may be employable if the permittivity is larger than 10. When the thickness of a barrier increased, since the permittivity of the whole film was the direction which becomes low, the problem was seemed, but about by ten, if permittivity is good, also when a barrier becomes to some extent thick, it can use it as an insulating film. Although all structures could not be shown, trial production and consideration at the time of making a barrier layer into three or more (it having been made to change variously also about a well portion) layers further were also performed. Although permittivity actually fell somewhat, in the leak characteristic, the problem was not produced at all. The point is that when a too thick barrier is made, a multi quantum well structure having a small EOT may not be obtained.

THE NINETEENTH EXAMPLE

Next, the MOSFET in which the material which is corresponds to the region A or Region B expressed in FIG. 38 is provided as the insulating film will be explained as the nineteenth example of the present invention. FIG. 39 expresses the case where Hf is introduced. As a result of creating MOSFET in parallel and comparing in the following example, there was almost no difference between the case of Zr and the case of Hf.

In FIG. 38, the region A expresses the range of materials optimum in the epitaxial growth on the silicon substrate and the region: B expresses the range of materials optimum in the epitaxial growth on the +1% strained Si substrate. As an example of actual MOSFET structure, the structure where $Sr_7Ti_3O_{13}$, i.e., $Sr_3TiO_5$ and $Sr_4Ti_2O_8$ are laminated by turns will be explained in this example 19. The case on the silicon substrate and the case on plus 1% strained Si substrate will be explained as this example. It was possible to make the MOSFET which has the characteristic that the permittivity is large, the leak current is small and the mobility is large.

Figure 40:
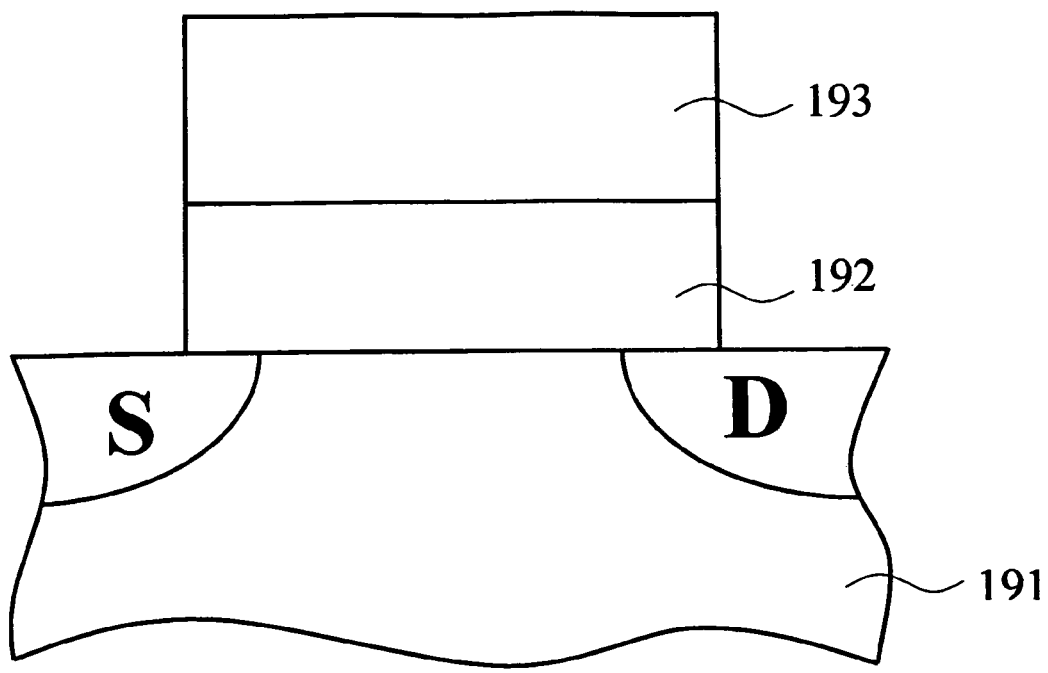
FIG. 40 is a schematic diagram showing MOSFET using the insulating film expressed in FIGS. 35 and 36.

FIG. 40 is a sectional view of the gate insulating-film portion of MOSFET of the example of the invention. Since the structure was the same even if the strain of the substrate changed, the case of the silicon substrate and the plus 1% strained Si substrate was expressed collectively.

That is, in FET of this example, the source region S and the drain region D are formed on the surface of the (001) Si substrate or the strained Si substrate 191. And the gate electrode 193 is provided through the gate insulating film 192 on the channel region formed between these regions. The gate insulating film is formed in the form where the SrQ layer touches the silicon substrate, and is a thin film in which the In-Phase (IP) structure expressed with $Sr_3TiO_5$ and $Sr_4Ti_2O_8$ is laminated by turns.

The thickness of a perovskite portion is one layer or two layers, and the index of IP type structure is 1 or 2. That is, it is the mutual lamination thin film of IP1 type and IP2 type. The method described in the example 9 is adopted as a manufacturing method of the strained Si substrate. And the amount of the strain at this time was +1%. Also in subsequent examples, the strained Si substrate which has +1% of this amount of strain will be used. Hereafter, a film forming process is explained briefly.

First, the SrO layer was grown epitaxially on the (001) Si substrate and the strained Si substrate using MBE. The surface of the Si substrate and the surface of the strained Si substrate were Hydrogen-terminated by HF processing and $NH_4F$, and SrO was formed as a film after an appropriate time. Although the planarizing of the substrate included many processing, the planarizing of the substrate used here was processing to a grade in which atomic steps did not appear in all over the gate insulating film. Since the region of the gate insulating film is becoming small now, the present processing method may be enough for planarizing processing.

The SrO thin film was grown for 3 ML under the environment where there is no ozone, the pressure was $10^{-7}$ Pa and the substrate temperature was 200 degrees centigrade, and the ozone flux $1.5 \times 10^{12}$ molecule/second $cm^2$ was irradiated to the film for 45 seconds under the environment where the pressure was $10^{-6}$ Pa and the substrate temperature was 200 degrees centigrade. Then, SrO film was grown for 3 ML. After growing Ti metal for 1 ML, the same ozone flux as the above was irradiated for 20 seconds. Then, $TiO_2$ film was grown for 1 ML.

Next, after growing the SrO layer for 3 ML, Ti metal was grown for 2 ML and the same ozone flux as the above was irradiated for 40 seconds. Thereby, $TiO_2$ film was grown for 2 ML. By repeating this process, the thin film laminated by IP1 type and IP2 type was grown epitaxially on the silicon substrate and the strained Si substrate.

Thus, finally the $Sr_7Ti_3O_{13}$ thin film was grown epitaxially for 94 angstroms by real thickness. It was a thin gate insulating film with the thickness converted into $SiO_2$ thickness (EOT) of 6.8 angstroms, where the permittivity was about 54. Moreover, the leak current when applying a big electric field of 5 MV/cm was as small as $5 \times 10^{-6}$ $A/cm^2$. This is because the real thickness is as thick as 94 angstroms. However, since it increased also to it, well structure was made by having laminated IP1+IP2 and by turns and the semi-grade inside a well was leveled completely, it is large as an effect that the barrier for electrons went up greatly. On the no-strained silicon substrate, the leak current increased not a little to the twice value of $10^{-5}$ $A/cm^2$. This is because of the noise accompanying the increase in an interface electric charge trap.

As a comparative example, the leak current of the insulating film which consists only of $SiO_2$ film in the same EOT when 5 MV/cm is applied by extrapolation is $10^5$ $A/cm^2$, and reached $2 \times 10^{10}$ times of that of the above-mentioned insulating film. From this, it has checked that the effect of the multi quantum well structure gate insulating film laminated by turns of IP1+IP2 was very large.

Next, the effect of the lattice constant of the gate insulating film being in agreement with the lattice constant of the substrate was investigated. The interface electric charge trap densities Dit ($cm^{-2}/eV$) of MOSFET made on the strained Si substrate were a quite low value of $1.5 \times 10^{11}$ $cm^{-2}/eV$. Although this value is larger than the latest best value of $10^{10}$ $cm^{-2}/eV$ at $SiO_2/Si$ interface, it is a quite desirable value.

The effect of the lattice constant of the gate insulating film being in agreement with the lattice constant of the substrate and using the strained Si substrate enables the mobility being 825 ($cm^2/Vsec$) at the maximum.

This value is the desirable value acquired since the lattice constant shifted for only 0.25% to the lattice constant of the strained Si substrate.

On the other hand, the interface electric charge trap density Dit ($cm^{-2}/eV$) of MOSFET on the no-strained silicon substrate was $3 \times 10^{11}$ $cm^{-2}/eV$. Since there was about 0.75% of deviation of the lattice constant, the interface electric charge trap density Dit was somewhat large. However, it was a still very desirable value. Although the mobility didn't rise by strain since Si substrate was used, the mobility of 455 ($cm^2/Vsec$) was realized at the maximum. This value can be called a desirable value if it takes into consideration that the lattice constant has shifted from the lattice constant of the silicon substrate about 0.75%.

If the lattice constant of the gate insulating film can be made more in agreement with the lattice constant of the substrate even if on the silicon substrate, the more desirable value of mobility is expectable. With IP1+IP2 type structure, a discrete energy level is formed and the well structure is made. Therefore, the barrier for electrons can be kept large enough as long as this structure is maintained. Therefore, in the thin film which laminated by turns IP type structure expressed with $(Sr_{0.2},Ca_{0.8})_3TiO_5$ and $(Sr_{0.2},Ca_{0.8})_4Ti_2O_8$ that what is necessary is to pay its attention only to a lattice constant, since a lattice constant was in agreement with a silicon substrate, it was possible to have created MOSFET (501 $cm^2/Vsec$) which shows high mobility.

If the lattice constant of the gate insulating film exceeds +1.5% of the substrate lattice constant, the interface electric charge trap will increase rapidly to $10^{14}$ $cm^{-2}/eV$ at plus 2% of the lattice constant. Therefore, it is necessary to keep the lattice constant of the gate insulating film less than +1.5%. You may think that this point is a request in the case of making the thin film of rocksalt structure on the silicon substrate or the strained Si substrate. If it is rocksalt structure, mixed crystal films, such as $(Ca_{0.8},Sr_{0.2})O$, are also the same, and in order to make a good interface, it is required for the difference of the lattice constant with the substrate to be less than 1.5%.

Although it was here shown in the example on the strained Si substrate that the lamination structure of $Sr_3TiO_5$ and $Sr_4Ti_2O_8$ is promising, other lamination structures, e.g., a lamination structure of $Ca_3(Ti_{0.5},Zr_{0.5})O_5$ and $Ca_4(Ti_{0.5}, Zr_{0.5})_2O_8$, are promising.

THE TWENTIETH EXAMPLE

Next, the MIM capacitor in which the insulating film which has the IP1+IP2 type quantum well structure of SRO electrode/(IP1+IP2) thin film/SRO electrode is provided will be explained as the twentieth example of the invention.

Figure 41:
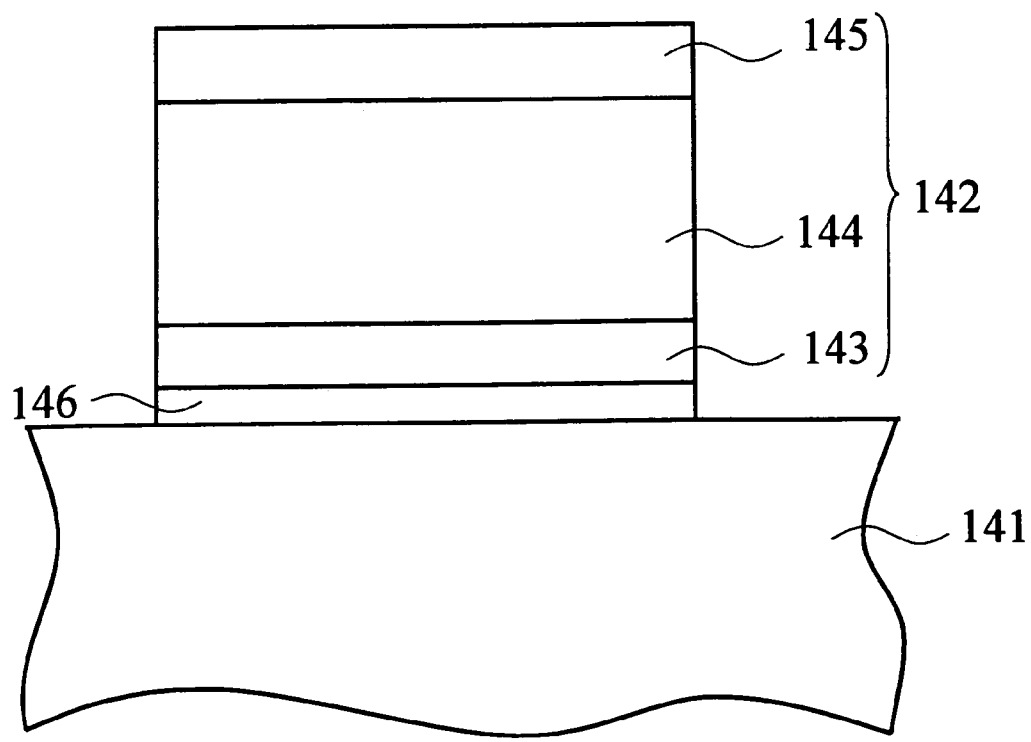
FIG. 41 is a sectional view of the gate insulating film of MOSFET.

FIG. 41 is a sectional view of the MIM capacitor of this example. That is, this figure expresses a sectional view of the MIM capacitor in which the quantum well is provided in its insulating-film. IP1+IP2 constitute the insulator film especially. When the high dielectric constant film or the ferroelectric material film is used for the insulating-film portion and an MIM capacitor is constituted from each case, dielectric property is good, and moreover leaks and an MIM capacitor with small current can be constituted. Here, SrRuO3 is used as the electrode.

Hereafter, this MIM capacitor is explained according to the manufacturing process.

The capacitor was grown epitaxially on the (001) Si substrate 101 using MBE. That is, $SrTiO_3$ layer 146 was grown epitaxially on the Si by the same method as the tenth example.

Moreover, the $SrRuO_3$ electrode 143 was grown epitaxially, and the $(Ba_{0.6},Sr_{0.4})O(001)$ layer was grown epitaxially on the $SrRuO_3$ electrode 143. The thickness of (Ba, Sr)O layers was made into about 5.4 angstroms.

The $(Ba_{0.6},Sr_{0.4})TiO_3(001)$ layers was grown epitaxially for 3.95 angstroms on the $(Ba_{0.6},Sr_{0.4})O(001)$ layer. Furthermore, $(Ba_{0.6},Sr_{0.4})O(001)$ film was grown epitaxially for the same thickness of 5.4 angstroms as the above on the (Ba, Sr)$TiO_3$ film. Furthermore, the $(Ba_{0.6},Sr_{0.4})TiO_3(001)$ layers 107 was grown epitaxially for 7.9 angstroms on the $(Ba_{0.6}, Sr_{0.4})O(001)$ film. Furthermore, the $(Ba_{0.6},Sr_{0.4})O(001)$ film was grown epitaxially for the same thickness of 5.4 angstroms as the above on the (Ba,Sr) $TiO_3$ layers. This process of forming was repeated further three times (dielectric film 144), and the $SrRuO_3$ electrode 145 was grown epitaxially on it. At this time, all the thickness of the dielectric 144 was 74 angstroms.

The condition of forming the capacitor was made that the pressure was $10^{-6}$ Pa, the substrate temperature was 600 degrees centigrade, and the ozone flux is $1.5 \times 10^{12}$ molecule/second $cm^2$.

Thus, the obtained insulating film was a capacitor with the thin thickness of 4.98 angstroms converted into $SiO_2$ thickness (EOT). Moreover, the leak current when applying the big electric field of 5 MV/cm was as small as $2 \times 10^{-4}$ A/$cm^2$.

As a comparative example, the leak current of the insulating film which consists only of $SiO_2$ film in the same EOT when 5 MV/cm is applied by extrapolation is $5 \times 10^5$ A/$cm^2$, and reached $2.5 \times 10^9$ times of that of the above-mentioned insulating film. From this, it has checked that the effect of having made quantum well structure in the insulating film of MIM capacitor was very large.

Furthermore, the case where the ferroelectric film is used as a dielectric film of this example is explained as a modification of this example. The $SrRuO_3$ electrode 143 was grown epitaxially and the BaO (001) layer was grown epitaxially on the $SrRuO_3$ electrode 143 as the above. The thickness of the BaO layer was made into about 5.5 angstroms.

The $BaTiO_3$ (001) layer was grown epitaxially for 4 angstroms on the BaO layer. Furthermore, BaO (001) film was grown epitaxially for the same thickness of 5.5 angstroms as the above on the $BaTiO_3$ film. Furthermore, the $BaTiO_3$ (001) layer 107 was grown epitaxially for 8 angstroms on the BaO layer. Furthermore, BaO (001) film was grown epitaxially for the same thickness of 5.5 angstroms as the above on the $BaTiO_3$ film. This process of forming was repeated further three times (dielectric film 144), and the $SrRuO_3$ electrode 145 was grown epitaxially on it. At this time, all the thickness of the dielectric 144 was 75.5 angstroms.

The insulating film was a capacitor with the thin thickness of 5.9 angstroms converted into $SiO_2$ thickness (EOT). Moreover, the leak current when applying the big electric field of 5 MV/cm was as small as $4 \times 10^{-5}$ A/$cm^2$. As a comparative example, the leak current of the insulating film which consists only of $SiO_2$ film in the same EOT when 5 MV/cm is applied by extrapolation is $2 \times 10^6$ A/$cm^2$, and reached $5 \times 10^9$ times of that of the above-mentioned insulating film. From this, it has checked that the effect of having made quantum well structure in the insulating film of MIM capacitor was very large.

Moreover, in this MIM capacitor, it turned out that the polarization occurred and the MIM structure of a ferroelectric thin film was made. Since the axis of the direction of thickness of each dielectric layer was assembled, the characteristic as a ferroelectric material was also very large, and it turned out that the size of intrinsic polarization has the very large value which also reaches 48 micro C/$cm^2$. The value of leak current is also very small, and since spontaneous polarization is very large, it is very promising as a ferroelectric-random-access-memory-oriented MIM capacitor.

THE TWENTY FIRST EXAMPLE

The MOSFET (MOS type field effect transistor) in which the insulating film which has the double quantum well structure with buffer layer, i.e., $CeO_2$ (buffer layer)/SrO/$CeO_2$/SrO/$CeO_2$/SrO, is provided will be explained as the twenty-first example of the present invention.

Figure 42:
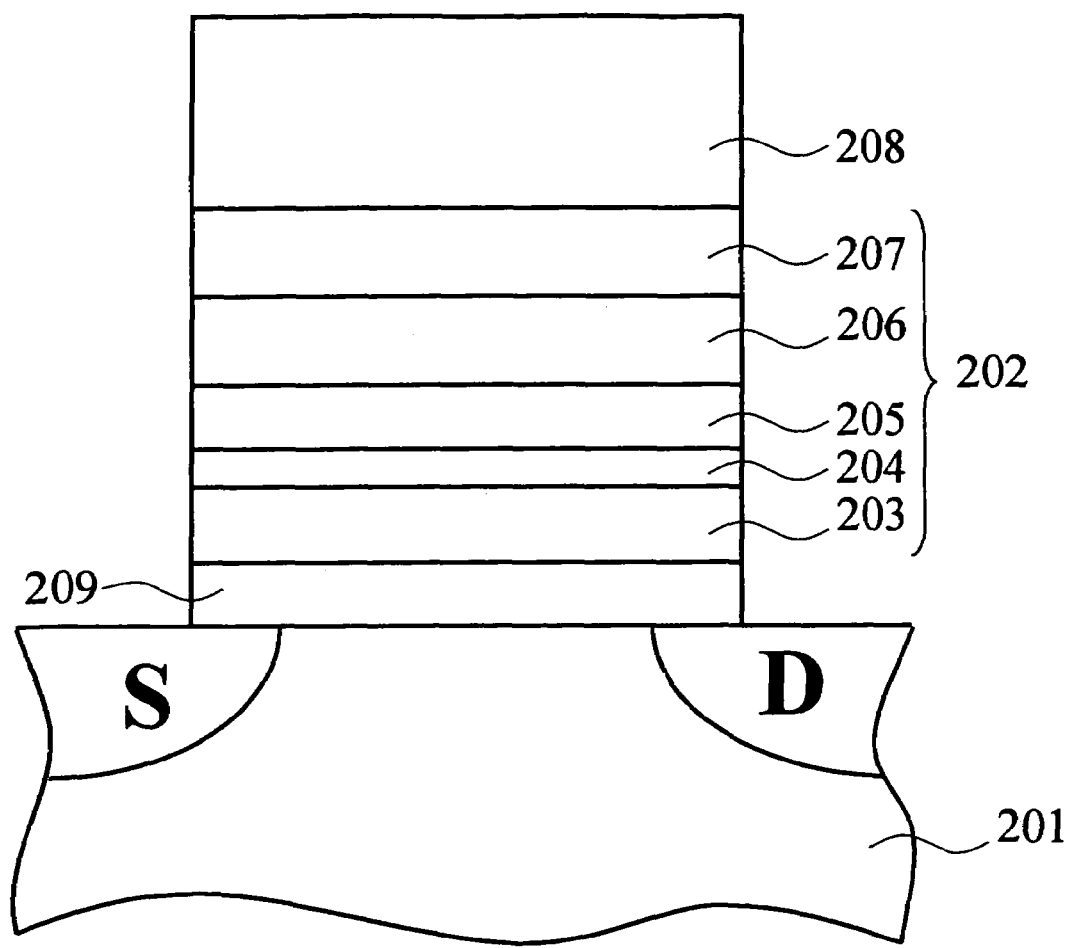
FIG. 42 is a sectional view of the gate insulating film with the double quantum well of MOSFET.

FIG. 42 is a sectional view of the gate insulating-film of MOSFET of the twenty-first example of the invention. That is, in FET of this example, the source region S and the drain region D are formed on the surface of the (001) Si substrate or the strained Si substrate 201. And the gate electrode 208 is provided through the buffer layer 209 and the gate insulating film 202 on the channel region formed between these regions. The gate insulating film has the double quantum well structure where the SrO barrier layer 203, the $CeO_2$ well layer 204, the SrO barrier layer 205, the $CeO_2$ well layer 206, and the SrO barrier layer 207 were made to laminate.

Hereafter, this insulating film 202 is explained in more detail along with that manufacture procedure.

That is, the (111) Si substrate 201 was Hydrogen-terminated by HF processing and $NH_4F$, and $CeO_2$ was formed as a film after an appropriate time. Here, if it restricts when the flat nature of Si substrate is bad, it is also possible to put in epitaxial growth of Si regardless of a plane direction in the first step of a process. It is possible for this to obtain Si substrate which overly has a flat side. Buffer $CeO_2$ (111) layer 209 was grown epitaxially thick for 14.1 angstroms. The condition of forming the portion of capacitor was made that the pressure was $10^{-6}$ Pa, the substrate temperature was 700 degrees, and the ozone flux is $8.8 \times 10^{12}$ molecule/second $cm^2$.

The SrO (111) layer 203 was grown epitaxially. The thickness of the SrO layer was made into about 5 angstroms. The condition of forming was made that the pressure was $10^{-6}$ Pa, the substrate temperature was 700 degrees centigrade, and the ozone flux is $1.2 \times 10^{12}$ molecule/second $cm^2$.

Next, the $CeO_2$ (111) layers 204 was grown epitaxially for 4.7 angstroms on the SrO film. The condition of forming the capacitor was made that the pressure was $10^{-6}$ Pa, the substrate temperature was 700 degrees centigrade, and the ozone flux is $8.8 \times 10^{12}$ molecule second $cm^2$.

Furthermore, the SrO (111) films 205 was grown epitaxially for 5 angstroms on the CeO2 film under the environment that the pressure was $10^{-6}$ Pa, the substrate temperature was 700 degrees centigrade, and the ozone flux was $1.2 \times 10^{12}$ molecule/second $cm^2$. Then, $CeO_2$ was grown epitaxially for only 9.4 angstroms and SrO film was grown epitaxially for 5 angstroms under the same environment as the above. And gold (Au) was formed as a film by vapor deposition on it as the gate electrode 208.

Thus, the obtained insulating film 202 was an insulating film with the thin thickness converted into $SiO_2$ thickness (EOT) of 8.1 angstroms. Moreover, the leak current when applying the electric field of 5 MV/cm was as small as $5 \times 10^{-6}$ $A/cm^2$.

As a comparative example, the leak current of the insulating film which consists only of $SiO_2$ film in the same EOT when 5 MV/cm is applied by extrapolation is $1 \times 10^3$ $A/cm^2$, and reached $2 \times 10^8$ times of that of the above-mentioned insulating film. From this, it has checked that the effect of having made quantum well structure in the insulating film was very large even if the buffer layer existed. When that $CeO_2$ buffer layer is used, it is surmised that EOT increases about 1 angstrom. If it is this EOT, it must be leak current which originally cuts $10^{-6}$ $A/cm^2$, but it seems that the leak current corresponding to 7 A reduced by about 1 A as EOT in fact is flowing. However, it has still proved that the well type insulating-film structure was effective.

Next, it was investigated in detail about the interface. In the case where the $CeO_2$ buffer layer was used, the interface level density by strain of an interface has been reduced figures double or more than in the case where it was laminated from SrO. Although CeO2 of a barrier (as opposed to an electron at an interface with Si) is low, the lattice constant difference with Si is small. Since the difference of the lattice constant is small, it becomes easy not only to grow epitaxially on Si, but also to reduce the fall of the mobility of the transistor by an interface level. Moreover, since the permittivity of $CeO_2$ is very large, the buffer layer portion hardly affects the potential drop. Therefore, since the first layer was constituted thickly, the whole insulating film was improved very much. This point has to be noted.

Heretofore, embodiments of the invention have been explained in detail with reference to some specific examples. The invention, however, is not limited to these specific examples.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An electronic device capable to operate as a capacitor, comprising:
    a first electrode;
    an insulating film provided on the first electrode, including:
        n (n being an integer larger than 1) layers of barrier layers each consisting of a material having a bandgap larger than a first bandgap and having a relative permittivity smaller than a first relative permittivity; and
        (n−1) layers of well layers each consisting of a material having a bandgap smaller than the first bandgap and having a relative permittivity larger than the first relative permittivity,
        each of the barrier layers and each of the well layers being stacked by turns,
        discrete energy levels being formed in each of the well layers by a quantum effect,
        thicknesses of the n layers of the barrier layers being not smaller than 2.5 angstroms, and
        a thickness dm (angstrom) (m=1, 2, ... n) and a relative permittivity $\epsilon m$ (m=1, 2, ... n) of an m-th barrier layer (m=1, 2, ... n) satisfying the condition $2.5 > (d1/\epsilon 1 + d2/\epsilon 2 + ... + dn/\epsilon n)$; and
    a second electrode provided on the insulating film.

2. The electronic device according to claim 1, wherein the first bandgap is a bandgap of $SiO_2$.

3. The electronic device according to claim 1, wherein the first and second barrier layers each have a thickness not smaller than 3.5 angstroms.

4. The electronic device according to claim 1, wherein a thickness of at least one of the well layers is not larger than 5 angstroms.

5. The electronic device according to claim 1, wherein energy levels of conduction bands of the barrier layers are higher than an energy level of a conduction band of silicon by 1.0 electron volt or more, and energy levels of valence bands of the barrier layers are lower than an energy level of a valence band of silicon by 1.0 electron volt or more.

6. The electronic device according to claim 1, wherein the barrier layers each consists of a material having a conduction band whose energy level is higher than an energy level of a conduction band of silicon by 0.5 electron volts or more and having a valence band whose energy level is lower than an energy level of a valence band of silicon by 0.5 electron volts or more, and
    the well layers each consists of a material having a bandgap smaller than a bandgap of $SiO_2$ and having a relative permittivity larger than a relative permittivity of $SiO_2$, and a thickness of the well layer being not larger than 10 angstroms.

7. The electronic device according to claim 1, wherein the barrier layers each consists of a material selected from the group consisting of (Ba,Sr,Ca)O, $SiO_2$, $Si_3N_4$, SiON, $Al_2O_3$, Hf-silicate, nitride of Hf-silicate, Zr-silicate, nitride of Zr-silicate, Ti-silicate, nitride of Ti-silicate and $MgAl_2O_4$, (Ba,Sr,Ca)F.

8. The electronic device according to claim 1, wherein the well layers each consists of a material selected from the group consisting of $(Ba,Sr,Ca)TiO_3$, $(Ba,Sr,Ca)(Ti,Zr)O_3$, $Pb(Zr,Ti)O_3$, $Ta_2O_5$, $CeO_2$, $HfO_2$, HfON, $ZrO_2$, ZrON, $TiO_2$, Hf-silicate, HfSiON, Zr-silicate, ZrSiON, Ti-silicate, $Y_2O_3$, $LaAlO_3$, $Ga_2O_3$, $La_2O_3$ and $Al_2O_3$.

9. The electronic device according to claim 1, wherein the barrier layers each consists of a material selected from the group consisting of $(Ba,Sr,Ca)O$, $SiO_2$, $Si_3N_4$, SiON, $Al_2O_3$, Hf-silicate, nitride of Hf-silicate, Zr-silicate, nitride of Zr-silicate, Ti-silicate, nitride of Ti-silicate and $MgAl_2O_4$, $(Ba,Sr,Ca)F$, and the well layers each consists of a material selected from the group consisting of $(Ba,Sr,Ca)TiO_3$, $(Ba,Sr,Ca)(Ti,Zr)O_3$, $Pb(Zr,Ti)O_3$, $Ta_2O_5$, $CeO_2$, $HfO_2$, HfON, $ZrO_2$, ZrON, $TiO_2$, Hf-silicate, HfSiON, Zr-silicate, ZrSiON, Ti-silicate, $Y_2O_3$, $LaAlO_3$, $Ga_2O_3$, $La_2O_3$ and $Al_2O_3$.

10. The electronic device according to claim 1, wherein n=2.

* * * * *